United States Patent
Kawashima et al.

(10) Patent No.: US 12,387,805 B2
(45) Date of Patent: Aug. 12, 2025

(54) SEMICONDUCTOR DEVICE, DISPLAY DEVICE, AND ELECTRONIC DEVICE

(71) Applicant: Semiconductor Energy Laboratory Co., Ltd., Atsugi (JP)

(72) Inventors: Susumu Kawashima, Atsugi (JP); Manabu Sato, Oyama (JP); Koji Kusunoki, Isehara (JP); Hidenori Mori, Kawachi (JP); Hironori Matsumoto, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 579 days.

(21) Appl. No.: 17/779,219

(22) PCT Filed: Dec. 2, 2020

(86) PCT No.: PCT/IB2020/061348
§ 371 (c)(1),
(2) Date: May 24, 2022

(87) PCT Pub. No.: WO2021/116828
PCT Pub. Date: Jun. 17, 2021

(65) Prior Publication Data
US 2022/0406818 A1    Dec. 22, 2022

(30) Foreign Application Priority Data
Dec. 13, 2019   (JP) .................................. 2019-225218

(51) Int. Cl.
*G11C 19/28*    (2006.01)
*G09G 3/3266*   (2016.01)
*G09G 3/36*     (2006.01)

(52) U.S. Cl.
CPC ........... *G11C 19/28* (2013.01); *G09G 3/3266* (2013.01); *G09G 3/3677* (2013.01); *G09G 2310/0286* (2013.01)

(58) Field of Classification Search
CPC .... G11C 19/184; G11C 19/28; G09G 3/3266; G09G 3/3677; G09G 2310/0286
See application file for complete search history.

(56) References Cited

U.S. PATENT DOCUMENTS 7,932,888 B2   4/2011   Miyake
8,508,459 B2   8/2013   Miyake
(Continued)

FOREIGN PATENT DOCUMENTS

CN    103474038 A    12/2013
CN    104966506 A    10/2015
(Continued)

OTHER PUBLICATIONS

International Search Report (Application No. PCT/IB2020/061348) Dated Jan. 26, 2021.
(Continued)

*Primary Examiner* — Patrick O Neill
(74) *Attorney, Agent, or Firm* — Eric J. Robinson; Robinson Intellectual Property Law Office, P.C.

(57) ABSTRACT

A highly reliable semiconductor device is provided. The semiconductor device includes first to third transistors and a capacitor. In the first transistor, one of a source and a drain is supplied with a first signal, the other of the source and the drain is connected to a gate of the second transistor and one electrode of the capacitor, and a gate is supplied with a second pulse signal. In the second transistor, one of a source and a drain is supplied with a first pulse signal, and the other of the source and the drain is connected to the other electrode of the capacitor and one of a source and a drain of
(Continued)

the third transistor. In the third transistor, the other of the source and the drain is supplied with the first potential, and a gate is supplied with a second signal that is an inverted signal of the first signal. The first pulse signal is a clock signal, and the second pulse signal has a duty ratio of 55% or lower.

16 Claims, 26 Drawing Sheets

(56) References Cited

U.S. PATENT DOCUMENTS

| | | | |
|---|---|---|---|
| 8,766,901 | B2 | 7/2014 | Miyake |
| 9,058,889 | B2 | 6/2015 | Miyake |
| 9,064,753 | B2 | 6/2015 | Miyake |
| 9,218,081 | B2 | 12/2015 | Yamazaki et al. |
| 10,013,087 | B2 | 7/2018 | Yamazaki et al. |
| 10,032,921 | B2 | 7/2018 | Takahashi et al. |
| 10,483,293 | B2 | 11/2019 | Miyake |
| 10,871,841 | B2 | 12/2020 | Yamazaki et al. |
| 11,392,232 | B2 | 7/2022 | Yamazaki et al. |
| 11,983,342 | B2 | 5/2024 | Yamazaki et al. |
| 2004/0253781 | A1 | 12/2004 | Kimura et al. |
| 2011/0286256 | A1 | 11/2011 | Kamata |
| 2012/0051118 | A1 | 3/2012 | Yamazaki et al. |
| 2012/0061662 | A1 | 3/2012 | Yamazaki et al. |
| 2012/0161139 | A1 | 6/2012 | Endo et al. |
| 2012/0236634 | A1 | 9/2012 | Matsubayashi |
| 2013/0049806 | A1 | 2/2013 | Koyama |
| 2013/0069068 | A1 | 3/2013 | Miyake |
| 2014/0023173 | A1 | 1/2014 | Miyake |
| 2014/0068301 | A1 | 3/2014 | Watanabe |
| 2014/0362324 | A1 | 12/2014 | Yamazaki et al. |
| 2015/0043703 | A1 | 2/2015 | Tan et al. |
| 2015/0054571 | A1 | 2/2015 | Watanabe et al. |
| 2015/0349000 | A1 | 12/2015 | Kim et al. |
| 2016/0027809 | A1 | 1/2016 | Kobayashi |
| 2016/0099258 | A1 | 4/2016 | Yoneda |
| 2017/0033792 | A1 | 2/2017 | Takahashi et al. |
| 2017/0084754 | A1 | 3/2017 | Shionoiri et al. |
| 2017/0110453 | A1 | 4/2017 | Ikeda |
| 2017/0125122 | A1* | 5/2017 | Miyake ............... H10D 86/441 |
| 2017/0133064 | A1 | 5/2017 | Nagatsuka et al. |
| 2017/0178581 | A1 | 6/2017 | Li et al. |
| 2017/0179294 | A1 | 6/2017 | Kato et al. |
| 2017/0186355 | A1 | 6/2017 | Takahashi et al. |
| 2017/0186473 | A1 | 6/2017 | Ikeda et al. |
| 2017/0186749 | A1 | 6/2017 | Ohshima et al. |
| 2017/0229486 | A1 | 8/2017 | Matsuda et al. |
| 2017/0230041 | A1 | 8/2017 | Kato et al. |
| 2020/0265887 | A1 | 8/2020 | Atsumi et al. |
| 2024/0370111 | A1 | 11/2024 | Yamazaki et al. |

FOREIGN PATENT DOCUMENTS

| | | |
|---|---|---|
| JP | 2001-325798 A | 11/2001 |
| JP | 2008-122939 A | 5/2008 |
| JP | 2010-277652 A | 12/2010 |
| JP | 2011-248356 A | 12/2011 |
| JP | 2014-038319 A | 2/2014 |
| JP | 2014-039247 A | 2/2014 |
| JP | 2017-225100 A | 12/2017 |
| KR | 2014-0011950 A | 1/2014 |
| KR | 2017-0015192 A | 2/2017 |
| WO | WO-2011/135988 | 11/2011 |
| WO | WO-2015/018141 | 2/2015 |
| WO | WO-2017/020549 | 2/2017 |

OTHER PUBLICATIONS

Written Opinion (Application No. PCT/IB2020/061348) Dated Jan. 26, 2021.

* cited by examiner

SEMICONDUCTOR DEVICE, DISPLAY DEVICE, AND ELECTRONIC DEVICE

TECHNICAL FIELD

One embodiment of the present invention relates to a semiconductor device. One embodiment of the present invention relates to a display device. One embodiment of the present invention relates to a driver circuit of a display device. One embodiment of the present invention relates to an electronic device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

Display devices are used in various devices such as portable information terminals, including smartphones, and television devices. In recent years, an increase in the screen occupancy rate of the devices that include display devices has been demanded, and in turn, regions other than the display portion in the display devices have been desired to be narrowed (narrowed bezels have been desired). A system-on-panel obtained by forming some of or all driver circuits over the same substrate as a pixel portion is effective in meeting the above need. Transistors provided in the driver circuit and transistors provided in the pixel portion in a system-on-panel are preferably fabricated in the same steps, in which case the costs for fabrication of the panel can be reduced. By the techniques disclosed in Patent Document 1 and Patent Document 2, a variety of circuits such as inverters and shift registers that are used in driver circuits of display devices are constituted of transistors having a single polarity.

REFERENCES

Patent Documents

[Patent Document 1] Japanese Published Patent Application No. 2001-325798
[Patent Document 2] Japanese Published Patent Application No. 2010-277652

SUMMARY OF THE INVENTION

Problems to be Solved by the Invention

In a sequential circuit that is used in a driver circuit of a display device and outputs a pulse signal, a variation in the electrical characteristics of the transistors constituting the sequential circuit, particularly a variation in the threshold voltage, leads to a problem such as a failure to output a desired signal. This might prevent display of images.

An object of one embodiment of the present invention is to provide a highly reliable semiconductor device, a highly reliable display device, or a highly reliable electronic device. An object of one embodiment of the present invention is to provide a semiconductor device, a display device, or an electronic device in which a display device can have a narrowed bezel. An object of one embodiment of the present invention is to provide a semiconductor device, a display device, or an electronic device that has high reliability and can be manufactured at low cost. An object of one embodiment of the present invention is to provide a semiconductor device, a display device, or an electronic device that has a novel structure. An object of one embodiment of the present invention is to reduce at least one of problems of the conventional technique.

Note that the description of these objects does not preclude the existence of other objects. Note that one embodiment of the present invention does not have to achieve all the objects. Note that objects other than these can be derived from the description of the specification, the drawings, the claims, and the like.

Means for Solving the Problems

One embodiment of the present invention is a semiconductor device including first to third transistors, a first capacitor, and first to fifth wirings. One of a source and a drain of the first transistor is electrically connected to the first wiring, the other of the source and the drain of the first transistor is electrically connected to a gate of the second transistor and one electrode of the first capacitor, and a gate of the first transistor is electrically connected to the third wiring. One of a source and a drain of the second transistor is electrically connected to the fourth wiring, and the other of the source and the drain of the second transistor is electrically connected to the other electrode of the first capacitor and one of a source and a drain of the third transistor. The other of the source and the drain of the third transistor is electrically connected to the fifth wiring, and a gate of the third transistor is electrically connected to the second wiring. A first signal is supplied to the first wiring, and a second signal that is an inverted signal of the first signal is supplied to the second wiring. A first pulse signal is supplied to the fourth wiring. A first potential is supplied to the fifth wiring. A second pulse signal is supplied to the third wiring. The first pulse signal is a clock signal, and the second pulse signal has a duty ratio of 55% or lower.

Another embodiment of the present invention is a semiconductor device including a control circuit, first to third transistors, a first capacitor, and first to fifth wirings. One of a source and a drain of the first transistor is electrically connected to the first wiring, the other of the source and the drain of the first transistor is electrically connected to a gate of the second transistor and one electrode of the first capacitor, and a gate of the first transistor is electrically connected to the third wiring. One of a source and a drain of the second transistor is electrically connected to the fourth wiring, and the other of the source and the drain of the second transistor is electrically connected to the other electrode of the first capacitor and one of a source and a drain of the third transistor. The other of the source and the drain of the third transistor is electrically connected to the fifth wiring, and a gate of the third transistor is electrically connected to the second wiring. The control circuit outputs a first signal to the first wiring and outputs a second signal that is an inverted signal of the first signal to the second wiring. A first pulse signal is supplied to the fourth wiring. A first potential is supplied to the fifth wiring. A second pulse signal is supplied to the third wiring. The first pulse signal is a clock signal, and the second pulse signal has a duty ratio of 55% or lower.

In the above, a signal generation circuit outputting the second pulse signal is preferably included. In that case, a third pulse signal is preferably supplied to the signal generation circuit and the control circuit. The third pulse signal preferably has a duty ratio of 1% or lower.

In the above, the second pulse signal preferably has a duty ratio of 1% or lower.

In the above, the signal generation circuit preferably includes a fourth transistor, a fifth transistor, and a second capacitor. In that case, one of a source and a drain of the fourth transistor is supplied with a second potential higher than the first potential, and the other of the source and the drain of the fourth transistor is electrically connected to the third wiring, one of a source and a drain of the fifth transistor, and one electrode of the second capacitor. The first potential is supplied to the other of the source and the drain of the fifth transistor. The first potential is supplied to the other electrode of the second capacitor. The third pulse signal is supplied to a gate of the fourth transistor, and a fourth pulse signal is supplied to a gate of the fifth transistor. In that case, the fourth pulse signal preferably has a duty ratio of 1% or lower.

In the above, the second pulse signal is preferably supplied to the third wiring and the control circuit.

In the above, the first transistor preferably includes a first semiconductor layer, and a first gate and a second gate overlapping with each other with the first semiconductor layer therebetween. In that case, it is preferable that the first gate be electrically connected to the second gate.

In the above, the third transistor preferably includes a second semiconductor layer, and a third gate and a fourth gate overlapping with each other with the second semiconductor layer therebetween. In that case, it is preferable that one of the third gate and the fourth gate be electrically connected to the second wiring and the other of the third gate and the fourth gate be electrically connected to the fifth wiring.

In the above, the fourth gate is preferably positioned below the second semiconductor layer. In that case, it is preferable that the third gate be electrically connected to the second wiring and the fourth gate be electrically connected to the fifth wiring.

Another embodiment of the present invention is a display device including a pixel and any of the above semiconductor devices. The pixel includes a display element and a sixth transistor. The sixth transistor, the first transistor, the second transistor, and the third transistor are preferably provided over one plane.

In the above, the display element is preferably a liquid crystal element or a light-emitting element.

Another embodiment of the present invention is an electronic device including any of the above display devices and at least one of an antenna, a battery, a housing, a camera, a speaker, a microphone, a touch sensor, and an operation button.

Effect of the Invention

According to one embodiment of the present invention, a highly reliable semiconductor device, a highly reliable display device, or a highly reliable electronic device can be provided. Alternatively, a semiconductor device, a display device, or an electronic device in which a display device can have a narrowed bezel can be provided. Alternatively, a semiconductor device, a display device, or an electronic device that has high reliability and can be manufactured at low cost can be provided. Alternatively, a semiconductor device, a display device, or an electronic device that has a novel structure can be provided. Alternatively, at least one of problems of the conventional technique can be reduced.

Note that the description of the effects does not preclude the existence of other effects. Note that one embodiment of the present invention does not need to have all the effects. Note that effects other than these can be derived from the description of the specification, the drawings, the claims, and the like.

MODE FOR CARRYING OUT THE INVENTION

Figure 1:
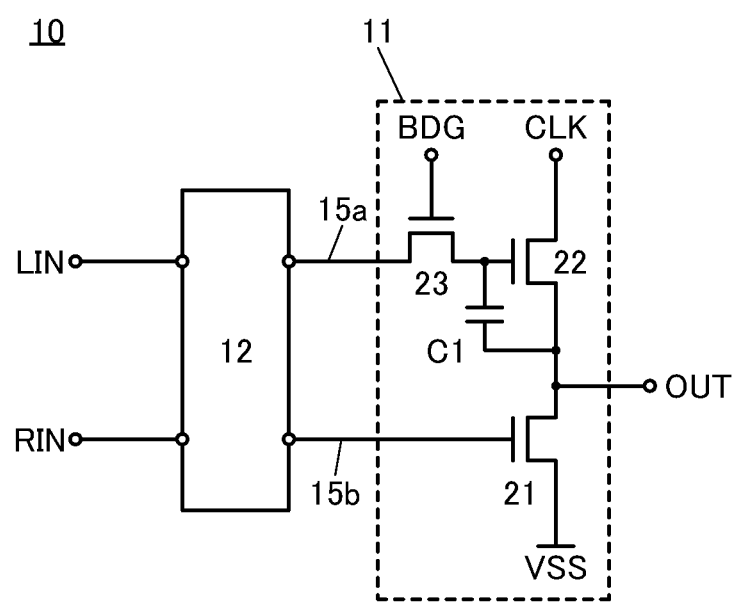
FIG. 1 is a diagram illustrating a structure example of a sequential circuit.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not necessarily limited to the illustrated scale.

Note that in this specification and the like, the ordinal numbers such as "first" and "second" are used in order to avoid confusion among components and do not limit the number.

A transistor is a kind of semiconductor element and can carry out a function of amplifying current or voltage, switching operation for controlling conduction or non-conduction, and the like. An IGFET (Insulated Gate Field Effect Transistor) and a thin film transistor (TFT) are in the category of a transistor in this specification.

Functions of a "source" and a "drain" are sometimes replaced with each other when a transistor of opposite polarity is used or when the direction of current is changed in circuit operation, for example. Therefore, the terms "source" and "drain" can be switched in this specification.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric function" include a switching element such as a transistor, a resistor, a coil, a capacitor, and other elements with a variety of functions as well as an electrode and a wiring.

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, structure examples of a semiconductor device of one embodiment of the present invention are described.

Structure Example 1

Structure Example 1-1

FIG. 1 illustrates a structure example of a sequential circuit 10 of one embodiment of the present invention. The sequential circuit 10 includes a circuit 11 and a circuit 12. The circuit 11 and the circuit 12 are electrically connected to each other through a wiring 15a and a wiring 15b. The circuit 12 can also be called a control circuit.

Note that unless otherwise specified, among signals and potentials supplied to the sequential circuit 10, a high potential is referred to as a potential VDD and a low potential is referred to as a potential VSS in some cases in the following description.

The circuit 12 has a function of outputting a first signal to the wiring 15a and outputting a second signal to the wiring 15b in accordance with the potential of a signal LIN and the potential of a signal RIN. Here, the second signal is a signal obtained by inverting the first signal. That is, in the case where the first signal and the second signal are each a signal having two kinds of potentials, a high potential and a low potential, the circuit 12 outputs a low potential to the wiring 15b when outputting a high potential to the wiring 15a, and the circuit 12 outputs a high potential to the wiring 15b when outputting a low potential to the wiring 15a.

The circuit 11 includes a transistor 21, a transistor 22, a transistor 23, and a capacitor C1. The transistor 21, the transistor 22, and the transistor 23 are each an n-channel transistor. As a semiconductor where a channel is formed in each of the transistor 21, the transistor 22, and the transistor 23, a metal oxide exhibiting semiconductor characteristics (hereinafter, also referred to as an oxide semiconductor) can be suitably used. The semiconductor is not limited to the oxide semiconductor, and a semiconductor such as silicon (single crystal silicon, polycrystalline silicon, or amorphous silicon) or germanium may be used, or a compound semiconductor may be used.

In the transistor 23, a gate is electrically connected to a wiring to which a signal BDG is supplied, one of a source and a drain is electrically connected to the wiring 15a, and the other of the source and the drain is electrically connected to a gate of the transistor 22 and one electrode of the capacitor C1. In the transistor 22, one of a source and a drain is electrically connected to a wiring to which a signal CLK is supplied, and the other of the source and the drain is electrically connected to the other electrode of the capacitor C1 and one of a source and a drain of the transistor 21. In the transistor 21, a gate is electrically connected to the wiring 15b, and the other of the source and the drain is electrically connected to a wiring to which the potential VSS (also referred to as a first potential) is supplied. The one of the source and the drain of the transistor 21, the other of the source and the drain of the transistor 22, and the other electrode of the capacitor C1 are electrically connected to an output terminal OUT. Note that the output terminal OUT is a portion to which an output potential from the circuit 11 is supplied and may be part of a wiring or part of an electrode.

A clock signal is input as the signal CLK to the one of the source and the drain of the transistor 22. As the clock signal, a signal with a duty ratio (a percentage of a period of a high-level potential (high potential) to one cycle of a signal) higher than or equal to 45% and lower than or equal to 55% can be suitably used. As the clock signal, a signal with a duty ratio of 50% is further preferably used. Note that the duty ratio of the clock signal is not limited to the above and can be changed as appropriate in accordance with a driving method.

Note that in this specification and the like, a clock signal refers to a signal in which a high potential and a low potential are alternated and an interval between a potential rise and a next potential rise or an interval between a potential fall and a next potential fall is constant. In this specification and the like, a pulse signal refers to a signal whose potential changes over time. A pulse signal includes a signal whose potential changes periodically. For example, a pulse signal includes signals whose potentials change periodically, such as a rectangular wave, a triangular wave, a sawtooth wave, and a sine wave. Thus, a clock signal can be regarded as one embodiment of a pulse signal.

The signal CLK is a signal in which a high potential and a low potential are alternated. At this time, the low potential of the signal CLK is preferably the same potential as the potential VSS. Instead of the signal CLK, a high potential (e.g., the potential VDD) may be supplied to the one of the source and the drain of the transistor 22.

The signal BDG supplied to the gate of the transistor 23 is a periodic pulse signal. At this time, a duty ratio of the signal BDG is preferably as low as possible. For example, a pulse signal whose duty ratio is lower than or equal to 60%, preferably lower than or equal to 55%, further preferably lower than or equal to 50%, still further preferably lower than or equal to 10%, yet further preferably lower than or equal to 5%, yet still further preferably lower than or equal to 1% can be used as the signal BDG. The lower limit of the duty ratio of the signal BDG is preferably as low as possible when being higher than 0%.

A pulse signal with a low duty ratio is supplied to the gate of the transistor 23, whereby a change in the threshold voltage of the transistor 23 can be inhibited. Here, when a constant potential that is always a high potential (i.e., a signal with a duty ratio of 100%) is supplied to the gate of the transistor 23, for example, the threshold voltage of the transistor 23 is likely to shift in the positive direction; thus, a desired signal cannot be output from the sequential circuit 10 in some cases. By contrast, since the signal BDG with a low duty ratio is supplied to the gate of the transistor 23 in one embodiment of the present invention, a change in the electrical characteristics of the transistor 23 can be inhibited; as a result, the sequential circuit 10 with high reliability can be obtained.

Note that the signal BDG is preferably a signal generated using a signal for driving the circuit 12. Alternatively, the signal BDG preferably doubles as the signal for driving the circuit 12. This eliminates the need for additionally providing a circuit that generates the signal BDG outside the sequential circuit 10, simplifying the structure of a device including the sequential circuit 10.

The operation of the sequential circuit 10 is described. When a high potential is supplied to the wiring 15a, a low potential is supplied to the wiring 15b, and the signal BDG becomes a high potential, the transistor 23 and the transistor 22 are brought into a conduction state (an on state) and the transistor 21 is brought into a non-conduction state (an off state). At this time, electrical continuity is established between the output terminal OUT and the wiring to which the signal CLK is supplied.

In the circuit 11, the output terminal OUT and the gate of the transistor 22 are electrically connected to each other through the capacitor C1; thus, the potential of the gate of the transistor 22 increases with increasing potential of the output terminal OUT owing to a bootstrap effect. Here, in the case where the capacitor C1 is not included, a potential that is lower than the high potential of the signal CLK by the threshold voltage of the transistor 22 is output to the output terminal OUT. However, with the capacitor C1, the potential of the gate of the transistor 22 increases to a potential close to twice as high as the potential VDD (e.g., a potential close to twice as high as a difference between the potential VDD and the potential VSS); thus, the high potential of the signal CLK (e.g., the potential VDD) can be output to the output terminal OUT without being affected by the threshold voltage of the transistor 22. Accordingly, the sequential circuit 10 with high output performance can be obtained without an increase in the kinds of power supply potentials.

Since a high potential is supplied as the signal BDG and the transistor 23 is in an on state, supplying a high potential to the wiring 15a results in supply of the high potential to the gate of the transistor 22 through the transistor 23. At this time, in the case where the high potential supplied to the wiring 15a is equal to the high potential of the signal BDG (e.g., both of them are the potential VDD), a potential that is lower than the potential VDD by the threshold voltage of the transistor 23 is supplied to the gate of the transistor 22. After that, the signal CLK becomes a high potential from a low potential, and the potential of the gate of the transistor 22 (the potential of the other of the source and the drain of the transistor 23) increases owing to a bootstrap effect. Here, the transistor 23 is brought into an off state when the potential of the other of the source and the drain of the transistor 23 exceeds the potential VDD; thus, the gate of the transistor 22 and the wiring 15a are electrically separated from each other and the gate of the transistor 22 is brought into a floating state. The potential of the wiring 15a does not increase from the output potential (VDD) of the circuit 12; thus, application of a potential higher than the output potential to a transistor or the like in the circuit 12 through the wiring 15a can be prevented. As a result, the reliability of the sequential circuit 10 can be increased.

Meanwhile, when a low potential is supplied to the wiring 15a and a high potential is supplied to the wiring 15b, the low potential is supplied to the gate of the transistor 22 through the transistor 23 and thus the transistor 22 is brought into an off state. In addition, the transistor 21 is brought into an on state. At this time, electrical continuity is established between the output terminal OUT and the wiring to which the potential VSS is supplied, and the potential VSS is output to the output terminal OUT. After that, the signal BDG is preferably changed from a high potential to a low potential to bring the transistor 23 into an off state.

Figure 2A:
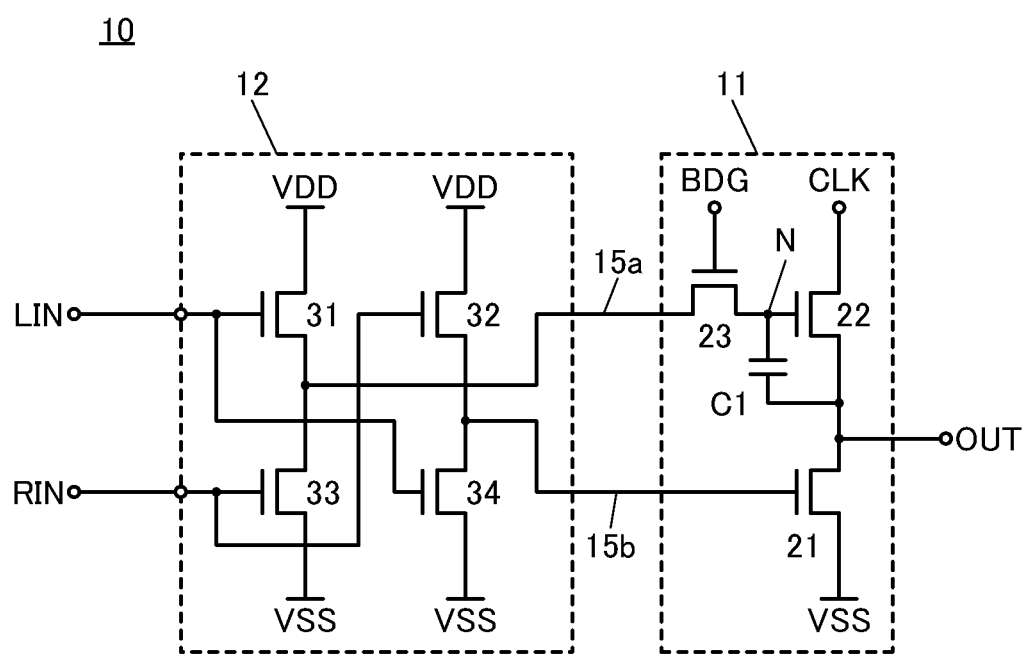
FIG. 2A is a diagram illustrating a structure example of a sequential circuit.

FIG. 2A illustrates a detailed structure example of the sequential circuit 10 exemplified in FIG. 1. The circuit 12 included in the sequential circuit 10 includes a transistor 31, a transistor 32, a transistor 33, and a transistor 34. The above-described n-channel transistor is preferably used as the transistor 31 to the transistor 34. In particular, a transistor using an oxide semiconductor as a semiconductor where a channel is formed is preferably used.

The conduction or the non-conduction of each of the transistor 31 and the transistor 34 is determined in accordance with the potential of the signal LIN. The conduction or the non-conduction of each of the transistor 33 and the transistor 32 is determined in accordance with the potential of the signal RIN.

When the signal LIN is a high potential and the signal RIN is a low potential, the transistor 31 is brought into an on state and the transistor 33 is brought into an off state; thus, the wiring to which the potential VDD is supplied is electrically connected to the wiring 15a. In addition, the transistor 34 is brought into an on state and the transistor 32 is brought into an off state; thus, the wiring to which the potential VSS is supplied is electrically connected to the wiring 15b. On the other hand, when the signal LIN is a low potential and the signal RIN is a high potential, the transistor 31 is brought into an off state and the transistor 33 is brought into an on state; thus, the wiring to which the potential VSS is supplied is electrically connected to the wiring 15a. In addition, the transistor 34 is brought into an off state and the transistor 32 is brought into an on state; thus, the wiring to which the potential VDD is supplied is electrically connected to the wiring 15b.

In the sequential circuit 10, when the signal LIN is a high potential and the signal RIN is a low potential, the wiring 15a has a high potential and the wiring 15b has a low potential, so that the potential of the signal CLK is output to the output terminal OUT. By contrast, when the signal LIN is a low potential and the signal RIN is a high potential, the wiring 15a has a low potential and the wiring 15b has a high potential, so that the output terminal OUT and the wiring to which the potential VSS is supplied are electrically connected to each other.

By changing the potentials of the signal LIN and the signal RIN input to the sequential circuit 10 alternately between a high potential and a low potential and synchronizing the signal CLK and the signal LIN, pulsed output signals are output to the output terminal OUT of the sequential circuit 10. When the output signals output to the output terminal OUT of the sequential circuit 10 are supplied to a wiring (e.g., a scan line) connected to a plurality of pixels, for example, the sequential circuit 10 can be used as part of a gate driver circuit.

Figure 2B:
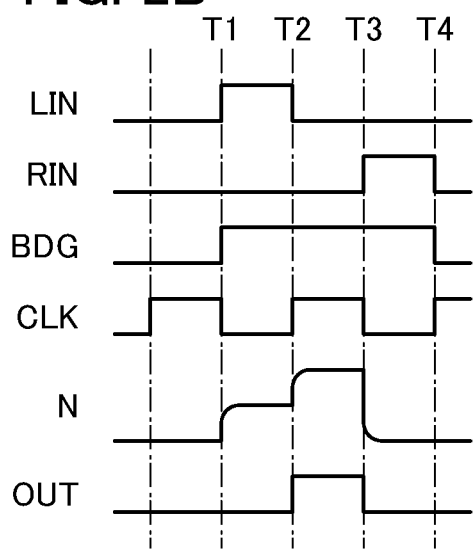
FIG. 2B is a timing chart.

FIG. 2B is a timing chart showing an example of a driving method for the sequential circuit 10 illustrated in FIG. 2A. FIG. 2B schematically shows potential changes over time in the signal LIN, the signal RIN, the signal BDG, the signal CLK, a node N, and the output terminal OUT. Note that the node N corresponds to a node to which the gate of the transistor 22 is connected (see FIG. 2A).

At Time T1, the signal LIN and the signal BDG become a high potential, and the signal RIN and the signal CLK become a low potential. In Period T1-T2, the circuit 12 outputs a high potential to the wiring 15a and the transistor 23 is in an on state, so that the potential of the node N increases to a potential that is lower than the potential of the wiring 15a by the threshold voltage of the transistor 23.

Then, at Time T2, the signal LIN becomes a low potential and the signal CLK becomes a high potential. At this time, all the transistors 31 to 34 in the circuit 12 are in an off state; thus, the wiring 15a is brought into an electrically floating state. Hence, in Period T2-T3, the potential of the node N increases when the signal CLK becomes a high-level potential. When a difference between the gate potential of the transistor 23 and the potential of the node N reaches the threshold voltage of the transistor 23, the transistor 23 is brought into an off state and the node N is brought into a floating state. Furthermore, an increase in the potential of the gate of the transistor 23 causes supply of the high potential of the signal CLK to the output terminal OUT.

Subsequently, at Time T3, the signal RIN becomes a high potential and the signal CLK becomes a low potential. In Period T3-T4, the circuit 12 outputs a high potential to the wiring 15b to bring the transistor 21 into an on state. Meanwhile, a low potential is output to the wiring 15a and the transistor 23 is in an on state; thus, the transistor 22 is brought into an off state. Accordingly, the potential VSS is supplied to the output terminal OUT.

Then, at Time T4, the signal BDG becomes a low potential to bring the transistor 23 into an off state.

The above is the description of the operation method example of the sequential circuit 10.

Here, voltage stress applied to the transistor 23 is described. For simplicity, a high potential is referred to as the potential VDD and a low potential is referred to as the potential VSS in this description.

At Time T1, when the potential VDD is supplied to the gate of the transistor 23 and the potential VDD is supplied to the electrode on the wiring 15a side, the electrode of the transistor 23 on the node N side serves as the source. Then, at Time T2, it is assumed that the signal CLK changes from the potential VSS to the potential VDD and the potential of the node N increases to a potential twice as high as the potential VDD—the potential VSS. At this time, the wiring 15a is in a floating state and the potential VDD remains; thus, the source and the drain of the transistor 23 are interchanged with each other and the electrode connected to the wiring 15a serves as the source. At Time T3, when the potential VSS is supplied to the wiring 15a to decrease the potential of the node N, the electrode of the transistor 23 on the wiring 15a side serves as the source. A transistor in which the functions of a source and a drain are interchanged with each other in the circuit operation as described above can be called a bi-direction transistor.

In Period T1-T2, the maximum gate-source voltage (potential difference) of the transistor 23 is VDD-VSS. However, the source-drain voltage of the transistor 23 rapidly decreases with increasing potential of the node N; thus, voltage stress is immediately relieved. In Period T2-T3, a potential difference is hardly generated between the gate and the source of the transistor 23. In Period T3-T4, the gate-source voltage of the transistor 23 becomes VDD-VSS. After Time T4, voltage stress is not caused in the transistor 23. This indicates that stress is applied between the gate and the source of the transistor 23 when a low potential is supplied to the wiring 15a and the signal BDG is a high potential. Thus, a period during which the signal BDG is a high potential is shortened as much as possible in a period during which a low potential is supplied to the wiring 15a, so that voltage stress to the transistor 23 can be reduced and a change in the threshold voltage can be inhibited.

Note that the sequential circuit 10 can be used as a driver circuit of a display device. In particular, the sequential circuit 10 can be suitably used as a scan line driver circuit. At this time, in the case where a scan line connected to a plurality of pixels in a display device is connected to the output terminal OUT, a duty ratio of an output signal output from the sequential circuit 10 to the output terminal OUT is significantly lower than that of the signal CLK or the like. A period during which the potential input to the wiring 15a is a low potential is significantly longer than a period during which it is a high potential. Thus, when a constant high potential is supplied to the gate of the transistor 23, a period during which voltage stress is applied between the gate and the source of the transistor 23 is significantly long, which easily causes a change in the threshold voltage of the transistor 23. However, in one embodiment of the present invention, the signal BDG, which is a pulse signal with a low duty ratio, is supplied instead of the constant potential to the gate of the transistor 23; thus, a change in the threshold voltage of the transistor 23 can be suitably inhibited. It is particularly preferable to use, as the signal BDG, a pulse signal that becomes a high potential only in an operation period for outputting a signal to the output terminal OUT from the sequential circuit 10 (e.g., Period T1-T4 in FIG. 2B), and always becomes a low potential in the other periods. Accordingly, the duty ratio of the signal BDG can be reduced to 1% or lower, preferably 0.5% or lower, further preferably 0.1% or lower, and the sequential circuit 10 and a semiconductor device, a display device, and an electronic device each including the sequential circuit 10 can have extremely high reliability.

In the case where the sequential circuit 10 is used as a driver circuit of a display device, transistors included in pixels of the display device and the transistors (the transistor 21, the transistor 22, the transistor 23, and the like) included in the sequential circuit 10 are preferably provided over the same substrate. In particular, the transistors provided in the pixels and the transistors included in the sequential circuit 10 are preferably fabricated through the same process.

Structure Example 1-2

Figure 3A:
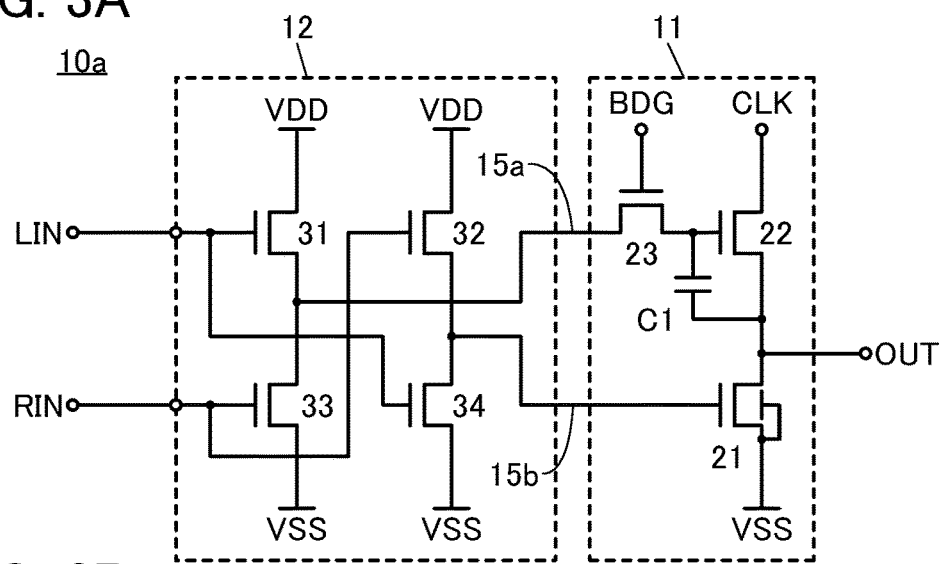
FIG. 3A to FIG. 3C are diagrams illustrating structure examples of sequential circuits.

FIG. 3A illustrates a structure example of a sequential circuit 10a including the circuit 11 whose structure is partly different from that in FIG. 2A.

The transistor 21 included in the circuit 11 includes a pair of gates (hereinafter, referred to as a first gate and a second gate). In the transistor 21, the first gate is electrically connected to the wiring 15b, the second gate is electrically connected to the other of the source and the drain of the transistor 21 and the wiring to which the potential VSS is supplied, and the one of the source and the drain is electrically connected to the other of the source and the drain of the transistor 22 and the other electrode of the capacitor C1.

Here, in the case where the sequential circuit 10a is used as a driver circuit of a display device, a duty ratio of an output signal output from the sequential circuit 10a to the output terminal OUT is significantly lower than that of the signal CLK or the like as described above. At this time, a period during which the transistor 21 is in an on state is significantly longer than a period during which it is in an off state. That is, a period during which a high potential is supplied to the first gate of the transistor 21 is significantly longer than a period during which a low potential is supplied to it. Thus, the threshold voltage of the transistor 21 is more likely to change than that of the transistor 22. Specifically, the threshold voltage of the transistor 21 is more likely to shift in the positive direction than that of the transistor 22.

In view of this, in one embodiment of the present invention, the transistor 21 includes the pair of gates overlapping with each other with a semiconductor layer provided therebetween. In addition, one of the gates is electrically connected to a wiring to which a low potential is supplied (the wiring to which the potential VSS is supplied). In other words, the source and the one of the gates are electrically connected to each other in the transistor 21. Such a structure can suitably inhibit the shift of the threshold voltage of the transistor 21 in the positive direction. Thus, the reliability of the sequential circuit 10a can be increased, leading to an increase in the reliability of a semiconductor device, a display device, an electronic device, and the like each including the sequential circuit 10a.

The structure in which the one of the gates is electrically connected to the source can also suitably prevent the transistor 21 from having a negative threshold voltage value. That is, the transistor 21 can easily have normally-off characteristics. In the case of the transistor 21 having normally-on characteristics, leakage current occurs between the source and the drain when the voltage between the other gate of the transistor 21 and the source thereof is 0 V, preventing the potential of the output terminal OUT from being maintained. Therefore, to bring the transistor 21 into an off state, the other gate of the transistor 21 needs to be supplied with a potential lower than the potential VSS, which necessitates a plurality of power supplies. By contrast, the transistor 21 of one embodiment of the present invention can stably have normally-off characteristics; thus, the sequential circuit 10a with high output performance can be obtained without increasing the varieties of power supply potentials.

By having the structure in which the one of the gates and the source are electrically connected to each other, the transistor 21 also has an effect of increasing saturation. This facilitates designing of the circuit 11 and enables the circuit 11 to operate stably.

As described above, the sequential circuit 10a has a structure in which a transistor where one of gates is connected to a source is used as the transistor 21 with an extremely long period of voltage stress application and a pulse signal with a low duty ratio is supplied to the gate of the transistor 23 functioning as a bi-direction transistor. This can inhibit changes in the threshold voltages of all the three transistors included in the circuit 11. As a result, the sequential circuit 10a can have both high output performance and high reliability.

Structure Example 1-3

Figure 3B:
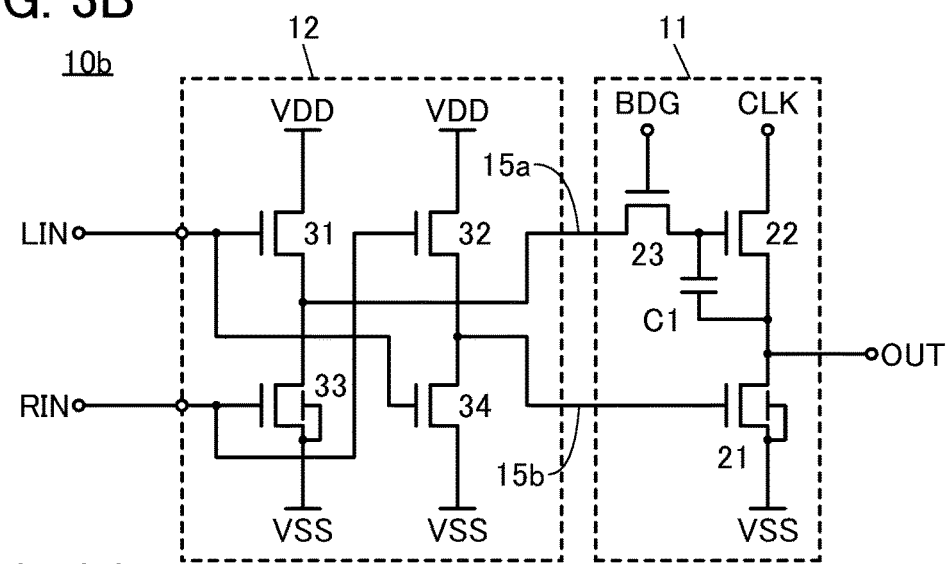

FIG. 3B illustrates a structure example of a sequential circuit 10b. In the sequential circuit 10b, a transistor including a pair of gates one of which is connected to a source is used as the transistor 33 included in the circuit 12.

Like the transistor 21 of the circuit 11, the transistor 33 is in an on state for an extremely long period during operation of the sequential circuit 10b. Thus, to suppress a variation in the threshold voltage, the transistor 33 employs a structure similar to that of the transistor 21, whereby the sequential circuit 10b can have increased reliability.

Structure Example 1-4

Figure 3C:
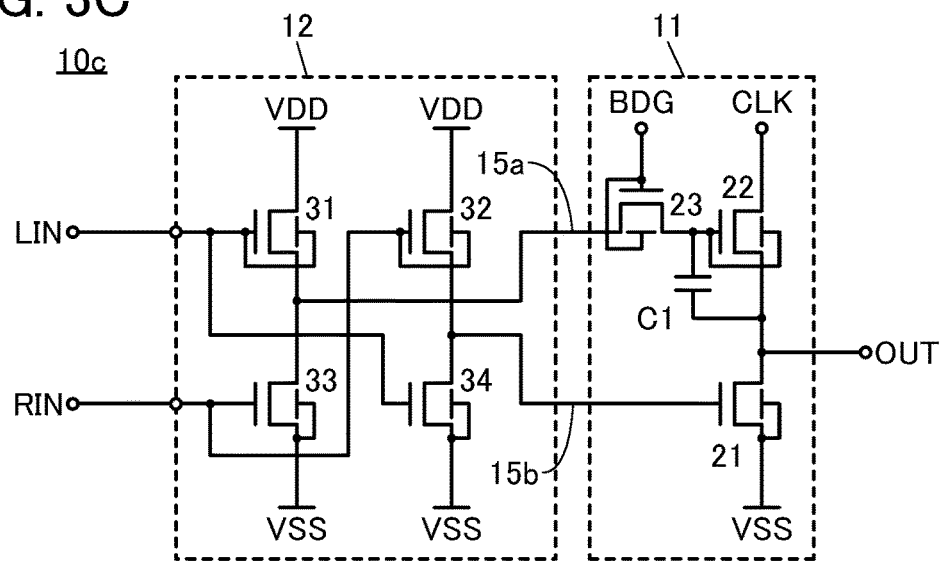

FIG. 3C illustrates a structure example of a sequential circuit 10c.

In the sequential circuit 10c, a transistor including a pair of gates one of which is connected to a source is used as the transistor 33 and the transistor 34 included in the circuit 12.

Compared to the transistor 33, the transistor 34 is in an on state for a short period during operation of the sequential circuit 10c; however, when the transistor 34 operates for a long time, the threshold voltage might vary. Thus, to suppress a variation in the threshold voltage, the transistor 34 employs a structure similar to that of the transistor 33, whereby the sequential circuit 10c can have increased reliability.

In the sequential circuit 10c, a transistor including a pair of gates is used as the transistor 31, the transistor 32, the transistor 22, and the transistor 23.

A transistor including a pair of gates which are positioned with a semiconductor layer therebetween and are electrically connected to each other can have a larger region where a channel is formed and a higher current flowing between a source and a drain (also referred to as on-state current) than a transistor including one gate or a transistor in which a constant potential is supplied to one of a pair of gates. Thus, a decrease in on-state current can be inhibited and the transistors can be reduced in size; hence, the areas of the sequential circuit 10c and a driver circuit using the sequential circuit 10c can be reduced. In particular, the transistor 22 and the transistor 23 are required to have higher current supply capability than the transistors provided in the circuit 12; thus, the use of such a transistor as the transistor 22 and the transistor 23 produces a significant effect of reducing the areas.

A transistor in which a pair of gates are electrically connected to each other has advantages over a transistor including one gate, such as ease of achieving normally-off electrical characteristics and increased saturation. This enables the sequential circuit 10c to have high reliability.

When a transistor with high current supply capability is used as each of the transistor 31, the transistor 32, the transistor 22, and the transistor 23, the sequential circuit 10c can have an increased operation frequency.

Although FIG. 3C illustrates an example in which a transistor including a pair of gates electrically connected to each other is used as all of the transistor 31, the transistor 32, the transistor 22, and the transistor 23, one embodiment of the present invention is not limited thereto as long as the above transistor is used as at least one of these transistors. It is particularly preferable to use a transistor including a pair of gates electrically connected to each other as the transistor 22 and the transistor 23 included in the circuit 11.

Structure Example 2

Sequential circuits having structures different from those in Structure example 1 above are described below.

Structure Example 2-1

Figure 4A:
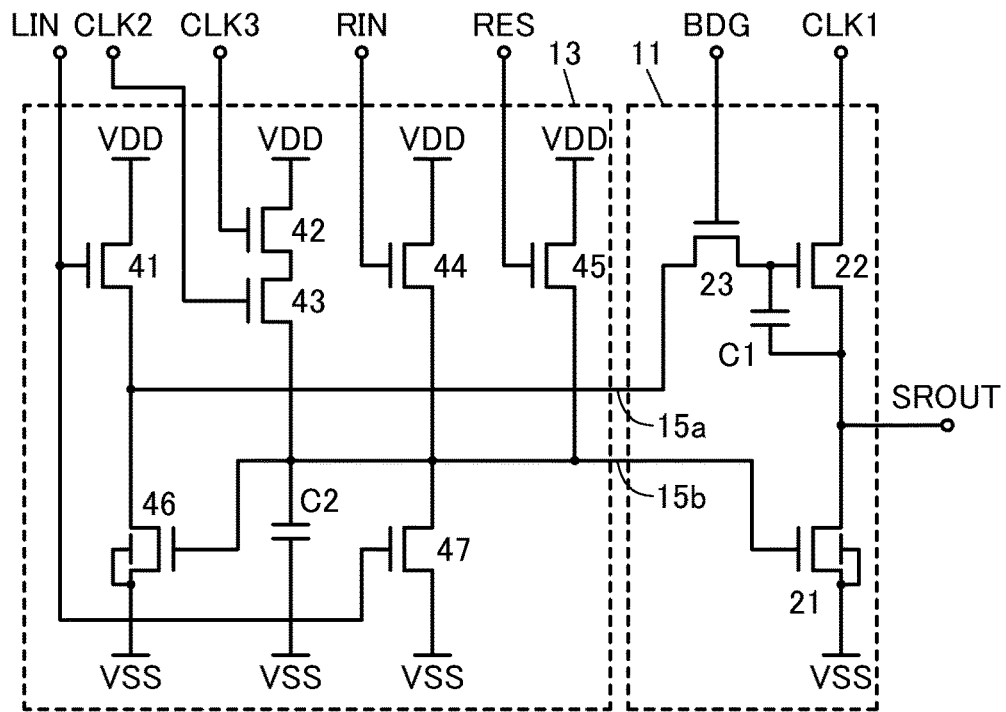
FIG. 4A and FIG. 4B are diagrams illustrating structure examples of a sequential circuit.

FIG. 4A illustrates a structure example of a sequential circuit 20. The sequential circuit 20 includes the circuit 11 and a circuit 13. The circuit 11 and the circuit 13 are electrically connected to each other through the wiring 15a and the wiring 15b. For the structure of the circuit 11, Structure example 1 can be referred to.

The signal BDG and a signal CLK1 are input to the circuit 11. An output terminal SROUT is connected. The signal BDG is input to the gate of the transistor 23. The signal CLK1 is input to the one of the source and the drain of the transistor 22.

The circuit 13 includes a transistor 41 to a transistor 47 and a capacitor C2. To the circuit 13, the signal LIN, a signal CLK2, a signal CLK3, the signal RIN, and a signal RES are input. The above-described n-channel transistor is preferably used as the transistor 41 to the transistor 47. In particular, a transistor using an oxide semiconductor as a semiconductor where a channel is formed is preferably used.

The circuit 13 has a function of outputting the first signal and the second signal obtained by inverting the first signal respectively to the wiring 15a and the wiring 15b in accordance with a variety of signals input.

The circuit 11 and the circuit 13 are supplied with the potential VDD that is a high potential and the potential VSS that is a low potential.

Specifically, in the transistor 41, a gate is electrically connected to a wiring to which the signal LIN is supplied, one of a source and a drain is electrically connected to the wiring 15a and one of a source and a drain of the transistor 46, and the other of the source and the drain is electrically connected to the wiring to which the potential VDD is supplied. In the transistor 42, a gate is electrically connected to a wiring to which the signal CLK3 is supplied, one of a source and a drain is electrically connected to one of a source and a drain of the transistor 43, and the other of the source and the drain is electrically connected to the wiring to which the potential VDD is supplied. In the transistor 43, a gate is electrically connected to a wiring to which the signal CLK2 is supplied, and the other of the source and the drain is electrically connected to the wiring 15b, one electrode of the capacitor C2, and a gate of the transistor 46. In the transistor 44, a gate is electrically connected to a wiring to which the signal RIN is supplied, one of a source and a drain is electrically connected to the wiring 15b, and the other of the source and the drain is electrically connected to the wiring to which the potential VDD is supplied. In the transistor 45, a gate is electrically connected to a wiring to which the signal RES is supplied, one of a source and a drain is electrically connected to the wiring 15b, and the other of the source and the drain is electrically connected to the wiring to which the potential VDD is supplied. In the transistor 46, the other of the source and the drain is electrically connected to the wiring to which the potential VSS is supplied. In the transistor 47, a gate is electrically connected to the wiring to which the signal LIN is supplied, one of a source and a drain is electrically connected to the wiring 15b, and the other of the source and the drain is electrically connected to the wiring to which the potential VSS is supplied. The other electrode of the capacitor C2 is electrically connected to the wiring to which the potential VSS is supplied.

In the example of the circuit 13 illustrated in FIG. 4A, a transistor including a pair of gates is used as the transistor 46. One of the pair of gates of the transistor 46 is electrically connected to the wiring to which the potential VSS is supplied.

Figure 4B:
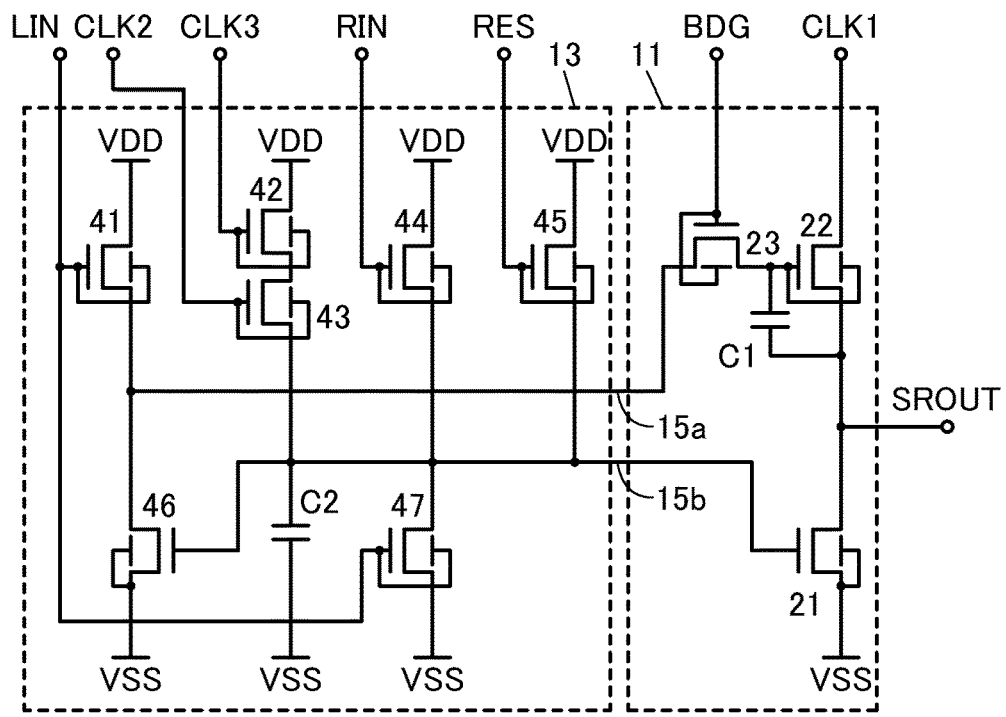

Note that a transistor in which a pair of gates are electrically connected to each other may be used as at least one of the transistor 41 to the transistor 45, the transistor 47, the transistor 22, and the transistor 23. In the example illustrated in FIG. 4B, a transistor in which a pair of gates are electrically connected to each other is used as each of these transistors.

Structure Example 2-2

Figure 5A:
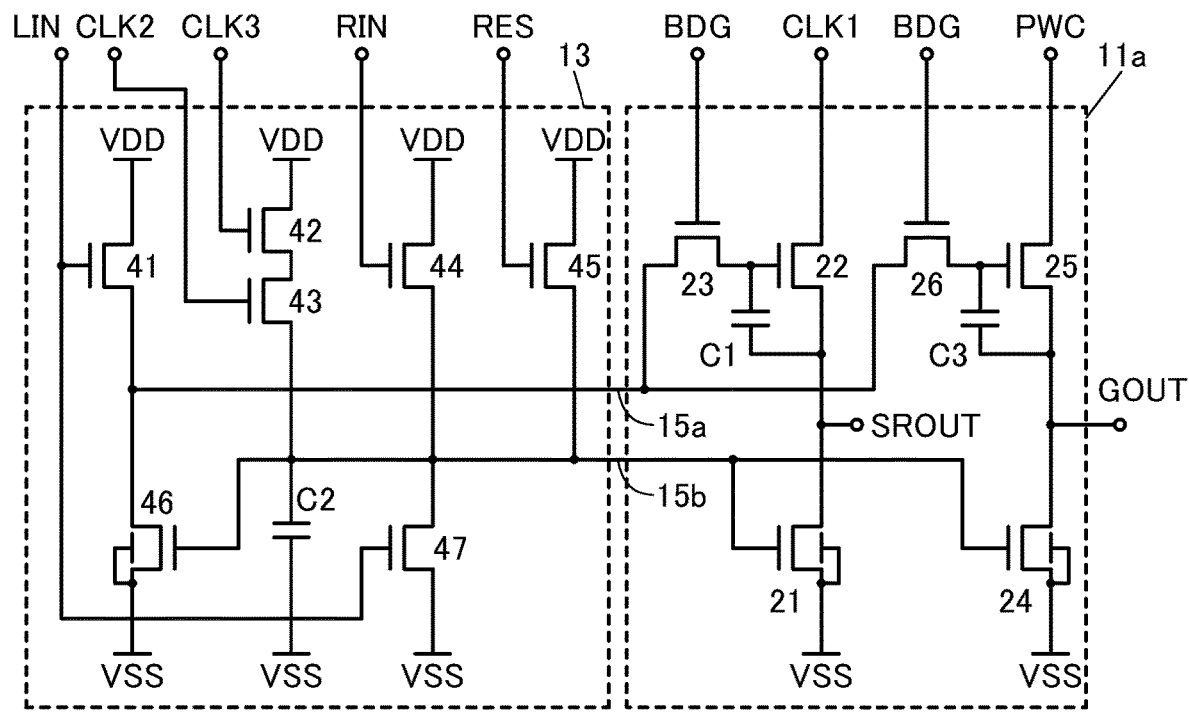
FIG. 5A and FIG. 5B are diagrams illustrating structure examples of a sequential circuit.

FIG. 5A illustrates a structure example of a sequential circuit 30 having two output terminals. The sequential circuit 30 includes a circuit 11a instead of the circuit 11 of the above sequential circuit 20.

The signal BDG, the signal CLK1, and a signal PWC are input to the circuit 11a. The output terminal SROUT and an output terminal GOUT are connected to the circuit 11a.

In the circuit 11a, two circuits 11 are connected in parallel. One circuit 11 is constituted by the transistor 21, the transistor 22, the transistor 23, and the capacitor C1, and the other circuit 11 is constituted by a transistor 24, a transistor 25, a transistor 26, and a capacitor C3. The connection structure of the transistor 24 to the transistor 26 and the capacitor C3 is similar to that in the above circuit 11.

One of a source and a drain of the transistor 25 is electrically connected to a wiring to which the signal PWC is supplied. One of a source and a drain of the transistor 24, the other of the source and the drain of the transistor 25, and the other electrode of the capacitor C3 are electrically connected to the output terminal GOUT. A gate of the transistor 26 is electrically connected to a wiring to which the signal BDG is supplied.

In the circuit 11a, when a high potential and a low potential are respectively supplied to the wiring 15a and the wiring 15b, the potential of the signal CLK1 is output to the output terminal SROUT and the potential of the signal PWC is output to the output terminal GOUT. By contrast, when a low potential and a high potential are respectively supplied to the wiring 15a and the wiring 15b, the output terminal SROUT and the output terminal GOUT are electrically connected to the respective wirings to which the potential VSS is supplied.

Here, in the case where the sequential circuit 30 is used as part of a gate driver circuit of a display device, the output terminal GOUT can be used as a terminal to which a scan line is connected, and the output terminal SROUT can be used as a terminal to which a wiring input to the sequential circuit 30 of the subsequent stage is connected. In this case, it is preferable that a transistor having higher current supply capability than the transistor 21 and the transistor 22 be used as each of the transistor 24 and the transistor 25. For example, a transistor having a large channel width can be used as each of the transistor 24 and the transistor 25.

Here, synchronized signals can be used as the signal CLK1 and the signal PWC. Specifically, it is possible to use signals that are at a high potential during the same period and are at a low potential during the same period. In this case, a signal whose high potential is the potential VDD and whose low potential is the potential VSS is preferably used as each of the signal CLK1 and the signal PWC, which eliminates the need for increasing the varieties of power supply potentials for driving the sequential circuit 30.

As the signal CLK1 and the signal PWC, signals having different amplitudes may be used. For example, a signal as the signal PWC can have a larger amplitude than the signal CLK1. In this case, the signal PWC is preferably a signal whose low potential is the potential VSS and whose high potential is a potential higher than the potential VDD. This allows a high potential to be output to the output terminal GOUT. In addition, the amplitude of the signal CLK1 is reduced and the potential difference between the potential VDD and the potential VSS is reduced, so that voltage stress on the transistors constituting the sequential circuit 30 can be reduced. This can suppress a variation in the electrical characteristics, such as the threshold voltage, of the transistors and enables the sequential circuit 30 to have increased reliability. Even in that case, the high potential of the signal PWC can be output to the output terminal GOUT without being affected by the threshold voltage of the transistor 25 because a potential supplied to the gate of the transistor 25 can be sufficiently higher than the potential VDD owing to a bootstrap effect by the capacitor C3.

Figure 5B:
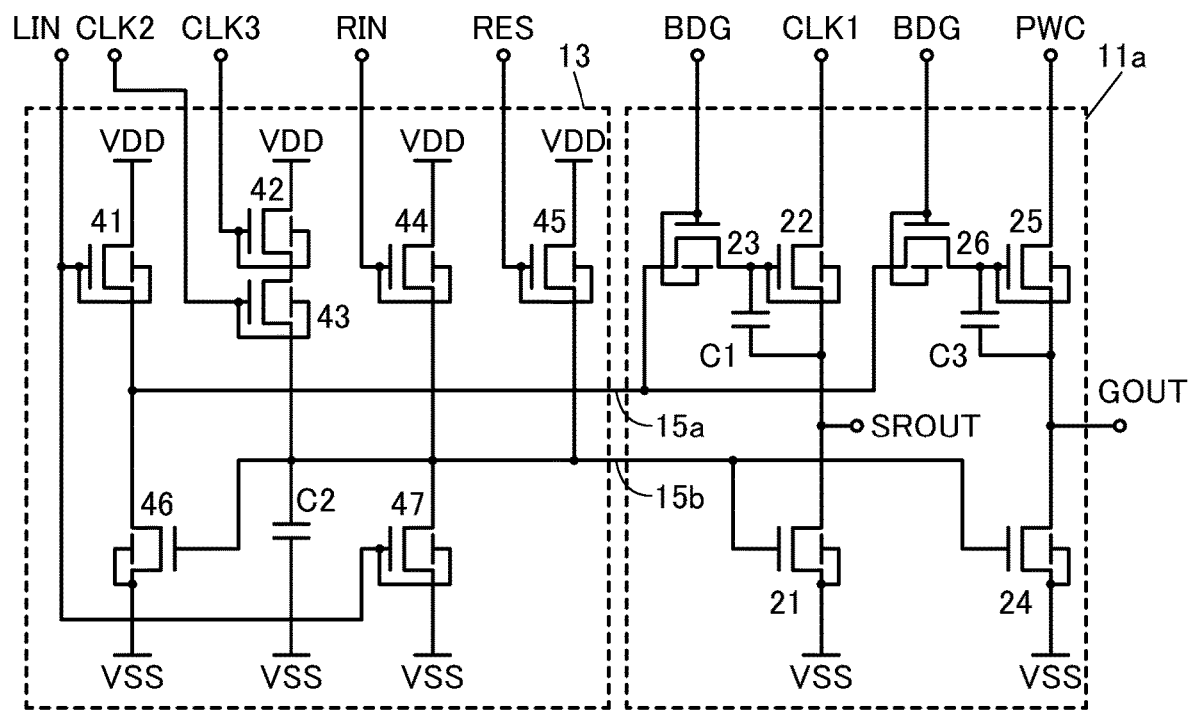

Note that a transistor in which a pair of gates are electrically connected to each other may be used as at least one of the transistor 41 to the transistor 45, the transistor 47, the transistor 22, the transistor 23, the transistor 25, and the transistor 26. In the example illustrated in FIG. 5B, a transistor in which a pair of gates are electrically connected to each other is used as each of these transistors. It is particularly preferable that a transistor in which a pair of gates are electrically connected to each other and which has high current drive capability be used as each of the transistor 22 and the transistor 25.

[Structure Example of Driver Circuit]

An example of a driver circuit that is formed by connecting a plurality of stages of sequential circuits and functions as a shift register is described below.

[Structure Example 1 of Driver Circuit]

Figure 6:
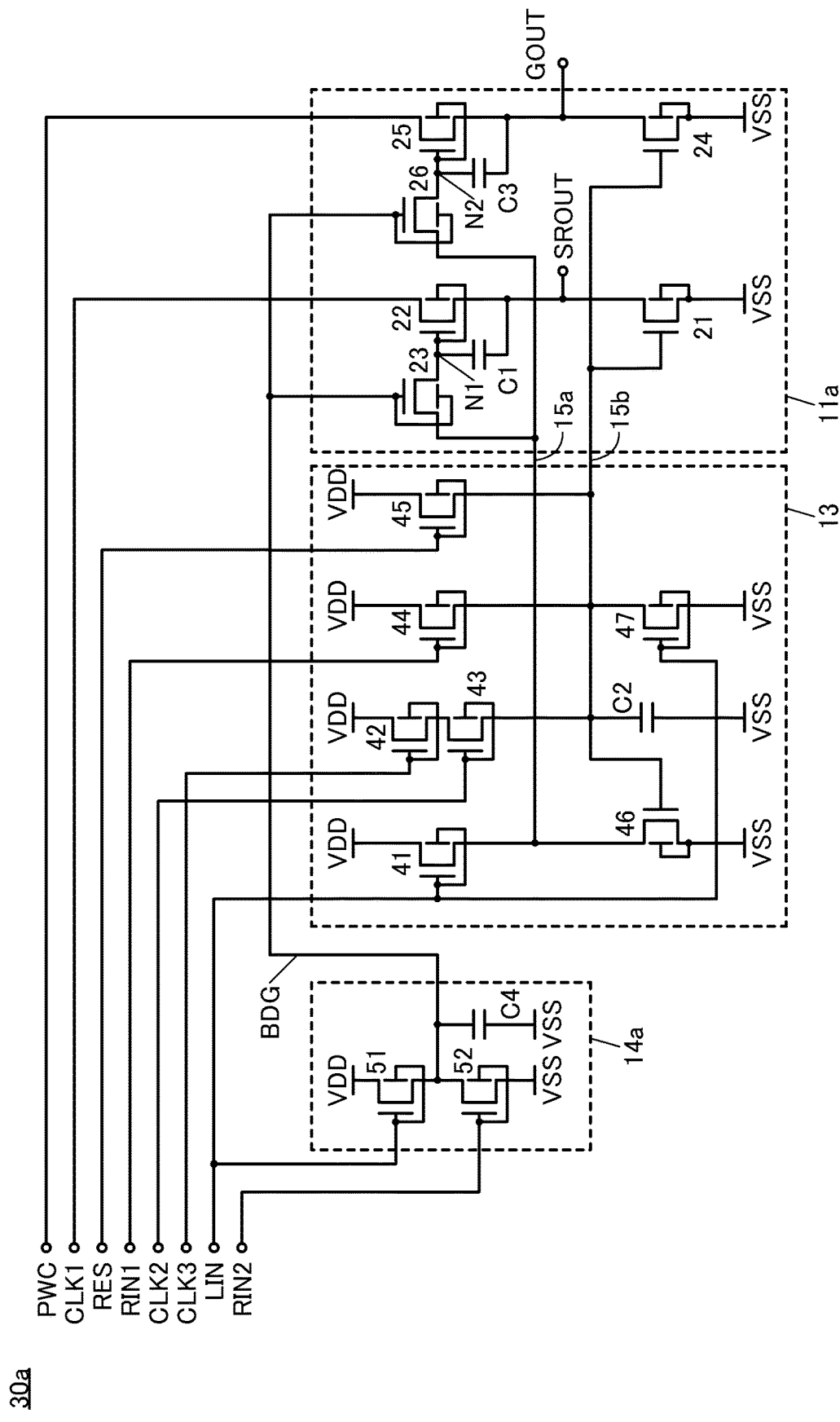
FIG. 6 is a diagram illustrating a structure example of a sequential circuit.

First, a structure example of a sequential circuit that can be used for a driver circuit is described. FIG. 6 is a circuit diagram of a sequential circuit 30a. The sequential circuit 30a includes the circuit 13, the circuit 11a, and a signal generation circuit 14a. The signal generation circuit 14a is a circuit that generates the signal BDG.

Structure example 2 described above can be referred to for the circuit 13 and the circuit 11a. Note that the signal RIN exemplified in Structure example 2 is denoted as a signal RIN1 in FIG. 6. In the circuit 11a, a node to which the gate of the transistor 22 is connected is referred to as a node N1, and a node to which the gate of the transistor 25 is connected is referred to as a node N2.

The signal generation circuit 14a includes a transistor 51, a transistor 52, and a capacitor C4. The signal LIN and a signal RIN2 are input to the signal generation circuit 14a.

In the transistor 51, a gate is electrically connected to the wiring to which the signal LIN is input, one of a source and a drain is electrically connected to the wiring to which the potential VDD is supplied, and the other of the source and the drain is electrically connected to one of a source and a drain of the transistor 52 and one electrode of the capacitor C4. In the transistor 52, a gate is electrically connected to a wiring to which the signal RIN2 is input, and the other of the source and the drain is electrically connected to the wiring to which the potential VSS is supplied. The other electrode of the capacitor C4 is electrically connected to the wiring to which the potential VSS is supplied.

In the signal generation circuit 14a, the signal BDG is output to a wiring connected to the other of the source and the drain of the transistor 51. The signal BDG is supplied to each of the gate of the transistor 23 and the gate of the transistor 26 in the circuit 11a.

When the signal LIN is a high potential and the signal RIN2 is a low potential, the transistor 51 is brought into an on state and the transistor 52 is brought into an off state; thus, the signal BDG output from the signal generation circuit 14a becomes a high potential. On the other hand, when the signal LIN is a low potential and the signal RIN2 is a high potential, the transistor 51 is brought into an off state and the transistor 52 is brought into an on state; thus, the signal BDG becomes a low potential.

The capacitor C4 is connected to the wiring to which the signal BDG is output. Thus, the signal LIN and the signal RIN2 each become a low potential to bring the transistor 51 and the transistor 52 into an off state, and when the wiring to which the signal BDG is output is brought into an electrically floating state, the potential of the wiring can be retained. Accordingly, a high potential or a low potential as the signal BDG is not necessarily output from the signal generation circuit 14a continuously, and in the case where a signal with a low duty ratio is used as the signal LIN and the signal RIN2, the potential of the wiring can be retained for a long time. Specifically, a state where the signal BDG is a low potential can be maintained for a long time; thus, the signal BDG can be a signal with an extremely low duty ratio. Providing the capacitor C4 can prevent a change in the potential of the wiring to which the signal BDG is output due to electrical noise. The transistor 52 does not need to be brought into an on state in a period during which the signal BDG is a low potential, which can relieve voltage stress applied to the transistor 52 and inhibit a change in the threshold voltage.

With the signal generation circuit 14a, the signal BDG can be a pulse signal whose duty ratio is 5% or lower, preferably 3% or lower, further preferably 1% or lower, still further preferably 0.5% or lower, yet further preferably 0.1% or lower. Thus, the sequential circuit 30a and a semiconductor device, a display device, and an electronic device each including the sequential circuit 30a can have extremely high reliability.

FIG. 6 illustrates an example in which a transistor including a pair of gates electrically connected to each other is used as the transistor 51 and the transistor 52 included in the signal generation circuit 14a. One embodiment of the present invention is not limited thereto, and a transistor including one gate may be used as the transistor 51 and the transistor 52. Alternatively, a transistor in which one of a pair of gates is electrically connected to the wiring to which the potential VSS is supplied may be used as the transistor 52.

Figure 7:
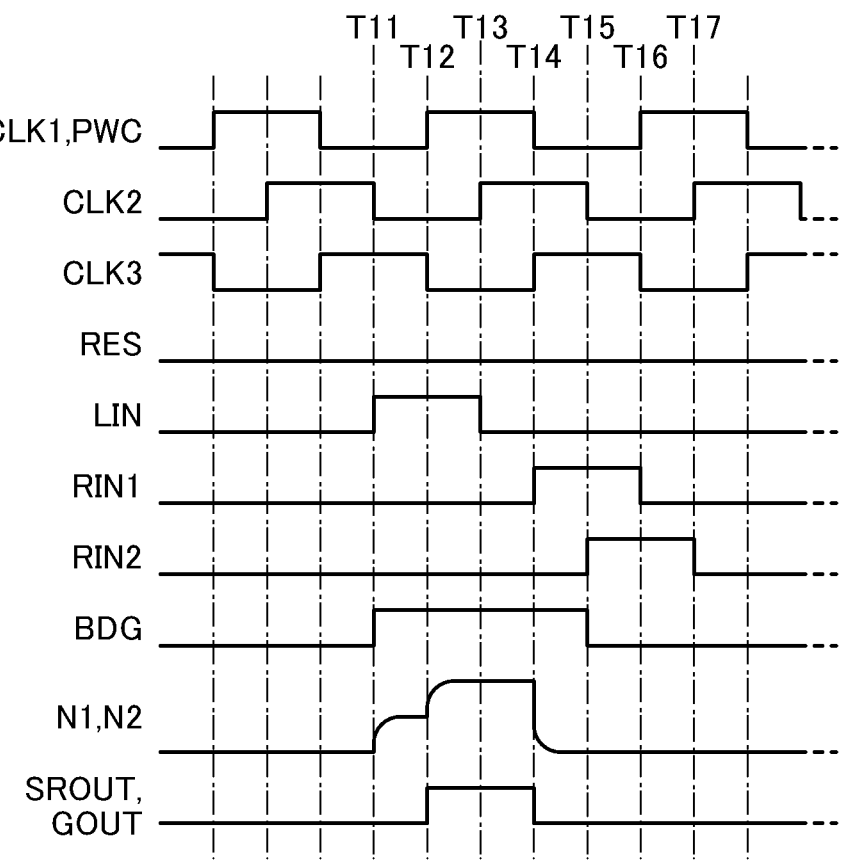
FIG. 7 is a timing chart.

FIG. 7 is a timing chart showing a driving method example of the sequential circuit 30*a*. FIG. 7 schematically shows changes in the potentials of the signal CLK1 (the signal PWC), the signal CLK2, the signal CLK3, the signal RES, the signal LIN, the signal RIN1, the signal RIN2, the signal BDG, the node N1 (the node N2), and the output terminal SROUT (the output terminal GOUT) over time. Note that the signal CLK1 and the signal PWC, which are signals with the same waveform, are collectively shown. The node N1 and the node N2, in which potentials change over time in substantially the same manner, are collectively shown. Clock signals that are sequentially shifted by a quarter of one cycle period are used as the signal CLK1, the signal CLK2, and the signal CLK3.

At Time T11, the signal LIN becomes a high potential and the signal RIN2 becomes a low potential, so that the signal BDG becomes a high potential. Then, at Time T12, the signal CLK1 and the signal PWC become a high potential, so that the potentials of the node N1 and the node N2 increase. In Period T12-T14, a high potential is output to the output terminal SROUT and the output terminal GOUT. At Period T14, the signal LIN is a low potential and the signal RIN1 becomes a high potential, so that a low potential is output to the output terminal SROUT and the output terminal GOUT. Then, at Time T15, the signal RIN2 becomes a high potential, so that the signal BDG becomes a low potential. After the signal RIN2 becomes a low potential at Time T17, the signal BDG remains at a low potential.

Next, a driver circuit formed by connecting a plurality of stages of the sequential circuits 30*a* is described.

Figure 8B:
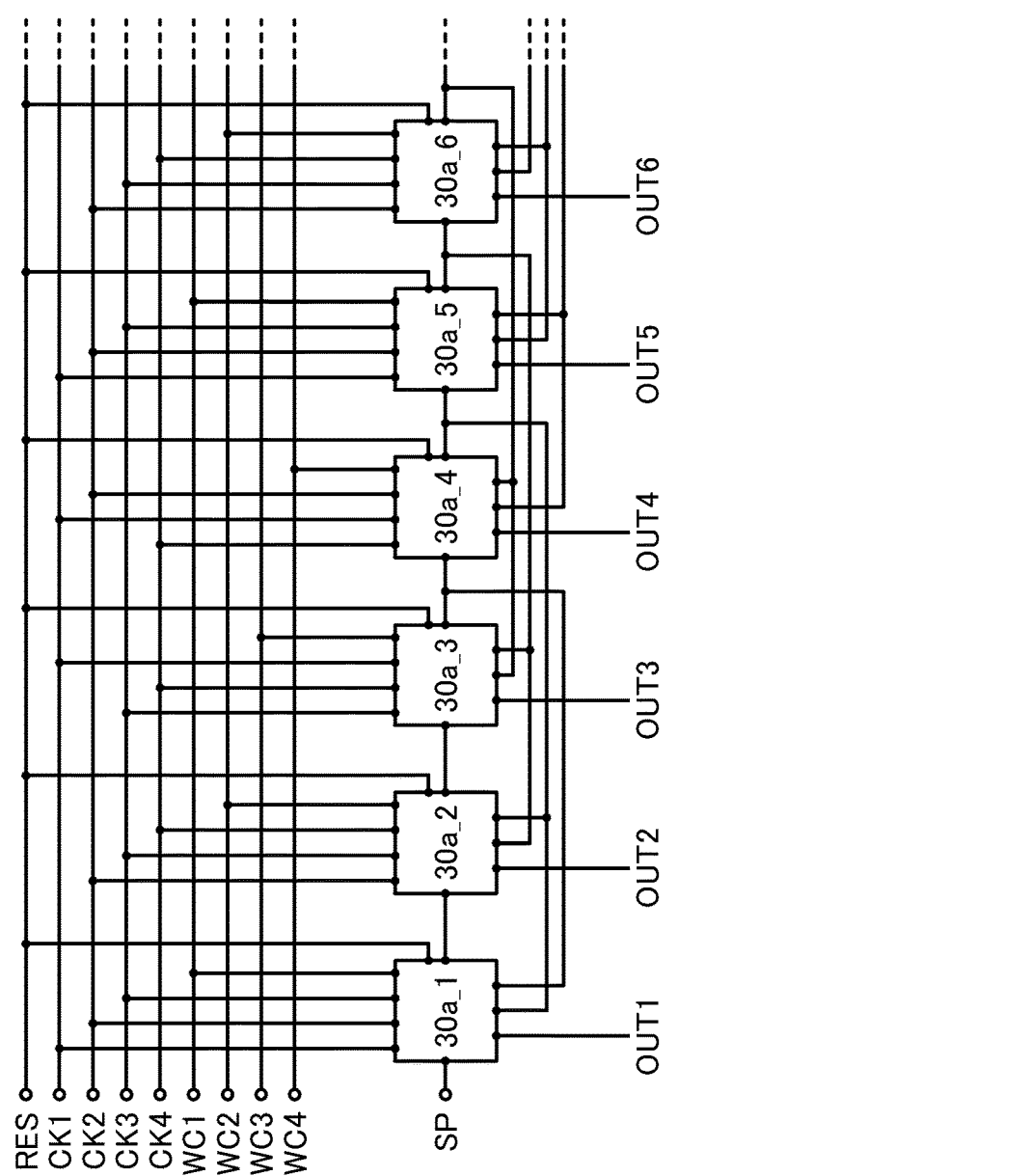
FIG. 8B is a circuit diagram of a shift register.
Figure 8A:
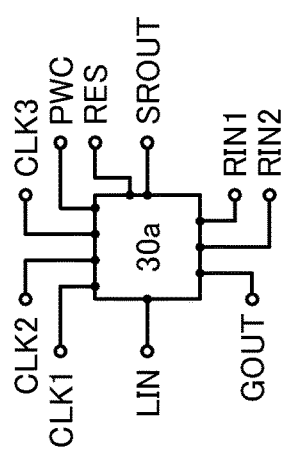
FIG. 8A is a diagram illustrating a structure example of a sequential circuit.

FIG. 8A is a diagram illustrating input and output terminals of the sequential circuit 30*a*. The sequential circuit 30*a* has, as input terminals, terminals to which the signal LIN, the signal RIN1, the signal RIN2, the signal CLK1, the signal CLK2, the signal CLK3, the signal PWC, and the signal RES are input, and has, as output terminals, the output terminal SROUT and the output terminal GOUT.

FIG. 8B illustrates a structure example of a driver circuit 40*a*. The driver circuit 40*a* includes a plurality of sequential circuits. FIG. 8B illustrates a sequential circuit 30*a*_1 to a sequential circuit 30*a*_6, and the subsequent sequential circuits are omitted. The sequential circuit 30*a*_1 and the like each have a structure similar to that of the sequential circuit 30*a* exemplified in FIG. 6. The n-th sequential circuit from the side close to the input of the driver circuit 40*a* will be referred to as the sequential circuit 30*a*_n (n is an integer greater than or equal to 1) below.

In the sequential circuit 30*a*_n, any three of a signal CK1 to a signal CK4 are used as the signal CLK1, the signal CLK2, and the signal CLK3. In the sequential circuit 30*a*_n, any one of a signal PWC1 to a signal PWC4 is used as the signal PWC. Every four stages have the same combination of any three of the signal CK1 to the signal CK4 and any one of the signal PWC1 to the signal PWC4. That is, the same signals are input to the sequential circuit 30*a*_n and the sequential circuit 30*a*_n+4 as the signal CLK1, the signal CLK2, the signal CLK3, and the signal PWC.

To the output terminal GOUT of the sequential circuit 30*a*_n is connected a wiring OUTn (a wiring OUT1 to a wiring OUT6 are illustrated in FIG. 8B) that is an output wiring.

A signal SP is input as the signal LIN to the sequential circuit 30*a*_1. To the sequential circuit 30*a*_n, where n is more than or equal to 2, a signal of the output terminal SROUT of the sequential circuit 30*a*_n−1 is input as the signal LIN. To the sequential circuit 30*a*_n, a signal of the output terminal SROUT of the sequential circuit 30*a*_n+2 is input as the signal RIN1. To the sequential circuit 30*a*_n, a signal of the output terminal SROUT of the sequential circuit 30*a*_n+3 is input as the signal RIN2.

Specifically, the signal CK1, the signal CK2, the signal CK3, the signal PWC1, the signal RES, the signal SP, the output signal of the sequential circuit 30*a*_3, and the output signal of the sequential circuit 30*a*_4 are input to the sequential circuit 30*a*_1, and the sequential circuit 30*a*_1 outputs an output signal to the wiring OUT1. The signal CK2, the signal CK3, the signal CK4, the signal PWC2, the signal RES, the output signal of the sequential circuit 30*a*_1, the output signal of the sequential circuit 30*a*_4, and the output signal of the sequential circuit 30*a*_5 are input to the sequential circuit 30*a*_2, and the sequential circuit 30*a*_2 outputs an output signal to the wiring OUT2. The signal CK3, the signal CK4, the signal CK1, the signal PWC3, the signal RES, the output signal of the sequential circuit 30*a*_2, the output signal of the sequential circuit 30*a*_5, and the output signal of the sequential circuit 30*a*_6 are input to the sequential circuit 30*a*_3, and the sequential circuit 30*a*_3 outputs an output signal to the wiring OUT3. The signal CK4, the signal CK1, the signal CK2, the signal PWC4, the signal RES, the output signal of the sequential circuit 30*a*_3, the output signal of the sequential circuit 30*a*_6, and the output signal of the sequential circuit 30*a*_7 (not illustrated) are input to the sequential circuit 30*a*_4, and the sequential circuit 30*a*_4 outputs an output signal to the wiring OUT4. The signal CK1, the signal CK2, the signal CK3, the signal PWC1, the signal RES, the output signal of the sequential circuit 30*a*_4, the output signal of the sequential circuit 30*a*_7 (not illustrated), and the output signal of the sequential circuit 30*a*_8 (not illustrated) are input to the sequential circuit 30*a*_5, and the sequential circuit 30*a*_5 outputs an output signal to the wiring OUT5. The signal CK2, the signal CK3, the signal CK4, the signal PWC2, the signal RES, the output signal of the sequential circuit 30*a*_5, the output signal of the sequential circuit 30*a*_8 (not illustrated), and the output signal of the sequential circuit 30*a*_9 (not illustrated) are input to the sequential circuit 30*a*_6, and the sequential circuit 30*a*_6 outputs an output signal to the wiring OUT6.

Figure 8C:
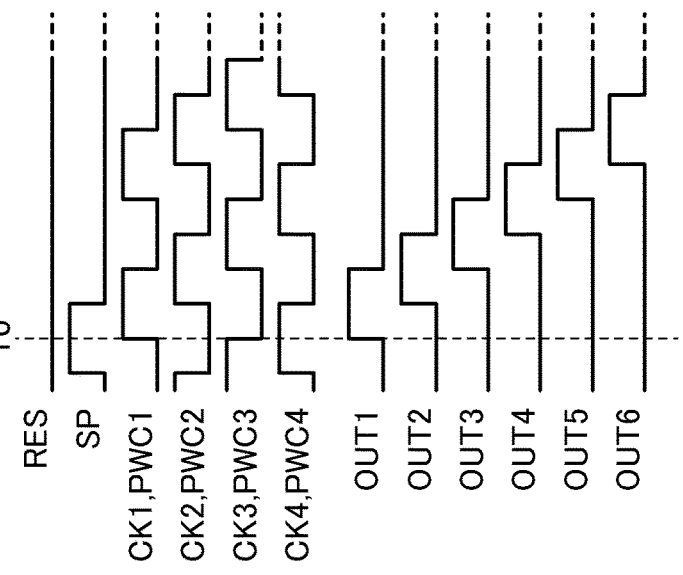
FIG. 8C is a timing chart.

FIG. 8C is a timing chart showing a driving method for the driver circuit 40*a*. FIG. 8C shows, from the top, potential changes in the signal RES, the signal SP, the signal CK1 to the signal CK4, and the wiring OUT1 to the wiring OUT6. Note that the signal PWC1 to the signal PWC4 are respectively clock signals having the same phases and cycles as those of the signal CK1 to the signal CK4; thus, these signals are collectively shown.

In a period before Time T0 shown in FIG. 8C, the signal SP becomes a high potential and the signal CK1 is a low potential. At this time, a low potential is output to the wiring OUT1 to the wiring OUT6.

At Time T0, the signal CK1 (the signal PWC1) becomes a high potential from a low potential, so that a high potential is output from the sequential circuit 30*a*_1 to the wiring OUT1. After that, with the signal CK1 to the signal CK4 and the signal PWC1 to the signal PWC4, high potentials are sequentially output to the wiring OUT2 and the subsequent wirings.

The signal CK1 to the signal CK4 are signals that are sequentially shifted by a quarter of one cycle period. Similarly, the signal PWC1 to the signal PWC4 are signals that are sequentially shifted by a quarter of one cycle period. Thus, as shown in FIG. 8C, signals that are sequentially shifted by a quarter of one cycle period, e.g., the signal CK1 and the like, are output to the wiring OUT1 to the wiring OUT6, and the like.

A high potential is output to the wiring OUT1 to the wiring OUT6 and the like in a cycle of a half of one cycle period of the signal CK1 and the like. That is, a period during which the wiring OUTn is a high potential overlaps with a period during which the wiring OUTn+1 is a high potential. This enables a period for selecting the wiring OUTn to be long; thus, such a driving method is suitably used in the case where a load of a wiring is large, for example. In other words, such a driving method is preferably used in the case where the driver circuit 40a is used as a scan line driver circuit in a display device with a large number of pixels, a display device with a large screen size, or the like, in which case the charge and discharge periods of the scan line can be longer. Here, the four-phase clock signals that are sequentially shifted by a quarter of one cycle period are used as the signal CK1 to the signal CL4, and a high potential is output to (selected in) the wiring OUTn in a half of one cycle period of the signal CK1 and the like so that the period during which the adjacent two wirings are concurrently selected is provided; however, one embodiment of the present invention is not limited thereto. For example, shifts in the cycles of the clock signals or the duty ratios may be changed so that three or more adjacent wirings can be selected concurrently.

[Structure Example 2 of Driver Circuit]

A structure example of a signal generation circuit whose structure is partly different from that of the signal generation circuit 14a illustrated in FIG. 6 as an example is described below.

Figure 9:
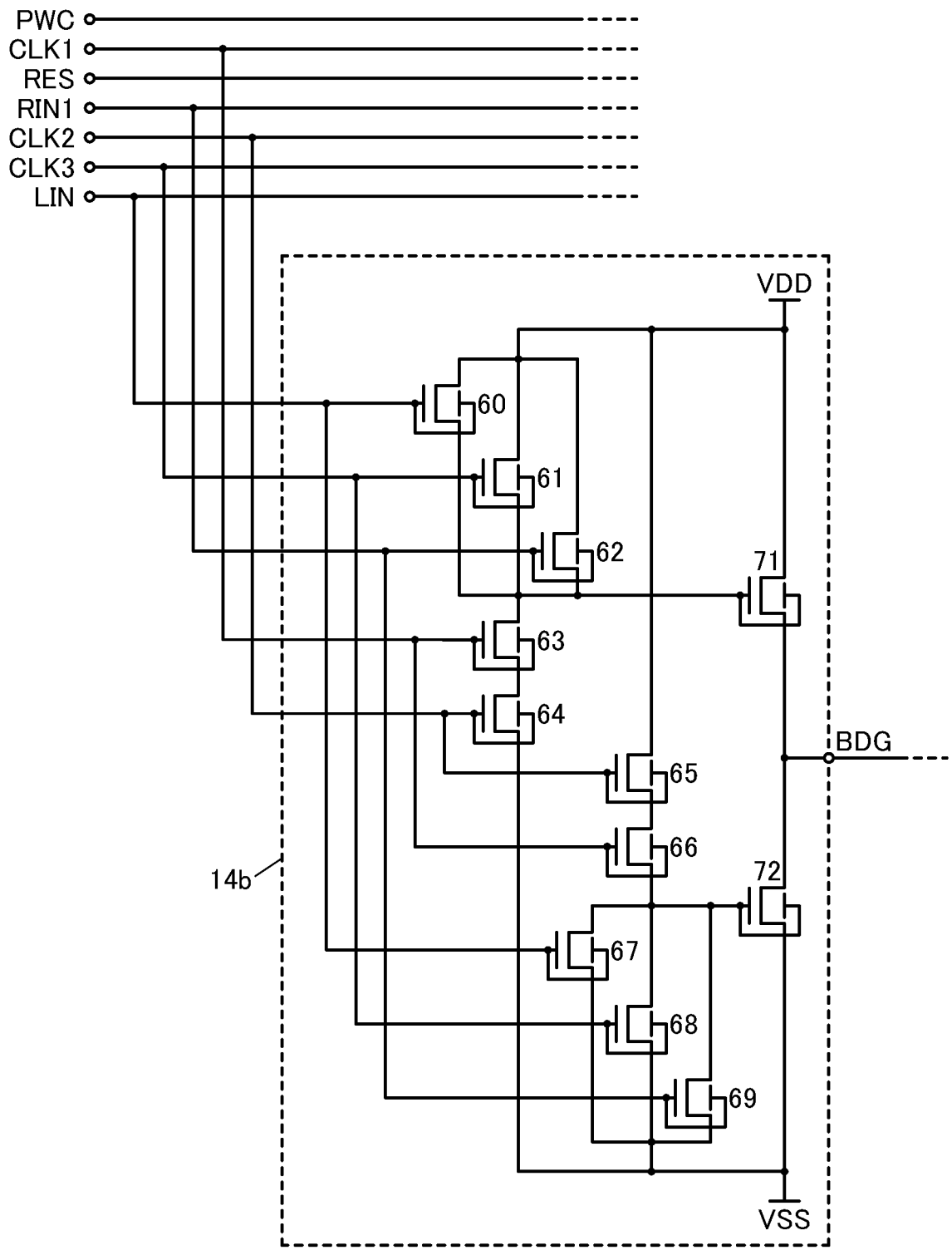
FIG. 9 is a diagram illustrating a structure example of a signal generation circuit.

FIG. 9 is a circuit diagram of a signal generation circuit 14b. The signal generation circuit 14b is a circuit that generates the signal BDG. Unlike the above signal generation circuit 14a, the signal generation circuit 14b does not use the signal RIN2 and thus the number of wirings can be reduced.

The signal generation circuit 14b includes a transistor 60 to a transistor 69, a transistor 71, and a transistor 72.

In the transistor 60, a gate is supplied with the signal LIN, one of a source and a drain is supplied with the potential VDD, and the other of the source and the drain is electrically connected to a gate of the transistor 71. In the transistor 61, a gate is supplied with the signal CLK3, one of a source and a drain is supplied with the potential VDD, and the other of the source and the drain is electrically connected to the gate of the transistor 71. In the transistor 62, a gate is supplied with the signal RIN1, one of a source and a drain is supplied with the potential VDD, and the other of the source and the drain is electrically connected to the gate of the transistor 71. In the transistor 63, a gate is supplied with the signal CLK1, one of a source and a drain is electrically connected to the gate of the transistor 71, and the other of the source and the drain is electrically connected to one of a source and a drain of the transistor 64. In the transistor 64, a gate is supplied with the signal CLK2, and the other of the source and the drain is supplied with the potential VSS. In the transistor 65, a gate is supplied with the signal CLK2, one of a source and a drain is supplied with the potential VDD, and the other of the source and the drain is electrically connected to one of a source and a drain of the transistor 66. In the transistor 66, a gate is supplied with the signal CLK1, and the other of the source and the drain is electrically connected to a gate of the transistor 72. In the transistor 67, a gate is supplied with the signal LIN, one of a source and a drain is electrically connected to the gate of the transistor 72, and the other of the source and the drain is supplied with the potential VSS. In the transistor 68, a gate is supplied with the signal CLK3, one of a source and a drain is electrically connected to the gate of the transistor 72, and the other of the source and the drain is supplied with the potential VSS. In the transistor 69, a gate is supplied with the signal RIN1, one of a source and a drain is electrically connected to the gate of the transistor 72, and the other of the source and the drain is supplied with the potential VSS. In the transistor 71, one of a source and a drain is supplied with the potential VDD, and the other of the source and the drain is electrically connected to one of a source and a drain of the transistor 72 and the wiring to which the signal BDG is output. In the transistor 72, the other of the source and the drain is supplied with the potential VSS.

The signal generation circuit 14b can generate the signal BDG with a duty ratio higher than or equal to 45% and lower than or equal to 55%, preferably higher than or equal to 45% and lower than or equal to 51%, and typically higher than or equal to 50% and lower than or equal to 51%. Thus, the reliability can be higher than that in the case where the potential VDD is used instead of the signal BDG.

With the signal generation circuit 14b having such a structure, the signal BDG can be generated using only the signals supplied to the circuit 13 and the circuit 11a.

[Structure Example 3 of Driver Circuit]

A structure example of a driver circuit that does not use a signal generation circuit is described below.

Figure 10:
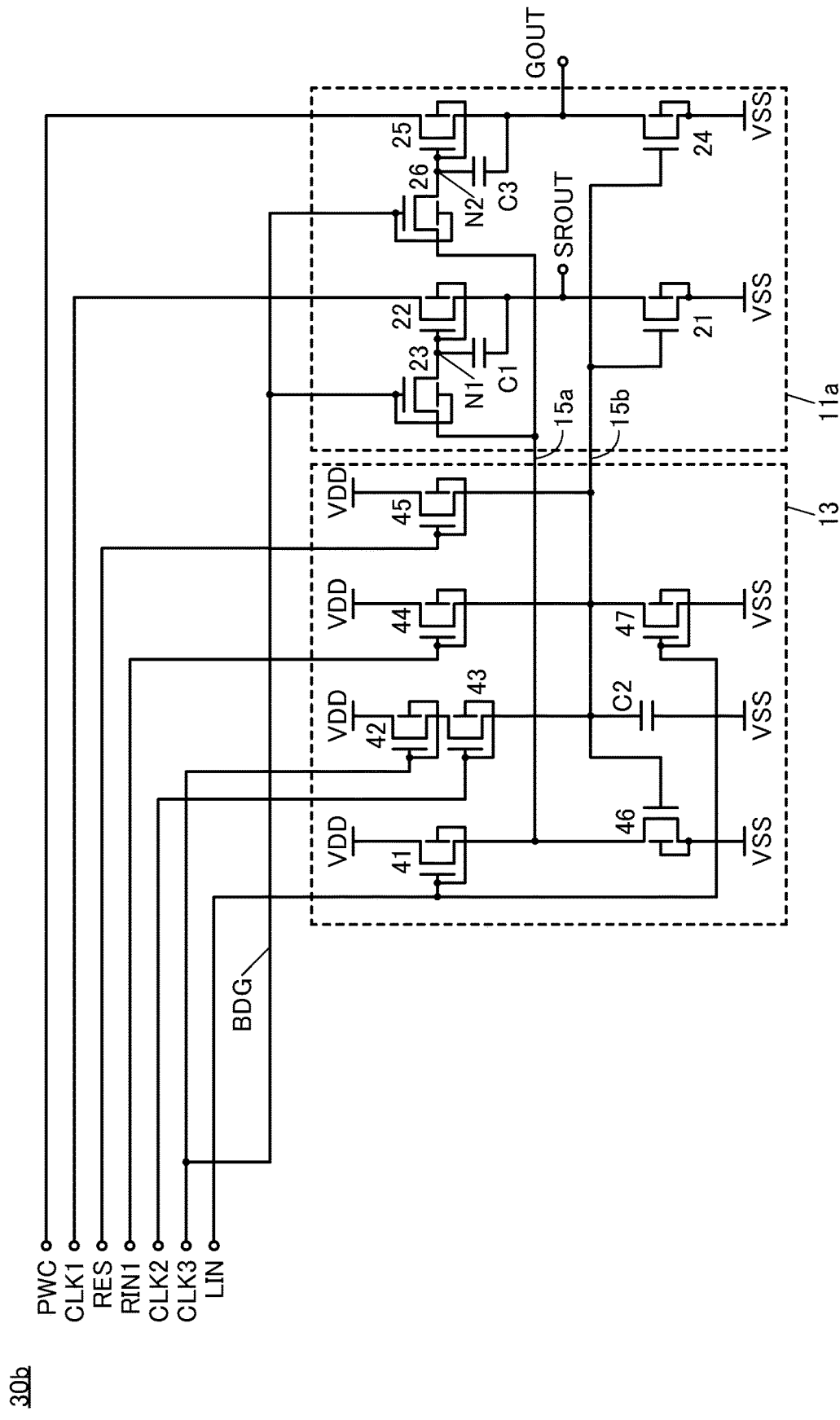
FIG. 10 is a diagram illustrating a structure example of a sequential circuit.

FIG. 10 is a circuit diagram of a sequential circuit 30b. The sequential circuit 30b differs from the above sequential circuit 30a mainly in that the signal generation circuit 14a is not included.

The sequential circuit 30b has a structure using the signal CLK3 as the signal BDG. Unlike in the above sequential circuit 30a, the signal RIN2 and the signal generation circuit 14a are not used; thus, the structure can be simplified.

Figure 11:
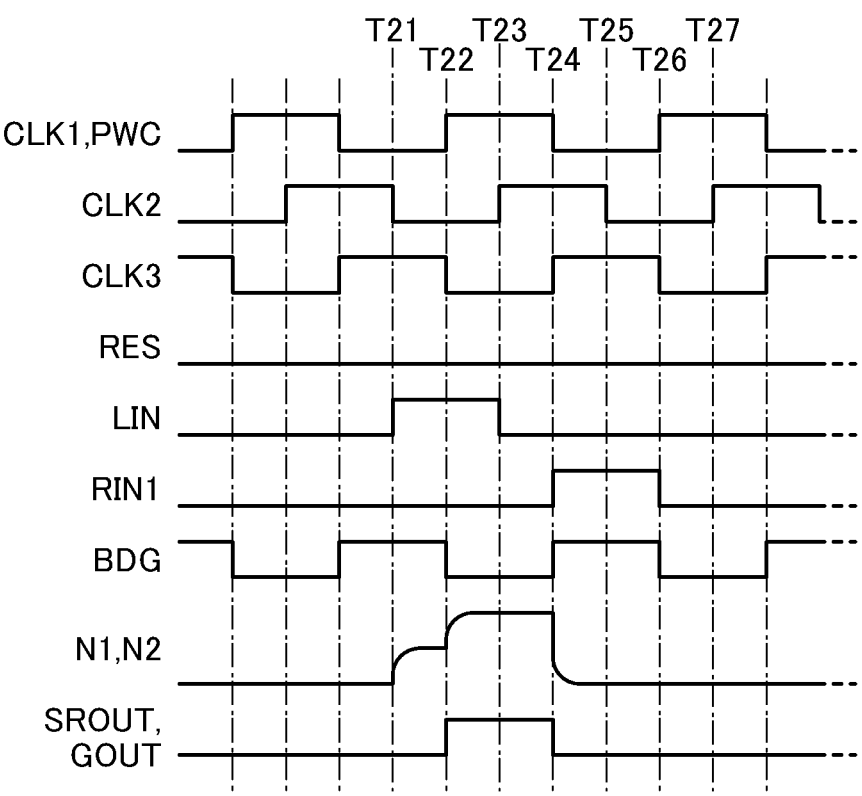
FIG. 11 is a timing chart.

FIG. 11 is a timing chart showing a driving method example of the sequential circuit 30b. FIG. 11 schematically shows changes in the potentials of the signal CLK1 (the signal PWC), the signal CLK2, the signal CLK3, the signal RES, the signal LIN, the signal RIN1, the signal BDG, the node N1 (the node N2), and the output terminal SROUT (the output terminal GOUT) over time.

As shown in FIG. 11, the signal BDG is the same signal as the signal CLK3.

At Time T21, the signal BDG is a high potential and the signal LIN becomes a high potential, so that the node N1 and the node N2 have a high potential. Then, at Time T22, the signal CLK1 and the signal PWC become a high potential, so that the potentials of the node N1 and the node N2 increase. In Period T22-T24, a high potential is output to the output terminal SROUT and the output terminal GOUT. At this time, the signal BDG becomes a low potential to bring the transistor 23 and the transistor 26 into an off state, so that the node N1 and the node N2 are brought into an electrically floating state. Subsequently, at Time T24, the signal LIN is a low potential, the signal RIN1 becomes a high potential, the signal BDG becomes a high potential, and the transistor 23 and the transistor 26 are brought into an on state again, so that the potentials of the node N1 and the node N2 decrease to a low potential. Thus, a low potential is output to the output terminal SROUT and the output terminal GOUT. Then, at Time T26, the signal BDG becomes a low potential. After that, a high potential and a low potential are alternately input as the signal BDG; however, both the signal LIN and the signal RIN1 are a low potential, so that the output terminal SROUT and the output terminal GOUT remain at a low potential.

Since a clock signal is used as the signal BDG, the sequential circuit 30b can use, as the signal BDG, a pulse signal whose duty ratio is higher than or equal to 45% and lower than or equal to 55%, preferably higher than or equal to 45% and lower than or equal to 51%, and typically 50%. Thus, the reliability can be higher than that in the case where the potential VDD is used instead of the signal BDG.

Figure 12B:
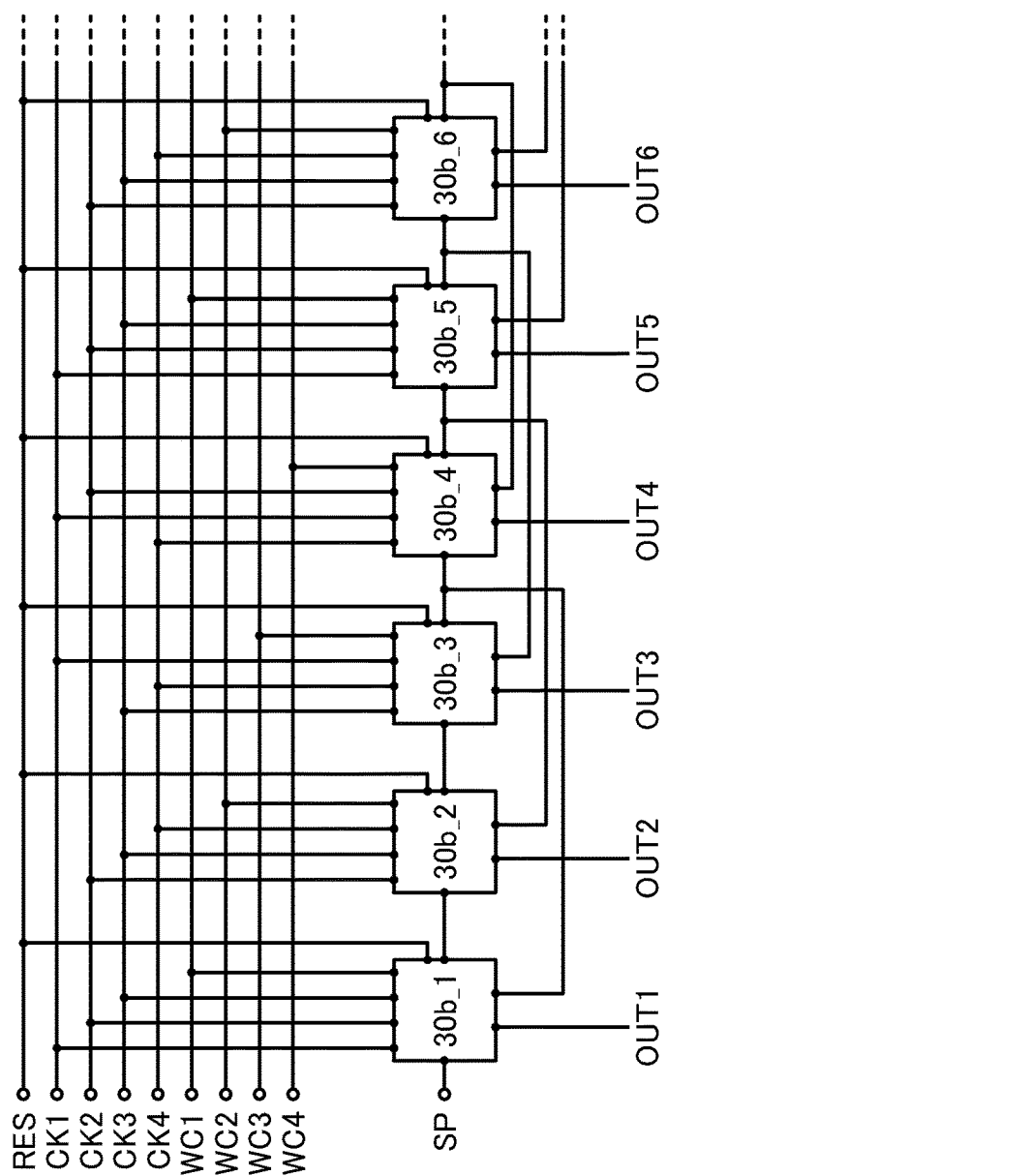
FIG. 12B is a circuit diagram of a shift register.
Figure 12A:
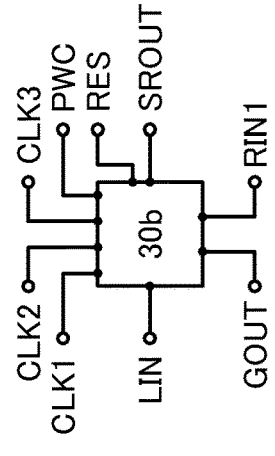
FIG. 12A is a diagram illustrating a structure example of a sequential circuit.

FIG. 12A is a diagram illustrating input and output terminals of the sequential circuit 30b. The sequential circuit 30b differs from the above sequential circuit 30a in that a terminal to which the signal RIN2 is input is not included.

FIG. 12B illustrates a structure example of a driver circuit 40b including the sequential circuit 30b. The driver circuit 40b has the same structure as the above driver circuit 40a except that the wiring connected to the terminal of the sequential circuit 30a_n to which the signal RIN2 is input is not included.

Figure 12C:
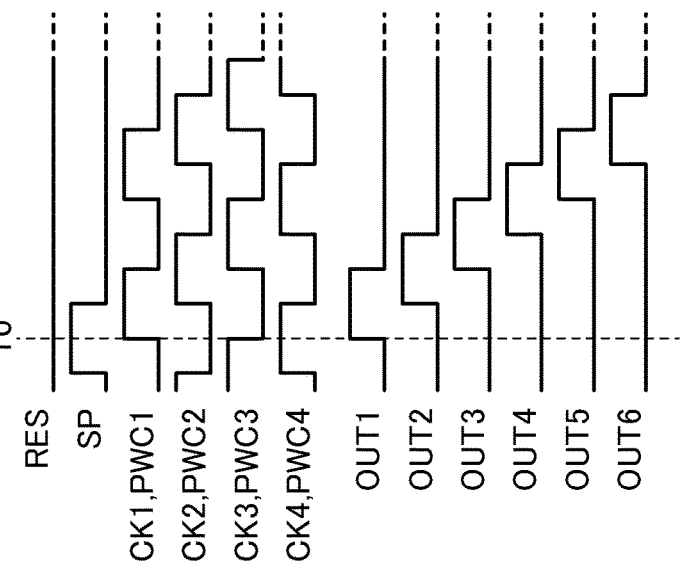
FIG. 12C is a timing chart.

FIG. 12C is a timing chart showing a driving method for the driver circuit 40b. As shown in FIG. 12C, the same output signals can be obtained by the same driving method as that for the driver circuit 40a.

The driver circuit exemplified here functions as a shift register for sequentially supplying pulse signals to a plurality of wirings and thus can be suitably used as a gate driver circuit (a scan line driver circuit) of a display device. Note that the driver circuit can also be suitably used in a variety of devices including a shift register circuit, such as a memory device, without being limited to a display device.

The above is the description of the structure examples of the driver circuit.

[Structure Example of Transistor]

Structure examples of a transistor that can be used in the sequential circuits described above as examples are described below.

The transistors described below as examples have a structure in which a pair of gates sandwich a semiconductor layer and one of the gates and one of a source and a drain are electrically connected to each other. The transistors described below as examples can each be used as the transistor 21 or the like in any of the sequential circuits described above as examples.

Note that when connection between a gate, a source, and a drain of a transistor exemplified below is changed, a transistor that can be used as other transistors such as the transistor 22 and the transistor 23 in the above-described sequential circuit can be fabricated. For example, when a connection portion of each conductive layer or a shape (pattern) of a conductive layer in a transistor including a pair of gates electrically connected to each other or a transistor including only one gate is changed, the transistor can be fabricated in a manner similar to that for a transistor to be exemplified below.

Structure Example 1

Figure 13A:
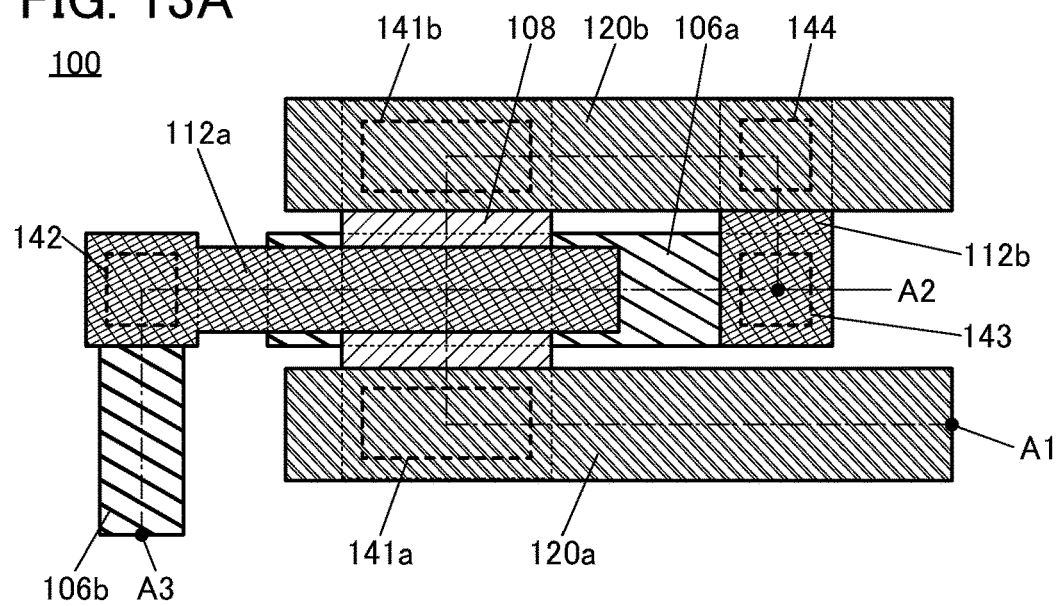
FIG. 13A to FIG. 13C are diagrams illustrating a structure example of a transistor.
Figure 13B:
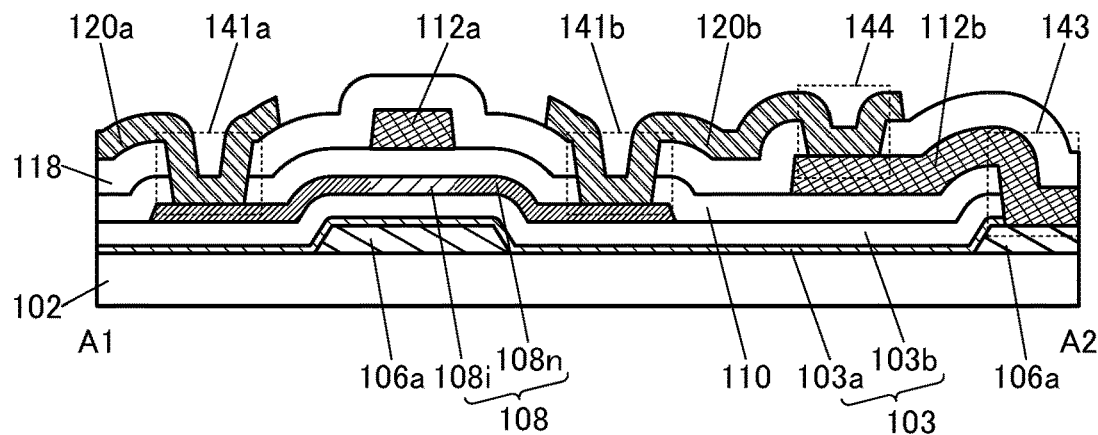

FIG. 13A is a schematic top view of a transistor 100. FIG. 13B corresponds to a cross-sectional view of a cross section along the dashed-dotted line A1-A2 in FIG. 13A, and FIG. 13C corresponds to a cross-sectional view of a cross section along the dashed-dotted line A3-A2 in FIG. 13A. Note that in FIG. 13A, some components (e.g., a gate insulating layer) of the transistor 100 are not illustrated. In addition, the direction of the dashed-dotted line A1-A2 includes the channel length direction of the transistor 100, and the direction of the dashed-dotted line A3-A2 includes the channel width direction of the transistor 100. Furthermore, some components are not illustrated in top views of transistors in the subsequent drawings, as in FIG. 13A.

The transistor 100 is provided over a substrate 102 and includes a conductive layer 106a, an insulating layer 103, a semiconductor layer 108, an insulating layer 110, a conductive layer 112a, and the like. The conductive layer 106a is provided over the substrate 102. The insulating layer 103 is provided to cover the substrate 102, the conductive layer 106a, and the like. The semiconductor layer 108 having an island-like shape is provided over the insulating layer 103 and includes a region overlapping with the conductive layer 106a. The insulating layer 110 is provided to cover the semiconductor layer 108 and the insulating layer 103. The conductive layer 112a is provided over the insulating layer 110 and includes a region overlapping with the semiconductor layer 108 and the conductive layer 106a.

An insulating layer 118 is provided to cover the conductive layer 112a and the insulating layer 110.

In the transistor 100, part of the conductive layer 112a has a function of a first gate electrode (also referred to as a top gate electrode), and part of the conductive layer 106a has a function of a second gate electrode (also referred to as a bottom gate electrode). In addition, part of the insulating layer 110 functions as a first gate insulating layer, and part of the insulating layer 103 functions as a second gate insulating layer.

The semiconductor layer 108 preferably contains a metal oxide. The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin. It is particularly preferable to use an oxide containing indium, gallium, and zinc (also referred to as IGZO) for the semiconductor layer 108. Alternatively, it is preferable to use an oxide containing indium, tin, and zinc. Further alternatively, it is preferable to use an oxide containing indium, gallium, tin, and zinc.

The semiconductor layer 108 includes a region 108i functioning as a channel formation region and a pair of low-resistance regions 108n provided to sandwich the region 108i. One of the pair of low-resistance regions 108n functions as a source region of the transistor 100 and the other functions as a drain region of the transistor 100. The region 108i overlaps with at least one of the conductive layer 112a and the conductive layer 106a. Although a portion of the semiconductor layer 108 that overlaps with the conductive layer 112a is illustrated as the region 108i functioning as the channel formation region in FIG. 13B, a channel is also actually formed in a portion not overlapping with the conductive layer 112a but overlapping with the conductive layer 106a (i.e., in a portion including the low-resistance region 108n) in some cases.

The low-resistance region 108n can be regarded as a region having lower resistance than the channel formation region, a region having a higher carrier concentration than the channel formation region, a region having a higher oxygen defect density than the channel formation region, a region having a higher impurity concentration than the channel formation region, or an n-type region.

The low-resistance region 108n of the semiconductor layer 108 may be a region containing an impurity element. Examples of the impurity element include hydrogen, boron, carbon, nitrogen, fluorine, phosphorus, sulfur, arsenic, aluminum, and a rare gas. Note that typical examples of a rare gas include helium, neon, argon, krypton, and xenon. In particular, boron or phosphorus is preferably contained. Alternatively, two or more of these elements may be contained.

Treatment for adding the impurity to the low-resistance region 108n can be performed through the insulating layer 110 using the conductive layer 112a as a mask.

The low-resistance region 108n preferably includes a region where the impurity concentration is higher than or equal to $1 \times 10^{19}$ atoms/cm$^3$ and lower than or equal to $1 \times 10^{23}$ atoms/cm$^3$, preferably higher than or equal to $5 \times 10^{19}$ atoms/cm$^3$ and lower than or equal to $5 \times 10^{22}$ atoms/cm$^3$, further preferably higher than or equal to $1 \times 10^{20}$ atoms/cm$^3$ and lower than or equal to $1 \times 10^{22}$ atoms/cm$^3$.

The concentrations of the impurities contained in the low-resistance regions 108n can be analyzed by an analysis method such as secondary ion mass spectrometry (SIMS) or X-ray photoelectron spectroscopy (XPS), for example. In the case of using XPS analysis, it is possible to find out the concentration distribution in the depth direction by combination of an analysis method such as SIMS analysis or XPS analysis and ion sputtering from a front surface side or a back surface side.

Specifically, it is preferable to employ an analysis method using neutron rays in the case where hydrogen is used as the impurity element.

In addition, the impurity element preferably exists in an oxidized state in the low-resistance region 108n. For example, it is preferable to use an element that is easily oxidized, such as boron, phosphorus, magnesium, aluminum, or silicon, as the impurity element. Since such an element that is easily oxidized can exist stably in a state of being bonded to oxygen in the semiconductor layer 108 to be oxidized, the element is inhibited from being released even when a high temperature (e.g., higher than or equal to 400° C., higher than or equal to 600° C., or higher than or equal to 800° C.) is applied in a later step. Furthermore, the impurity element deprives the semiconductor layer 108 of oxygen, so that many oxygen vacancies are generated in the low-resistance regions 108n. The oxygen vacancies are bonded to hydrogen in the film to serve as carrier supply sources; thus, the low-resistance regions 108n are in an extremely low-resistance state.

For example, in the case where boron is used as the impurity element, boron contained in the low-resistance region 108n can exist in a state of being bonded to oxygen. This can be confirmed when a spectrum peak attributed to a $B_2O_3$ bond is observed in XPS analysis. Furthermore, in XPS analysis, the intensity of a spectrum peak attributed to a state where a boron element exists alone is so low that the spectrum peak is not observed or is buried in background noise detected around the lower measurement limit.

In some cases, the above impurity element is contained in a region of the insulating layer 110 that overlaps with the low-resistance region 108n. In this case, as in the low-resistance region 108n, the impurity element in the insulating layer 110 preferably exists in a state of being bonded to oxygen. Since such an element that is easily oxidized can exist stably in a state of being bonded to oxygen in the insulating layer 110 to be oxidized, the element is inhibited from being released even when a high temperature is applied in a later step. Furthermore, particularly in the case where oxygen (also referred to as excess oxygen) that might be released by heating is contained in the insulating layer 110, the excess oxygen and the impurity element are bonded to each other and stabilized, so that oxygen can be inhibited from being supplied from the insulating layer 110 to the low-resistance region 108n. Furthermore, since oxygen is less likely to be diffused into part of the insulating layer 110 containing the oxidized impurity element, supply of oxygen to the low-resistance region 108n from above the insulating layer 110 therethrough is suppressed and an increase in the resistance of the low-resistance region 108n can also be prevented.

The insulating layer 103 has a stacked-layer structure in which an insulating film 103a and an insulating film 103b are stacked from the substrate 102 side. In that case, an insulating film that is less likely to diffuse a metal element included in the conductive layer 106a is preferably used as the insulating film 103a positioned on the conductive layer 106a side. For example, an inorganic insulating film such as a silicon nitride film, a silicon nitride oxide film, an aluminum oxide film, or a hafnium oxide film is preferably used. The insulating film 103b in contact with the semiconductor layer 108 is preferably formed using an insulating film containing oxygen. For example, a silicon oxide film, a silicon oxynitride film, or the like is preferably used.

Note that the insulating layer 103 may have a single-layer structure or a stacked-layer structure in which three or more layers are stacked. Although FIG. 13B and FIG. 13C illustrate the insulating layer 110 having a single-layer structure, the insulating layer 110 may have a stacked-layer structure in which two or more layers are stacked.

Figure 13C:
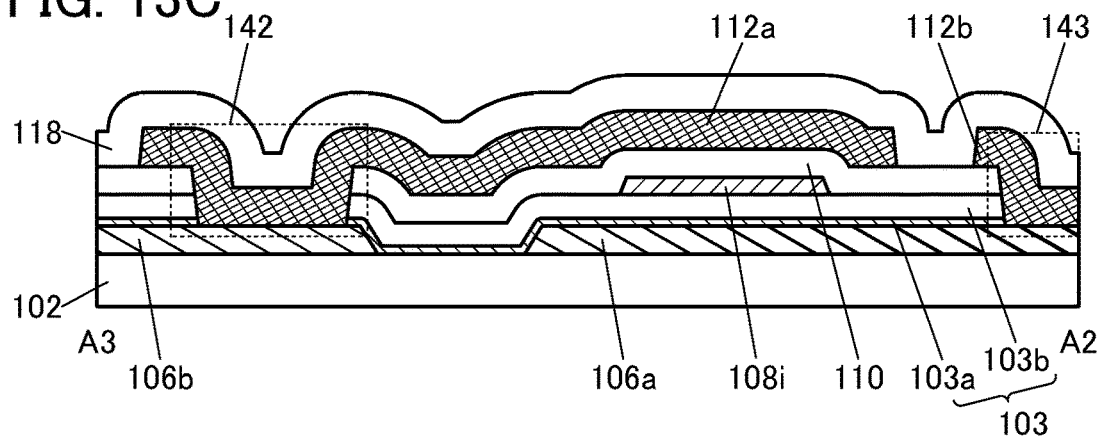

Although FIG. 13B and FIG. 13C illustrate an example in which the insulating layer 110 is provided to cover an end portion of the semiconductor layer 108, one embodiment of the present invention is not limited to this structure. For example, the insulating layer 110 may be processed such that the top surface shapes of the insulating layer 110 and the conductive layer 112a are substantially aligned with each other. In this case, the top surface of the low-resistance region 108n of the semiconductor layer 108 is in contact with the insulating layer 118.

Note that in this specification and the like, the expression "top surface shapes are substantially aligned with each other" means that at least outlines of two stacked layers partly overlap with each other. For example, the case of processing an upper layer and a lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such a case is also represented by the expression "top surface shapes are substantially aligned with each other".

A layer functioning as a barrier film may be provided between the conductive layer 112a and the insulating layer 110. For example, a metal film, an alloy film, or a metal oxide film can be provided between the conductive layer 112a and the insulating layer 110. The layer functioning as a barrier film is preferably formed using a material that is less likely to transmit one, or preferably both, of oxygen and hydrogen than at least the insulating layer 110. This can prevent diffusion of oxygen from the semiconductor layer 108 to the conductive layer 112a side and diffusion of hydrogen from the conductive layer 112a to the semiconductor layer 108. As a result, the region 108i of the semiconductor layer 108 that functions as the channel formation region can have an extremely low carrier density. As a metal oxide film that can be used for the layer functioning as the barrier film, it is possible to use an oxide insulating film such as an aluminum oxide film, a hafnium oxide film, or a hafnium aluminate film or a conductive oxide film of indium oxide, indium tin oxide, indium tin oxide containing silicon, or the like.

Alternatively, as a metal oxide film functioning as the barrier film, it is preferable to use a metal oxide film formed using an oxide material containing one or more elements that are the same as those contained in the semiconductor layer 108, or suitably, a metal oxide film formed using the same sputtering target as the semiconductor layer 108. In the case where the metal oxide film is formed using a sputtering apparatus, forming the metal oxide film in an atmosphere containing an oxygen gas can suitably add oxygen to the insulating layer 110, the semiconductor layer 108, or the like. Note that the formed metal oxide film may be removed in the case where the metal oxide film is formed to supply oxygen to the insulating layer 110, the semiconductor layer 108, or the like.

As illustrated in FIG. 13A and FIG. 13B, the transistor 100 includes a conductive layer 120*a* and a conductive layer 120*b* over the insulating layer 118. The conductive layer 120*a* functions as one of a source electrode and a drain electrode and the conductive layer 120*b* functions as the other of the source electrode and the drain electrode. The conductive layer 120*a* and the conductive layer 120*b* are electrically connected to the low-resistance regions 108*n* in the semiconductor layer 108 respectively in an opening portion 141*a* and an opening portion 141*b* which are provided in the insulating layer 118 and the insulating layer 110.

The insulating layer 118 functions as a protective layer protecting the transistor 100. For example, an inorganic insulating material such as an oxide or a nitride can be used for the insulating layer 118. More specifically, for example, an inorganic insulating material such as silicon oxide, silicon oxynitride, silicon nitride, silicon nitride oxide, aluminum oxide, aluminum oxynitride, aluminum nitride, hafnium oxide, or hafnium aluminate can be used.

As illustrated in FIG. 13A and FIG. 13C, the conductive layer 112*a* and the conductive layer 106*a* preferably extend beyond an end portion of the semiconductor layer 108 in the channel width direction. In that case, as illustrated in FIG. 13C, the semiconductor layer 108 in the channel width direction is entirely covered with the conductive layer 112*a* and the conductive layer 106*a* with the insulating layer 110 and the insulating layer 103 therebetween.

The transistor 100 has a structure in which the conductive layer 106*a* functioning as a back gate is electrically connected to the conductive layer 120*b* functioning as the other of the source electrode and the drain electrode. Specifically, the conductive layer 106*a* is electrically connected to the conductive layer 120*b* through a conductive layer 112*b*.

The conductive layer 112*b* is a layer that is positioned on the same plane as the conductive layer 112*a* of the transistor 100 and formed by processing the same conductive film as the conductive layer 112*a*. The conductive layer 112*b* and the conductive layer 106*a* are electrically connected to each other in an opening portion 143 provided in the insulating layer 110 and the insulating layer 103. In addition, the conductive layer 120*b* and the conductive layer 112*b* are electrically connected to each other in an opening portion 144 provided in the insulating layer 118. This enables the structure in which one of the source and the drain of the transistor 100 and the back gate thereof are electrically connected to each other. Electrically connecting the conductive layer 120*b* and the conductive layer 106*a* to each other through the conductive layer 112*b* in the opening portions formed in the insulating layer 118, the insulating layer 110, and the insulating layer 103 as described above is preferred to directly connecting the conductive layer 120*b* and the conductive layer 106*a* to each other. The opening portions can thus have a small depth, making the steps at the opening portions small and increasing the step coverage with a conductive film covering the opening portions; thus, it is possible to prevent a defect such as a disconnected conductive film failing to cover the step.

In FIG. 13A and FIG. 13C, the conductive layer 112*a* functioning as the top gate is electrically connected to a conductive layer 106*b* functioning as a wiring. The conductive layer 112*a* and the conductive layer 106*b* are electrically connected to each other in an opening portion 142 provided in the insulating layer 110 and the insulating layer 103. The conductive layer 106*b* is preferably a layer that is positioned on the same plane as the conductive layer 106*a* and formed by processing the same conductive film as the conductive layer 106*a*.

In the case where the transistor 100 is used as the transistor 21 or the transistor 24 in the sequential circuit 30 illustrated in FIG. 5A, for example, the conductive layer 106*b* corresponds to a wiring electrically connected to the wiring 15*b*, the conductive layer 120*a* corresponds to a wiring electrically connected to the output terminal GOUT or the output terminal SROUT, and the conductive layer 120*b* corresponds to the wiring to which the potential VSS is supplied.

Here, an oxide film is preferably used for the insulating film 103*b* of the insulating layer 103 that is in contact with the semiconductor layer 108. It is particularly preferable to use a silicon oxide film or a silicon oxynitride film that can release oxygen by heating. In this case, the semiconductor layer 108 is supplied with the oxygen that is released from the insulating layer 103 by heat applied during the fabrication steps of the transistor 100 or the like, whereby oxygen vacancies in the semiconductor layer 108 can be reduced and the transistor 100 with high reliability can be accordingly obtained.

Here, treatment for supplying oxygen into the insulating film 103*b* is preferably performed after formation of the insulating film 103*b* before formation of the semiconductor layer 108. Examples of the treatment for supplying oxygen to the insulating film 103*b* include plasma treatment or heat treatment in an oxygen-containing atmosphere. Alternatively, an ion doping method, an ion implantation method, or the like may be used to supply oxygen to the insulating film 103*b*. Alternatively, as described above, a metal oxide film may be formed over the insulating film 103*b* by a sputtering method in an oxygen-containing atmosphere to supply oxygen into the insulating film 103*b*, and then the metal oxide film may be removed. Alternatively, the semiconductor layer 108 is formed by a sputtering method in an oxygen-containing atmosphere, in which case the step of forming the semiconductor layer 108 can serve as a step of supplying oxygen to the insulating film 103*b*.

Note that in the case where the insulating film 103*b* contains excess oxygen, defect states are sometimes easily generated at the interface between the semiconductor layer 108 and the insulating film 103*b* or in the vicinity thereof. In this case, upon supply of a high potential to the conductive layer 106*a* functioning as the second gate electrode, electrons that are carriers might be trapped by the defect states to cause the threshold voltage of the transistor 100 to shift in the positive direction. In the transistor 100, however, carriers are hardly induced at the interface between the semiconductor layer 108 and the insulating film 103*b* or in the vicinity thereof because a source potential (e.g., the potential VSS) is supplied to the conductive layer 106*a* that is provided through the insulating layer 103 and functions as the second gate electrode. This brings about a state where electrons are not easily trapped even in the presence of the above defect states, so that a shift of the threshold voltage in the positive direction can be suitably inhibited. Therefore, the transistor 100 can be regarded as a transistor having extremely high reliability.

Structure Example 2

Figure 14A:
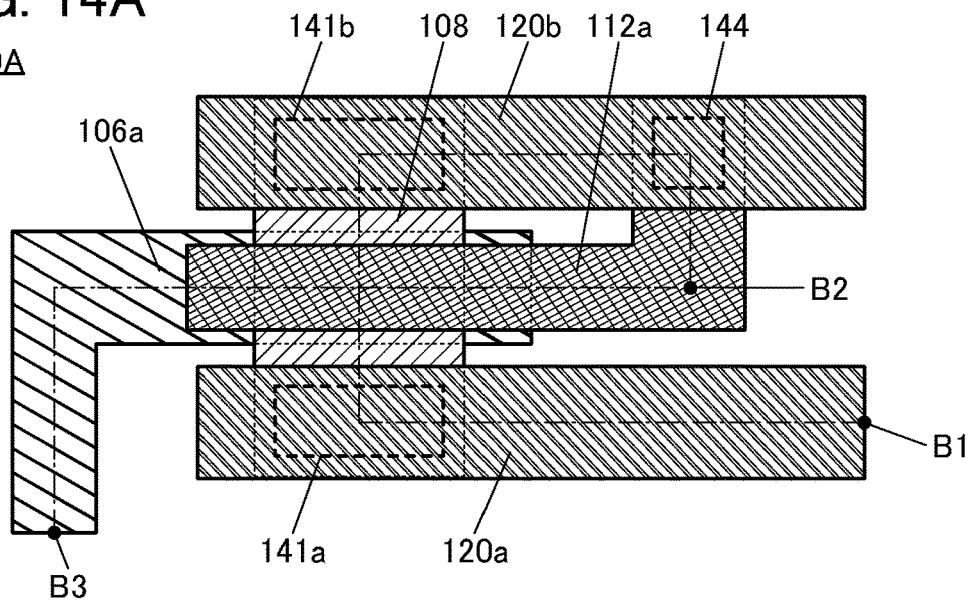
FIG. 14A to FIG. 14C are diagrams illustrating a structure example of a transistor.
Figure 14B:
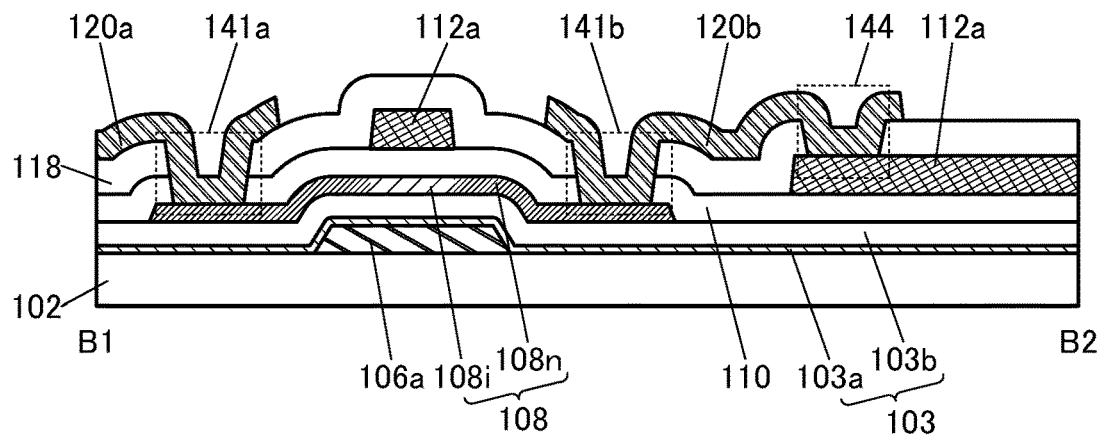
Figure 14C:
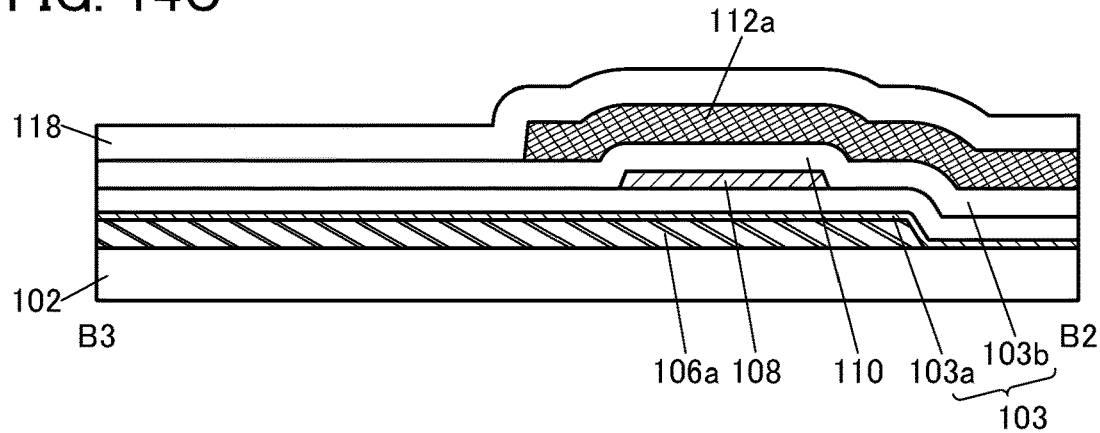

FIG. 14A is a schematic top view of a transistor 100A having a structure partly different from that of the above transistor 100. FIG. 14B corresponds to a cross-sectional view of a cross section along the dashed-dotted line B1-B2 in FIG. 14A, and FIG. 14C corresponds to a cross-sectional view of a cross section along the dashed-dotted line B3-B2 in FIG. 14A.

The transistor 100A has a structure in which the conductive layer 112a functioning as the top gate and the conductive layer 120b are electrically connected to each other. A portion common to the above transistor 100 is not described below and a portion different from the above transistor 100 is mainly described below.

The conductive layer 120b and the conductive layer 112a are electrically connected to each other in the opening portion 144 provided in the insulating layer 118.

Part of the conductive layer 106a functions as a wiring.

In the case where the transistor 100A is used as the transistor 21 or the transistor 24 in the sequential circuit 30 illustrated in FIG. 5A, for example, the conductive layer 106a corresponds to the wiring electrically connected to the wiring 15b, the conductive layer 120a corresponds to the wiring electrically connected to the output terminal GOUT or the output terminal SROUT, and the conductive layer 120b corresponds to the wiring to which the potential VSS is supplied.

In the transistor 100A, an oxide film that can release oxygen by heating is preferably used for the insulating layer 110. In this case, the semiconductor layer 108 is supplied with the oxygen that is released from the insulating layer 110 by heat applied during the fabrication steps of the transistor 100A or the like, whereby oxygen vacancies in the semiconductor layer 108 can be reduced and the transistor 100A with high reliability can be accordingly obtained.

Here, treatment for supplying oxygen into the insulating layer 110 is preferably performed after formation of the insulating layer 110 before formation of the conductive layer 112a and the like. Examples of the treatment for supplying oxygen to the insulating layer 110 include plasma treatment or heat treatment in an oxygen-containing atmosphere. Alternatively, an ion doping method, an ion implantation method, or the like may be used to supply oxygen to the insulating layer 110. Alternatively, as described above, a metal oxide film may be formed over the insulating layer 110 by a sputtering method in an oxygen-containing atmosphere to supply oxygen into the insulating layer 110. The formed metal oxide film may be removed or remain between the conductive layer 112a and the insulating layer 110.

Note that in the case where the insulating layer 110 contains excess oxygen, defect states are sometimes easily generated at the interface between the semiconductor layer 108 and the insulating layer 110 or in the vicinity thereof. Thus, the threshold voltage of the transistor 100A might be shifted in the positive direction upon supply of a high potential to the conductive layer 112a. However, a shift of the threshold voltage of the transistor 100A in the positive direction can be inhibited even in the presence of defect states at the interface between the semiconductor layer 108 and the insulating layer 110 or in the vicinity thereof because a source potential (e.g., the potential VSS) is supplied to the conductive layer 112a functioning as the first gate electrode. Therefore, the transistor 100A can be regarded as a transistor having extremely high reliability.

Structure Example 3

An example of a structure including two transistors and a capacitor is described below.

Figure 15A:
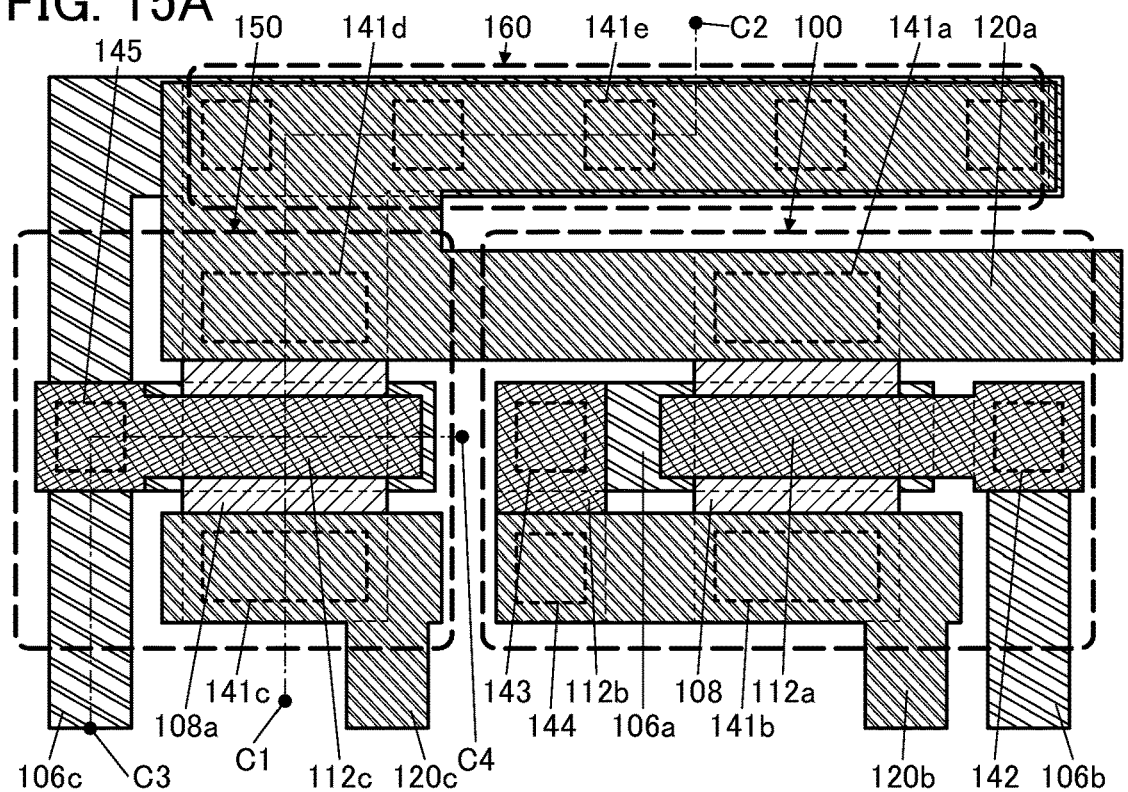
FIG. 15A to FIG. 15C are diagrams illustrating structure examples of a transistor and a capacitor.
Figure 15B:
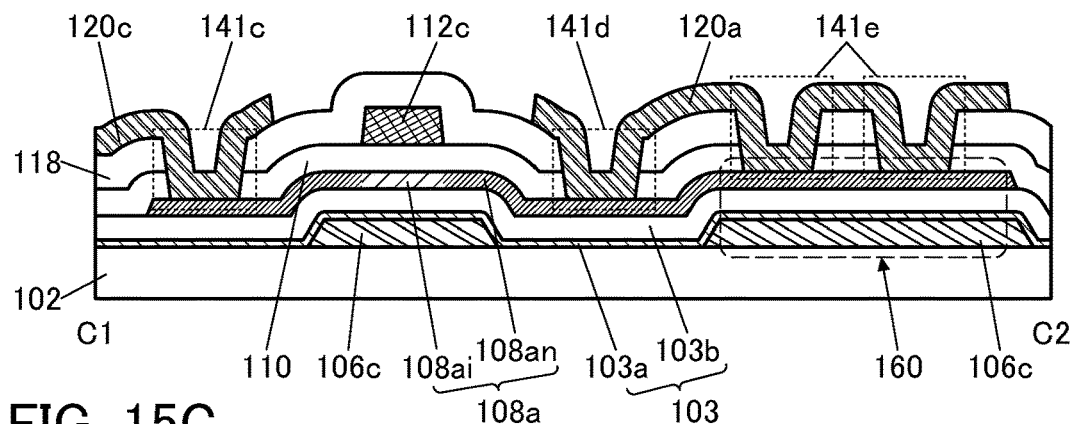
Figure 15C:
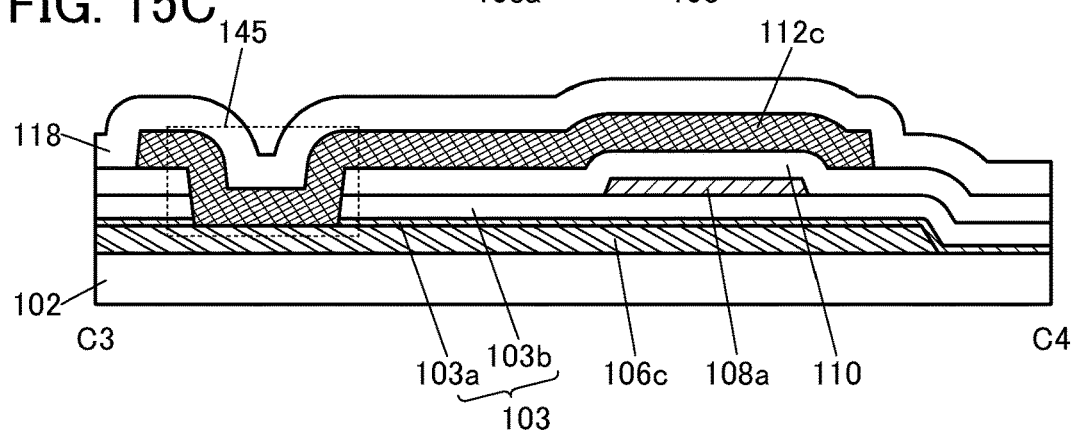

FIG. 15A is a schematic top view of a structure in which the transistor 100, a transistor 150, and a capacitor 160 are connected. FIG. 15B corresponds to a cross-sectional view of a cross section along the dashed-dotted line C1-C2 in FIG. 15A, and FIG. 15C corresponds to a cross-sectional view of a cross section along the dashed-dotted line C3-C4 in FIG. 15A. FIG. 15B includes a cross section of the transistor 150 in the channel length direction and a cross section of the capacitor 160. FIG. 15C includes a cross section of the transistor 150 in the channel width direction.

Figure 16:
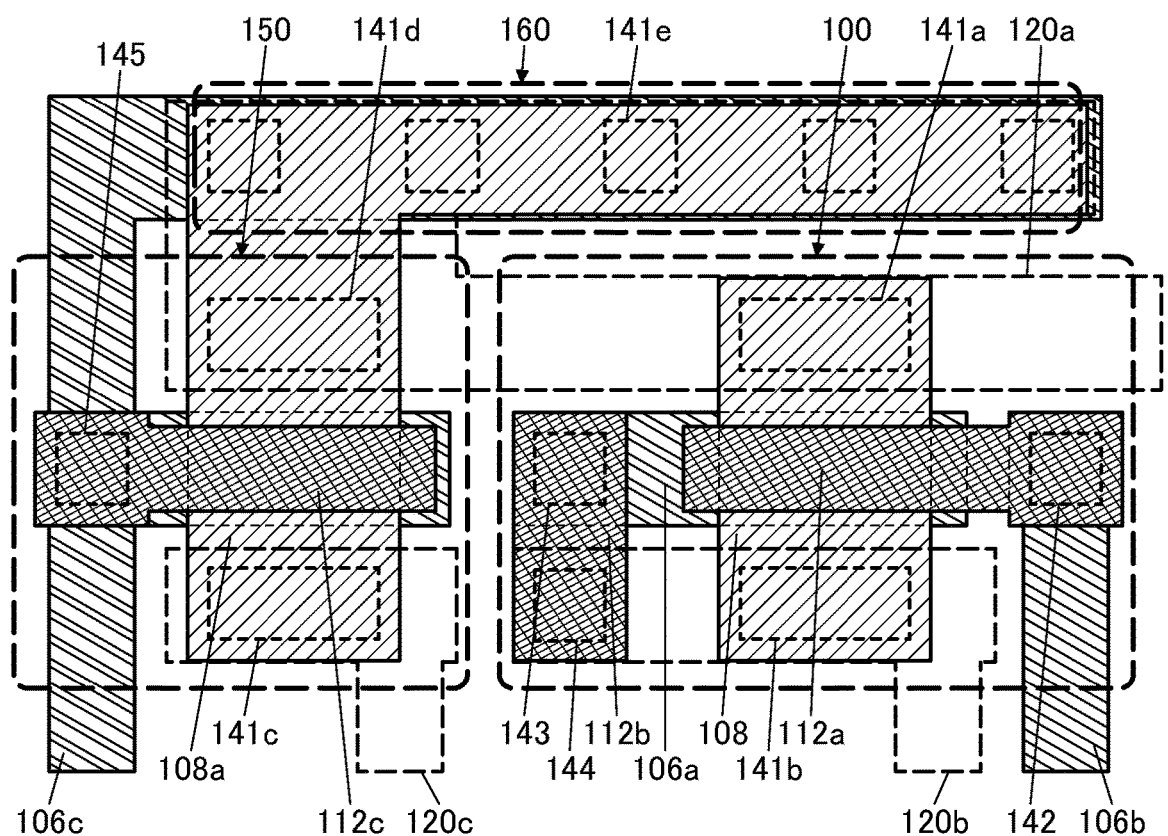
FIG. 16 is a diagram illustrating structure examples of a transistor and a capacitor.

FIG. 16 is a schematic top view from which the conductive layer 120a to a conductive layer 120c in FIG. 15A are omitted. In FIG. 16, only the outlines of the conductive layer 120a to the conductive layer 120c are indicated with dashed lines.

The transistor 100 is a transistor in which the second gate electrode (bottom gate electrode) positioned on the substrate 102 side and one of the source and the drain are electrically connected to each other, for which the structure described above with reference to FIG. 13A and the like can be referred to.

The transistor 150 is a transistor positioned on the same plane as the transistor 100 and fabricated by the same steps as the transistor 100. The transistor 150 has a structure in which a pair of gates are electrically connected to each other.

The capacitor 160 can be fabricated by the same steps as the transistor 100 and the transistor 150.

The transistor 150 includes a conductive layer 106c partly functioning as a second gate electrode, the insulating layer 103 partly functioning as a second gate insulating layer, a semiconductor layer 108a, the insulating layer 110 partly functioning as a first gate insulating layer, and a conductive layer 112c partly functioning as a first gate electrode. The semiconductor layer 108a includes a region 108ai functioning as a channel formation region and a pair of low-resistance regions 108an functioning as a source and a drain.

The transistor 150 includes the conductive layer 120c electrically connected to one of the pair of low-resistance regions 108an and the conductive layer 120a electrically connected to the other. The conductive layer 120a is electrically connected to the low-resistance region 108n (not illustrated) of the transistor 100. The conductive layer 120a and the conductive layer 120c are electrically connected to the low-resistance regions 108an respectively in an opening portion 141d and an opening portion 141c which are provided in the insulating layer 118 and the insulating layer 110.

As illustrated in FIG. 15A and FIG. 15C, the conductive layer 112c and the conductive layer 106c are electrically connected to each other in an opening portion 145 provided in the insulating layer 110 and the insulating layer 103. That is, the transistor 150 has the structure in which the pair of gate electrodes sandwiching the semiconductor layer 108a are electrically connected to each other.

With such a structure, the semiconductor layer 108a can be electrically surrounded by electric fields generated by the pair of gate electrodes. At this time, specifically, the same potential is supplied to the conductive layer 106c and the conductive layer 112c. In that case, electric fields for inducing a channel can be effectively applied to the semiconductor layer 108a, whereby the on-state current of the transistor 150 can be increased. Thus, the transistor 150 can also be miniaturized.

Note that a structure in which the conductive layer 112c and the conductive layer 106c are not connected to each other may be employed. In that case, a constant potential may be supplied to one of the pair of gate electrodes, and a signal for driving the transistor 150 may be supplied to the other. In this case, the potential supplied to the one of the gate electrodes enables control of the threshold voltage at the time of driving the transistor 150 with the other of the gate electrodes.

The capacitor 160 is constituted by part of the semiconductor layer 108a (part of the low-resistance region 108an), part of the insulating layer 103, and part of the conductive layer 106c. In the capacitor 160, the insulating layer 103 functions as a dielectric layer and the conductive layer 106c and the semiconductor layer 108a function as a pair of electrodes.

A plurality of opening portions 141e are provided in the insulating layer 118 and the insulating layer 110 in regions where the low-resistance region 108an and the conductive layer 106c overlap with each other, and the conductive layer 120a and the low-resistance region 108an are electrically connected to each other in the opening portions 141e. Here, the conductive layer 120a has not only a function of one of a source electrode and a drain electrode of the transistor 150 but also a function of an auxiliary wiring (auxiliary electrode) of the capacitor 160. Furthermore, the contact between the conductive layer 120a and the low-resistance region 108an at multiple portions is preferable because it can reduce the contact resistance therebetween and can reduce the parasitic resistance of the capacitor 160. Moreover, in the structure in which the conductive layer 106c and the low-resistance region 108an are used as the pair of electrodes of the capacitor 160, the thickness of the insulating layer functioning as the dielectric layer can be smaller and the capacitance can be higher than in a structure in which the conductive layer 106c and the conductive layer 112c are used as the pair of electrodes of the capacitor 160 or a structure in which the conductive layer 106c and the conductive layer 120a are used as the pair of electrodes of the capacitor 160.

As illustrated in FIG. 15A and FIG. 16, the conductive layer 120a can serve as one of the source electrode and the drain electrode of the transistor 100, one of the source electrode and the drain electrode of the transistor 150, and one electrode of the capacitor 160. The semiconductor layer 108a having an island-like shape can serve as part of the transistor 150 and part of the capacitor 160. Such a structure can reduce the area occupied by the circuit illustrated in FIG. 15A and FIG. 16.

The structure illustrated in FIG. 15A and the like can be used in part of the above sequential circuit. For example, in the case where the structure is used in the sequential circuit 30 illustrated in FIG. 5B, the transistor 100 can be used as the transistor 21 or the transistor 24, the transistor 150 can be used as the transistor 22 or the transistor 25, and the capacitor 160 can be used as the capacitor C1 or the capacitor C3. In this case, the conductive layer 106b corresponds to the wiring electrically connected to the wiring 15b, the conductive layer 120a corresponds to the wiring electrically connected to the output terminal GOUT or the output terminal SROUT, the conductive layer 120b corresponds to the wiring to which the potential VSS is supplied, the conductive layer 106c corresponds to the wiring electrically connected to the wiring 15a through the transistor 23 or the transistor 26, and the conductive layer 120c corresponds to the wiring to which the signal CLK1 or the signal PWC is supplied.

The above is the description of structure examples of the transistors.

Fabrication Method Example

An example of a method for fabricating a transistor of one embodiment of the present invention is described below. Here, description is made giving, as an example, the transistor 100 shown in Structure example 1 among the above transistor structure examples and FIG. 13A to FIG. 13C.

Note that thin films that constitute the semiconductor device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

The thin films that constitute the semiconductor device (insulating films, semiconductor films, conductive films, and the like) can be formed by a method such as spin coating, dipping, spray coating, ink jetting, dispensing, screen printing, offset printing, a doctor knife, slit coating, roll coating, curtain coating, or knife coating.

When the thin films that constitute the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a film formation method using a blocking mask such as a metal mask.

There are two typical examples of a photolithography method. In one of the methods, a resist mask is formed over a thin film that is to be processed, the thin film is processed by etching or the like, and then the resist mask is removed. In the other method, after a photosensitive thin film is formed, exposure and development are performed, so that the thin film is processed into a desired shape.

As light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light, X-rays, or the like may be used. Furthermore, instead of the light used for the exposure, an electron beam can also be used. Extreme ultra-violet light, X-rays, or an electron beam is preferably used to enable extremely minute processing. Note that no photomask is needed in the case where exposure is performed by scanning of a beam such as an electron beam.

For etching of the thin film, a dry etching method, a wet etching method, a sandblasting method, or the like can be used.

FIG. 17A to FIG. 18D each show a cross-sectional view at a stage in the fabrication process of the transistor 100. In FIG. 17A to FIG. 18D, a cross section of the transistor 100 in the channel length direction is shown on the left side of the dashed-dotted line, and a cross section of the transistor 100 in the channel width direction is shown on the right side of the dashed-dotted line.

[Formation of Conductive Layer 106a]

Figure 17A:
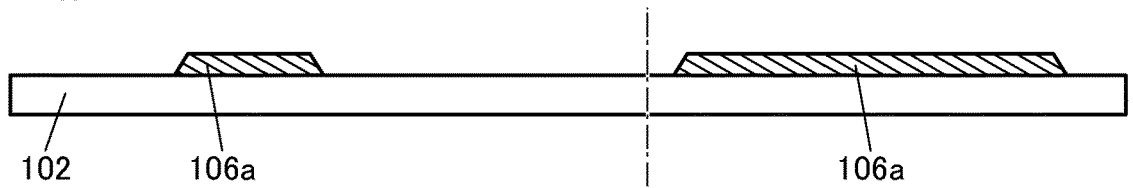
FIG. 17A to FIG. 17F are diagrams illustrating a method for fabricating a transistor.

A conductive film is formed over the substrate 102 and processed by etching, whereby the conductive layer 106a functioning as the second gate electrode is formed (FIG. 17A).

At this time, as illustrated in FIG. 17A, the conductive layer 106a is preferably processed to have an end portion with a tapered shape. This can improve step coverage with the insulating layer 103 to be formed in the next step.

When a conductive film containing copper is used as the conductive film to be the conductive layer 106a, wiring resistance can be reduced. A conductive film containing copper is preferably used for the conductive layer 106a in the case where, for example, the transistor 100 is used for a large-size display device, a high-resolution display device, or the like. Even in the case where a conductive film containing copper is used for the conductive layer 106a, diffusion of a copper element to the semiconductor layer 108 side can be suppressed by the insulating layer 103, whereby a highly reliable transistor can be obtained.

[Formation of Insulating Layer 103]

Figure 17B:
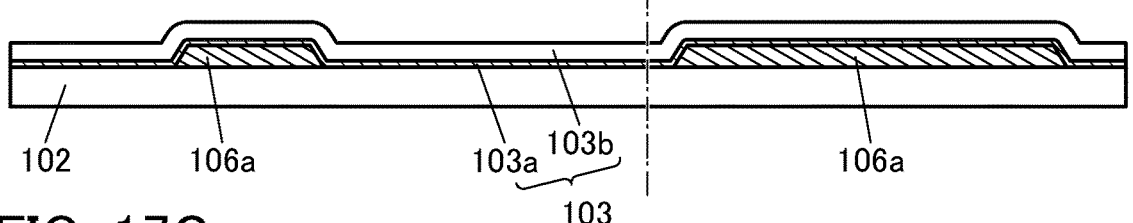

Next, the insulating layer 103 is formed to cover the substrate 102 and the conductive layer 106a (FIG. 17B). The insulating layer 103 can be formed by a PECVD method, an ALD method, a sputtering method, or the like.

Here, the insulating layer 103 is formed by stacking the insulating film 103a and the insulating film 103b. Specifically, each of the insulating films included in the insulating layer 103 is preferably formed by a PECVD method.

As the insulating film 103a, an insulating film containing nitrogen, such as a silicon nitride film, a silicon nitride oxide film, an aluminum nitride film, or a hafnium nitride film, can be used, for example. In particular, a dense silicon nitride film formed with a PECVD apparatus is preferably used as the insulating film 103a. With the use of such an insulating film containing nitrogen, diffusion of impurities from the formation surface side can be suitably inhibited even when the thickness of the insulating film is small.

When an insulating film containing nitrogen is used as the insulating film 103a, a reduction in the amount of oxygen contained in the insulating film 103b and oxidation of the conductive layer 106a or the like due to diffusion of oxygen in the insulating film 103b to the conductive layer 106a or the like can be inhibited, for example.

Note that in this specification, an oxynitride refers to a material that contains more oxygen than nitrogen in its composition, and a nitride oxide refers to a material that contains more nitrogen than oxygen in its composition. For example, "silicon oxynitride" refers to a material that contains more oxygen than nitrogen in its composition. "Silicon nitride oxide" refers to a material that contains more nitrogen than oxygen in its composition.

In the case where an oxynitride and a nitride oxide which have the same elements are described in this specification, the oxynitride includes a material that has a higher oxygen content and/or a lower nitrogen content than the nitride oxide. Similarly, the nitride oxide includes a material that has a lower oxygen content and/or a higher nitrogen content than the oxynitride. For example, in the case where silicon oxynitride and silicon nitride oxide are described, the silicon oxynitride includes a material that has a higher oxygen content and a lower nitrogen content than the silicon nitride oxide. Similarly, the silicon nitride oxide includes a material that has a lower oxygen content and a higher nitrogen content than the silicon oxynitride.

The insulating film 103b in contact with the semiconductor layer 108 is preferably formed using an insulating film containing an oxide. It is particularly preferable that an oxide film be used as the insulating film 103b. As the insulating film 103b, it is preferable to use a dense insulating film in which impurities such as water are less likely to be adsorbed on the surface. In addition, it is preferable to use an insulating film which includes as few defects as possible and in which an impurity such as water or hydrogen is reduced.

As the insulating film 103b, for example, an insulating film including one or more kinds of a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. It is particularly preferable to use a silicon oxide film or a silicon oxynitride film as the insulating film 103b.

The insulating film 103b preferably includes a region containing oxygen in excess of that in the stoichiometric composition. In other words, the insulating film 103b is preferably an insulating film capable of releasing oxygen by heating. It is also possible to supply oxygen into the insulating film 103b by forming the insulating film 103b in an oxygen atmosphere, performing heat treatment on the formed insulating film 103b in an oxygen atmosphere, performing plasma treatment or the like on the formed insulating film 103b in an oxygen atmosphere, or forming an oxide film over the insulating film 103b in an oxygen atmosphere, for example. Note that an oxidizing gas (e.g., dinitrogen monoxide or ozone) may be used instead of oxygen or in addition to oxygen in each of the above treatments for supplying oxygen. Alternatively, heat treatment may be performed after an insulating film capable of releasing oxygen by heating is formed over the insulating film 103b, so that oxygen may be supplied from the insulating film to the insulating film 103b. Alternatively, oxygen may be supplied to the insulating film 103b by a plasma ion doping method, an ion implantation method, or the like.

Here, the insulating film 103b is preferably formed to be thicker than the insulating film 103a. This increases the amount of oxygen that can be released from the insulating film 103b by heating and reduces the amount of hydrogen released from the insulating film 103a. Accordingly, a large amount of oxygen can be supplied to the semiconductor layer 108 formed later while supply of hydrogen thereto is inhibited, so that the transistor can have high reliability. The thickness of the insulating film 103b is preferably greater than or equal to twice and less than or equal to 50 times, further preferably greater than or equal to three times and less than or equal to 30 times, still further preferably greater than or equal to five times and less than or equal to 20 times, yet still further preferably greater than or equal to seven times and less than or equal to 15 times, typically approximately 10 times the thickness of the insulating film 103a.

Oxygen can be supplied into the insulating film 103b during formation of a metal oxide film to be the semiconductor layer 108 by a sputtering method in an oxygen-containing atmosphere. The formation of the metal oxide film to be the semiconductor layer may be followed by heat treatment. The heat treatment enables oxygen in the insulating film 103b to be supplied to the metal oxide film more effectively and can reduce oxygen vacancies in the metal oxide film.

[Formation of Semiconductor Layer 108]

Figure 17C:
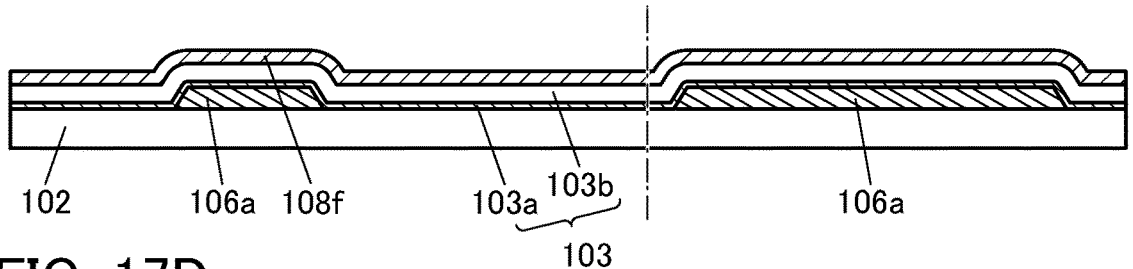

Next, a metal oxide film 108f is formed over the insulating layer 103 (FIG. 17C).

The metal oxide film 108f is preferably formed by a sputtering method using a metal oxide target.

The metal oxide film 108f is preferably a dense film with as few defects as possible. The metal oxide film 108f is preferably a highly purified film in which an impurity such as hydrogen or water is reduced as much as possible. It is particularly preferable to use a metal oxide film having crystallinity as the metal oxide film 108f.

In forming the metal oxide film 108f, an oxygen gas and an inert gas (e.g., a helium gas, an argon gas, or a xenon gas) may be mixed. Note that when the proportion of an oxygen gas in the whole film formation gas (hereinafter, also referred to as an oxygen flow rate ratio) at the time of forming the metal oxide film is higher, the crystallinity of the metal oxide film can be higher and a transistor with higher reliability can be obtained. By contrast, when the oxygen flow rate ratio is lower, the crystallinity of the metal oxide film is lower and a transistor with a higher on-state current can be obtained.

In forming the metal oxide film 108f, a higher substrate temperature can lead to a higher density and higher crystallinity of the formed metal oxide film. By contrast, a lower substrate temperature can lead to lower crystallinity and higher electric conductivity of the formed metal oxide film.

The metal oxide film 108f is formed under the film formation conditions where a substrate temperature is higher than or equal to room temperature and lower than or equal to 250° C., preferably higher than or equal to room temperature and lower than or equal to 200° C., further preferably higher than or equal to room temperature and lower than or equal to 140° C. For example, the substrate temperature is preferably higher than or equal to room temperature and lower than 140° C., in which case high productivity is achieved. Furthermore, when the metal oxide film is formed with the substrate temperature set at room temperature or without heating the substrate intentionally, the crystallinity can be made low.

Here, forming the metal oxide film 108f in an oxygen-containing atmosphere allows oxygen to be supplied to the insulating layer 103 during the formation of the metal oxide film 108f. It is particularly preferable that the metal oxide film 108f be formed by a sputtering method in an oxygen-containing atmosphere.

During the formation of the metal oxide film 108f, the amount of oxygen supplied into the insulating layer 103 can be increased with a higher proportion of the oxygen flow rate to the total flow rate of the film formation gas introduced into a film formation chamber of a film formation apparatus (a higher oxygen flow rate ratio) or with a higher oxygen partial pressure in the film formation chamber. The oxygen flow rate ratio or oxygen partial pressure during the formation of the metal oxide film 108f affects the crystallinity of the metal oxide film 108f or the electrical characteristics of the transistor; thus, the oxygen flow rate ratio or oxygen partial pressure can be determined in accordance with the required electrical characteristics of the transistor or the like. For example, the oxygen flow rate ratio or oxygen partial pressure during the formation of the metal oxide film 108f can be determined as appropriate to be within the range of 10% to 100%, preferably the range of 20% to 100%.

In addition, during the formation of the metal oxide film 108f by a sputtering method in an oxygen-containing atmosphere, a surface of the insulating layer 103 is covered with the metal oxide film 108f that is being formed. Accordingly, part of oxygen supplied to the insulating layer 103 at the time of the formation of the metal oxide film 108f can be prevented from being released to the outside during the formation. As a result, an extremely large amount of oxygen can be enclosed in the insulating layer 103.

It is preferable to perform at least one of treatment for desorbing water, hydrogen, an organic substance, or the like adsorbed onto the surface of the insulating layer 103 and treatment for supplying oxygen into the insulating layer 103 before the formation of the metal oxide film 108f. For example, heat treatment can be performed at a temperature higher than or equal to 70° C. and lower than or equal to 200° C. in a reduced-pressure atmosphere. The heat treatment can also be performed in the film formation apparatus for the metal oxide film 108f. Alternatively, plasma treatment may be performed in an oxygen-containing atmosphere. Alternatively, oxygen may be supplied to the insulating layer 103 by plasma treatment in an atmosphere containing an oxidizing gas such as dinitrogen monoxide ($N_2O$). Performing plasma treatment containing a dinitrogen monoxide gas can supply oxygen to the insulating layer 103 while suitably removing an organic substance on the surface of the insulating layer 103. It is preferable that the metal oxide film 108f be formed successively after such treatment, without exposure of the surface of the insulating layer 103 to the air.

Note that in the case where the semiconductor layer 108 has a stacked-layer structure in which a plurality of metal oxide films are stacked, it is preferable that after the metal oxide film formed earlier is formed, the next metal oxide film be formed successively without exposure of a surface of the metal oxide film formed earlier to the air.

In the case where a plurality of metal oxide films are stacked, a stacked-layer film in which metal oxide films having different compositions are stacked using sputtering targets with different compositions can be formed. Alternatively, metal oxide films can be stacked using the same sputtering target under different film formation conditions. Examples of the film formation conditions include the kind of a film formation gas, a flow rate of a film formation gas, a flow rate ratio of a film formation gas, pressure in a film formation chamber, a substrate temperature (stage temperature), and power.

Note that when a metal oxide film is formed by a sputtering method, the film formation rate can be increased more with higher power. The film formation rate can be decreased more with lower power, and an in-plane variation of a film thickness, a film quality, or the like can be reduced. Thus, when a metal oxide film formed under the high-power condition and a metal oxide film formed under the lower-power condition using the same sputtering target are stacked, an in-plane variation can be reduced and the film formation rate can be increased.

For example, it is possible that a metal oxide film is formed first at a low power over the insulating layer 103 and then a metal oxide film is formed at a higher power. Alternatively, it is possible that a metal oxide film is formed first at a high power and then a metal oxide film is formed at a lower power. Alternatively, film formation at a low power and film formation at a high power may be repeated.

A higher-density (denser) metal oxide film can be formed at a higher power in film formation. By contrast, a lower-density metal oxide film can be obtained at a lower power in film formation. A metal oxide film formed at a lower power has a feature that a larger amount of oxygen can be supplied to layers positioned under the metal oxide film in film formation.

For example, the semiconductor layer 108 can have a stacked-layer structure of a metal oxide film formed at a low power and a metal oxide film formed at a high power in this order from the insulating layer 103 side. Thus, a large amount of oxygen can be supplied to the insulating layer 103. The density of the upper side of the semiconductor layer 108 can be high; thus, the semiconductor layer 108 is unlikely to be etched in the later formation of an opening portion 141a and an opening portion 141b, for example, so that the fabrication yield can be increased.

Alternatively, the semiconductor layer 108 can have a stacked-layer structure of a metal oxide film formed at a high power and a metal oxide film formed at a low power in this order from the insulating layer 103 side. The film formation at a high power can inhibit entry of impurities remaining in the film formation chamber into a metal oxide film. In particular, a high power at the initial stage of the film formation treatment enables a more effective reduction of impurities in a metal oxide film. Thus, a metal oxide film formed at a high power is preferably used on the insulating layer 103 side. When being formed at a low power over a dense metal oxide film formed at a high power, a second metal oxide film is likely to be dense. In particular, when a dense film having high crystallinity is formed as a first layer, a second layer can have high crystallinity by reflecting the crystallinity of the first layer. Formation of the second metal oxide film at a low power allows oxygen to be directly supplied to the first metal oxide film, which can reduce the oxygen vacancies in the film during the formation of the semiconductor layer 108.

Figure 17D:
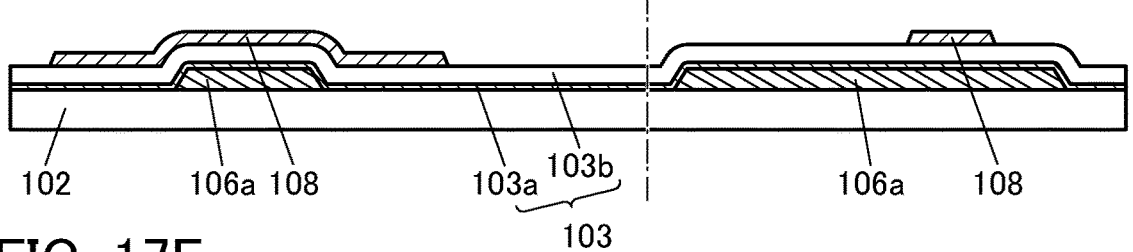

Next, the metal oxide film 108f is partly etched, so that the island-shaped semiconductor layer 108 is formed (FIG. 17D).

For processing of the metal oxide film 108f, either one or both of a wet etching method and a dry etching method are used. At this time, part of the insulating layer 103 that does not overlap with the semiconductor layer 108 is etched and thinned in some cases. For example, in some cases, the insulating film 103b of the insulating layer 103 is removed by etching and a surface of the insulating film 103a is exposed.

Here, it is preferable that heat treatment be performed after the metal oxide film 108f is formed or after the metal oxide film 108f is processed into the semiconductor layer 108. By the heat treatment, hydrogen or water contained in the metal oxide film 108f or the semiconductor layer 108 or adsorbed on a surface of the metal oxide film 108f or the semiconductor layer 108 can be removed. Furthermore, the film quality of the metal oxide film 108f or the semiconductor layer 108 is improved (e.g., the number of defects is reduced or crystallinity is increased) by the heat treatment in some cases.

Moreover, by the heat treatment, oxygen that has been supplied to the insulating layer 103 at the time of the formation of the metal oxide film 108f can be diffused throughout the insulating layer 103. For example, the supplied oxygen immediately after the formation of the metal oxide film 108f exists in a large amount in an upper portion of the insulating layer 103, and oxygen might be readily released in some cases. In this case, a large amount of oxygen might be released from an exposed surface of the insulating layer 103 in a later-described step of forming the insulating layer 110 or the like. Thus, when the heat treatment diffuses oxygen throughout the insulating layer 103, a state in which a large amount of oxygen is enclosed in the insulating layer 103 can be maintained even after the formation of the insulating layer 110.

The heat treatment also enables supply of oxygen from the insulating layer 103 to the metal oxide film 108f or the semiconductor layer 108. Here, the heat treatment is preferably performed before the processing into the semiconductor layer 108 to allow the oxygen released from the insulating layer 103 to be efficiently supplied to the metal oxide film 108f.

In addition, the heat treatment enables release of water, hydrogen, or the like from the insulating layer 103. Here, performing the heat treatment after the processing into the semiconductor layer 108 facilitates release of water, hydrogen, or the like from the portion where the insulating layer 103 is exposed, which can prevent water, hydrogen, or the like released from the insulating layer 103 from being supplied into the semiconductor layer 108. Performing the heat treatment after the processing into the semiconductor layer 108 is preferred in the case where the content of water, hydrogen, or the like in the insulating layer 103 is high.

The temperature of the heat treatment can be typically higher than or equal to 150° C. and lower than the strain point of the substrate, higher than or equal to 200° C. and lower than or equal to 500° C., higher than or equal to 250° C. and lower than or equal to 450° C., or higher than or equal to 300° C. and lower than or equal to 450° C.

The heat treatment can be performed in an atmosphere containing a rare gas or nitrogen. Alternatively, heating may be performed in the atmosphere, and then heating may be performed in an oxygen-containing atmosphere. Alternatively, heating may be performed in a dry air atmosphere. It is preferable that the atmosphere of the above heat treatment contain hydrogen, water, or the like as little as possible. An electric furnace, an RTA (Rapid Thermal Anneal) apparatus, or the like can be used for the heat treatment. The use of the RTA apparatus can shorten the heat treatment time.

Note that the heat treatment is not necessarily performed. The heat treatment is not necessarily performed in this step, and heat treatment performed in a later step may also serve as the heat treatment in this step. In some cases, treatment at a high temperature (e.g., film formation step) or the like in a later step can serve as the heat treatment in this step.

[Formation of Insulating Layer 110]

Figure 17E:
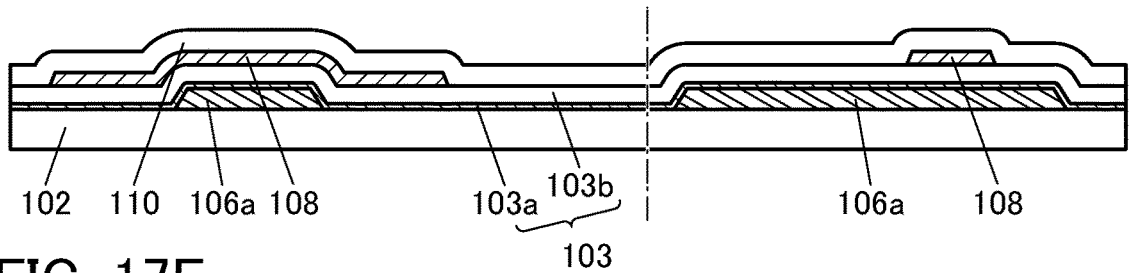

Next, the insulating layer 110 is formed to cover the insulating layer 103 and the semiconductor layer 108 (FIG. 17E).

The insulating film included in the insulating layer 110 is preferably formed by a PECVD method.

For the insulating layer 110, for example, an insulating layer including one or more kinds of a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used.

The insulating layer 110 that is in contact with the semiconductor layer 108 preferably has a stacked-layer structure of oxide insulating films. The insulating layer 110 further preferably includes a region containing oxygen in excess of that in the stoichiometric composition. In other words, the insulating layer 110 preferably includes an insulating film capable of releasing oxygen.

Here, it is preferable that a stacked-layer film in which three insulating films whose film formation conditions are different from each other are stacked be used for the insulating layer 110. It is particularly preferable to use a silicon oxide film or a silicon oxynitride film as each of the three insulating films.

The first insulating film is formed over the semiconductor layer 108, and thus is preferably formed under conditions where the semiconductor layer 108 is damaged as little as possible. For example, the first insulating film can be formed under conditions where the film formation rate is sufficiently lower than that for the other films. For example, in the case where a silicon oxynitride film is formed as the first insulating film by a plasma CVD method, forming the silicon oxynitride film under the low-power conditions, reducing the flow rate of a deposition gas containing silicon such as silane or disilane in a film formation gas, or the like can lower the film formation rate and significantly lessen the damage to the semiconductor layer 108.

The second insulating film is preferably formed under conditions where the film formation rate is higher than that of the first insulating film. In this case, the productivity can be improved.

The third insulating film is preferably an extremely dense film whose surface has few defects and on the surface of which an impurity contained in the air such as water is not easily adsorbed. For example, like the first insulating film, the third insulating film can be formed at a sufficiently low film formation rate.

It is preferable to perform plasma treatment on a surface of the semiconductor layer 108 before formation of the insulating layer 110. By the plasma treatment, an impurity adsorbed onto the surface of the semiconductor layer 108, such as water, can be removed. Therefore, impurities at the interface between the semiconductor layer 108 and the insulating layer 110 can be reduced, enabling the transistor to have high reliability. Performing the plasma treatment in this manner is particularly suitable in the case where the surface of the semiconductor layer 108 is exposed to the air after the formation of the semiconductor layer 108 before the formation of the insulating layer 110. For example, the plasma treatment can be performed in an atmosphere containing one or more of oxygen, ozone, nitrogen, dinitrogen monoxide, argon, and the like. The plasma treatment and the formation of the insulating layer 110 are preferably performed successively without exposure to the air.

After the insulating layer 110 is formed, heat treatment is preferably performed. By the heat treatment, hydrogen or water contained in the insulating layer 110 or adsorbed on its surface can be removed. At the same time, the number of defects in the insulating layer 110 can be reduced.

By the heat treatment, oxygen contained in the insulating layer 103 can be released and supplied into the semiconductor layer 108. During the formation of the insulating layer 110, for example, the semiconductor layer 108 might be damaged and defects such as oxygen vacancies might be generated in the semiconductor layer 108. Therefore, owing to the oxygen supplied from the insulating layer 103 by the heat treatment performed after the formation of the insulating layer 110, the oxygen vacancies in the semiconductor layer 108 can be reduced and the transistor can have high reliability.

For the conditions of the heat treatment, the above description can be referred to.

Note that the heat treatment is not necessarily performed. The heat treatment is not necessarily performed in this step, and heat treatment performed in a later step may also serve as the heat treatment in this step. In some cases, treatment at a high temperature (e.g., film formation step) or the like in a later step can serve as the heat treatment in this step.

[Formation of Opening Portion 143]

Next, the insulating layer 110 and the insulating layer 103 are partly etched, whereby the opening portion 143 that reaches the conductive layer 106a is formed.

[Formation of Conductive Layer 112a and Conductive Layer 112b]

Figure 17F:
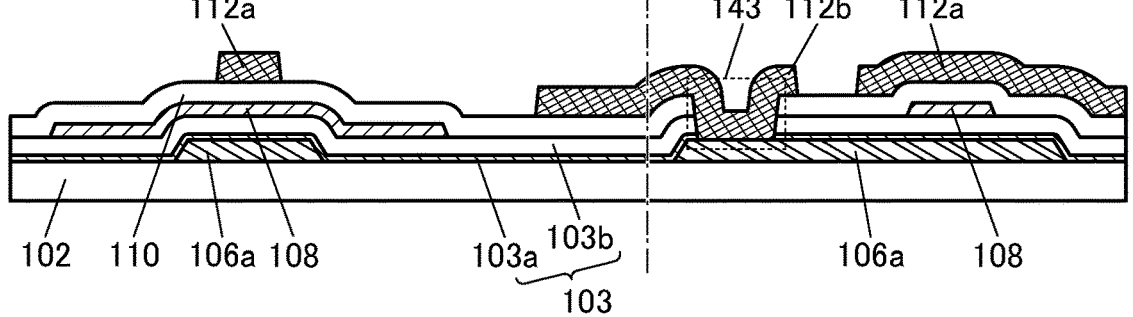

Next, a conductive film is formed over the insulating layer 110 to cover the opening portion 143, and the conductive film is processed into a desired shape, so that the conductive layer 112a and the conductive layer 112b are formed (FIG. 17F).

A low-resistance metal or alloy material is preferably used for the conductive layer 112a and the conductive layer 112b. It is preferable that the conductive layer 112a and the conductive layer 112b be formed using a material from which hydrogen is less likely to be released and in which hydrogen is less likely to be diffused. Furthermore, a material that is less likely to be oxidized is preferably used for the conductive layer 112a and the conductive layer 112b.

For example, the conductive layer 112a and the conductive layer 112b are preferably formed by a sputtering method using a sputtering target containing a metal or an alloy.

For example, the conductive layer 112a and the conductive layer 112b are preferably a stacked-layer film including a low-resistance conductive film and a conductive film which is less likely to be oxidized and in which hydrogen is less likely to be diffused.

As described above, the insulating layer 110 is not etched and covers the top surface and the side surface of the semiconductor layer 108 and the insulating layer 103, preventing the semiconductor layer 108, the insulating layer 103, or the like from being partly etched and thinned in etching the conductive film to be the conductive layer 112a and the like.

Note that part of the insulating layer 110 is sometimes etched and thinned during the processing into the conductive layer 112a and the conductive layer 112b.

In the case where the opening portion 143 illustrated in FIG. 13A to FIG. 13C is formed, first, the insulating layer 110 and the insulating layer 103 are partly etched to form the opening portion 143 reaching the conductive layer 106a before formation of the conductive film to be the conductive layer 112a and the conductive layer 112b. Then, the conductive film to be the conductive layer 112a and the conductive layer 112b is formed over the insulating layer 110 to cover the opening portion 143, and the conductive film is processed, whereby the conductive layer 112a and the conductive layer 112b are formed. In this manner, the conductive layer 112b that is electrically connected to the conductive layer 106a in the opening portion 143 can be formed.

[Treatment for Supplying Impurity Element]

Figure 18A:
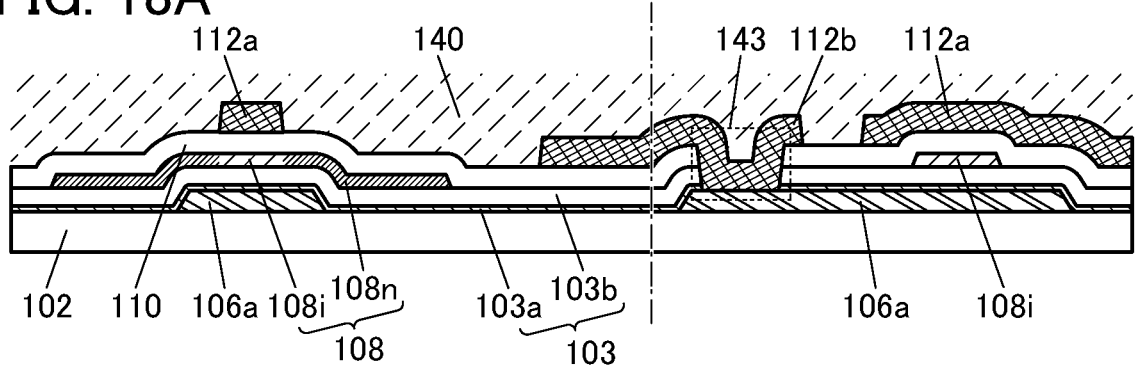
FIG. 18A to FIG. 18D are diagrams illustrating a method for fabricating a transistor.

Next, treatment for supplying ("adding" or "injecting") an impurity element to the semiconductor layer 108 through the insulating layer 110 is performed with the use of the conductive layer 112a as a mask (FIG. 18A). Thus, the low-resistance region 108n can be formed in a region of the semiconductor layer 108 that is not covered with the conductive layer 112a. At this time, the conditions of the treatment for supplying the impurity element are preferably determined in consideration of the material, thickness, or the like of the conductive layer 112a serving as the mask and the like so that the impurity element is supplied as little as possible to the region of the semiconductor layer 108 that overlaps with the conductive layer 112a. In this manner, a channel formation region with a sufficiently reduced impurity concentration can be formed in the region of the semiconductor layer 108 that overlaps with the conductive layer 112a.

Examples of the treatment for supplying the impurity element include plasma treatment in an atmosphere containing the impurity element to be supplied. For example, performing plasma treatment in an atmosphere containing a hydrogen gas or an ammonia gas can supply hydrogen to the semiconductor layer 108 through the insulating layer 110. It is particularly preferable to perform plasma treatment in an atmosphere containing a hydrogen gas.

FIG. 18A schematically illustrates a state where an impurity is supplied to the semiconductor layer 108 through the insulating layer 110 by exposure to plasma 140.

A dry etching apparatus, an ashing apparatus, a plasma CVD apparatus, a high-density plasma CVD apparatus, or the like can be used as an apparatus that can generate the plasma 140.

Here, it is preferable that after the plasma treatment is performed, the insulating layer 118 be formed successively without exposure to the air. At this time, the plasma treatment and the film formation treatment are preferably successively performed in the same film formation chamber of the film formation apparatus for forming the insulating layer 118. For example, the following process can be employed: a treatment gas containing a hydrogen gas is supplied into the film formation chamber and the plasma treatment is performed; then, a film formation gas is supplied into the film formation chamber and the insulating layer 118 is formed. In this case, the plasma treatment and the film formation treatment are preferably performed under the conditions at the same substrate temperature (the temperature of the stage holding the substrate).

In one embodiment of the present invention, the impurity element can be supplied to the semiconductor layer 108 through the insulating layer 110. Thus, even in the case where the semiconductor layer 108 has crystallinity, damage to the semiconductor layer 108 at the time of supplying the impurity element can be reduced, so that degradation of the crystallinity can be inhibited. Therefore, this is suitable for the case where a reduction in crystallinity would increase electrical resistance.

Alternatively, a plasma ion doping method or an ion implantation method can be suitably used for the treatment for supplying the impurity element. In these methods, the concentration profile in the depth direction can be controlled with high accuracy by the acceleration voltage and the dosage of ions, or the like. The use of a plasma ion doping method can increase productivity. In addition, the use of an ion implantation method with mass separation can increase the purity of the impurity element to be supplied.

In the treatment for supplying the impurity element, treatment conditions are preferably controlled such that the concentration is the highest at an interface between the semiconductor layer 108 and the insulating layer 110, a portion in the semiconductor layer 108 near the interface, or a portion in the insulating layer 110 near the interface. In this case, the impurity element at an optimal concentration can be supplied to both the semiconductor layer 108 and the insulating layer 110 in one treatment.

Examples of the impurity element include hydrogen, boron, carbon, nitrogen, fluorine, phosphorus, sulfur, arsenic, aluminum, magnesium, silicon, and a rare gas. Note that typical examples of a rare gas include helium, neon, argon, krypton, and xenon. It is particularly preferable to use boron, phosphorus, aluminum, magnesium, or silicon.

As a source gas of the impurity element, a gas containing any of the above impurity elements can be used. In the case where boron is supplied, typically, a $B_2H_6$ gas, a $BF_3$ gas, or the like can be used. In the case where phosphorus is supplied, typically, a $PH_3$ gas can be used. A mixed gas in which any of these source gases is diluted with a rare gas may be used.

Besides, any of $CH_4$, $N_2$, $NH_3$, $AlH_3$, $AlCl_3$, $SiH_4$, $Si_2H_6$, $F_2$, HF, $H_2$, $(C_5H_5)_2Mg$, a rare gas, and the like can be used as the source gas. An ion source is not limited to a gas, and a solid or a liquid that is vaporized by heating may be used.

Addition of the impurity element can be controlled by setting the conditions such as the acceleration voltage and the dosage in consideration of the compositions, densities, thicknesses, and the like of the insulating layer 110 and the semiconductor layer 108.

[Formation of Insulating Layer 118]

Figure 18B:
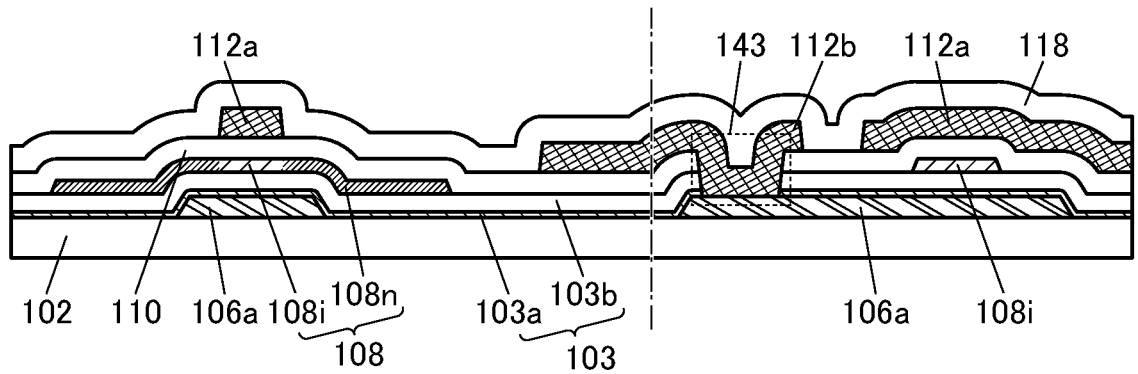

Next, the insulating layer 118 is formed to cover the insulating layer 110, the conductive layer 112a, the conductive layer 112b, and the like (FIG. 18B).

In the case where the insulating layer 118 is formed by a plasma CVD method at a too high film formation temperature, the impurity contained in the low-resistance region 108n or the like might diffuse to a peripheral portion including the channel formation region of the semiconductor layer 108 or might increase the electrical resistance of the low-resistance region 108n, for example. Thus, the film formation temperature for the insulating layer 118 may be determined in consideration of these.

The film formation temperature for the insulating layer 118 is preferably higher than or equal to 150° C. and lower than or equal to 550° C., further preferably higher than or equal to 160° C. and lower than or equal to 500° C., still further preferably higher than or equal to 180° C. and lower than or equal to 450° C., yet still further preferably higher than or equal to 250° C. and lower than or equal to 400° C., for example. Formation of the insulating layer 118 at low temperatures enables the transistor to have favorable electrical characteristics even when it has a short channel length.

Heat treatment may be performed after the formation of the insulating layer 118. The heat treatment can allow the low-resistance region 108n to have low resistance more stably, in some cases. For example, by the heat treatment, the impurity element diffuses moderately and is homogenized locally, so that the low-resistance region 108n having an ideal concentration gradient of the impurity element can be formed. Note that when the temperature of the heat treatment is too high (e.g., higher than or equal to 500° C.), the impurity element might also be diffused into the channel formation region, so that the electrical characteristics or reliability of the transistor might be degraded, for example.

For the conditions of the heat treatment, the above description can be referred to.

Note that the heat treatment is not necessarily performed. The heat treatment is not necessarily performed in this step, and heat treatment performed in a later step may also serve as the heat treatment in this step. In the case where treatment at a high temperature is performed in a later step (e.g., film formation step), such treatment can sometimes serve as the heat treatment in this step.

[Formation of Opening Portion 141a, Opening Portion 141b, and Opening Portion 144]

Figure 18C:
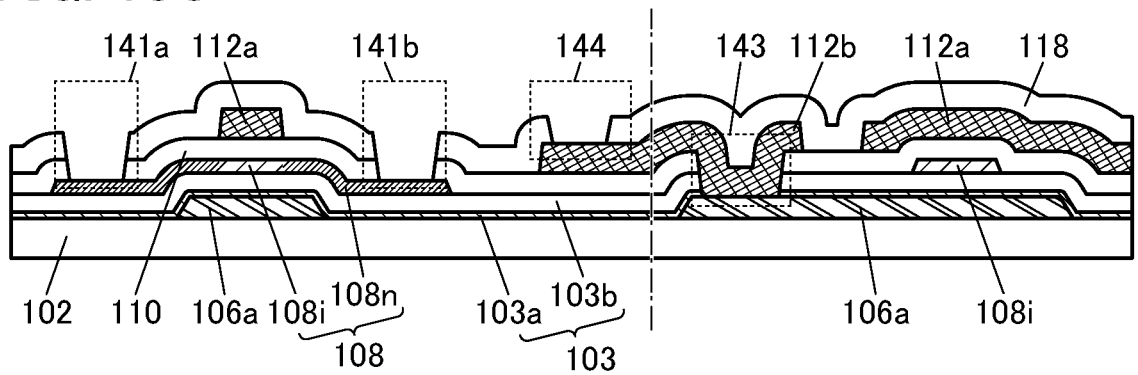

Next, the insulating layer 118 is partly etched, whereby the opening portion 144 reaching the conductive layer 112b is formed. Furthermore, the insulating layer 118 and the insulating layer 110 are partly etched, whereby the opening portion 141*a* and the opening portion 141*b* that reach the low-resistance regions 108*n* are formed (FIG. 18C).

The formation of the opening portion 144 and the formation of the opening portion 141*a* and the opening portion 141*b* may be performed at the same time or performed separately. In the case where the formation of the opening portion 144 and the formation of the opening portion 141*a* and the opening portion 141*b* are performed at the same time, the insulating layer 110 positioned in the opening portion 141*a* and the opening portion 141*b* is preferably etched under conditions where the conductive layer 112*b* positioned at the bottom portion of the opening portion 144 is not easily etched.

Figure 18D:
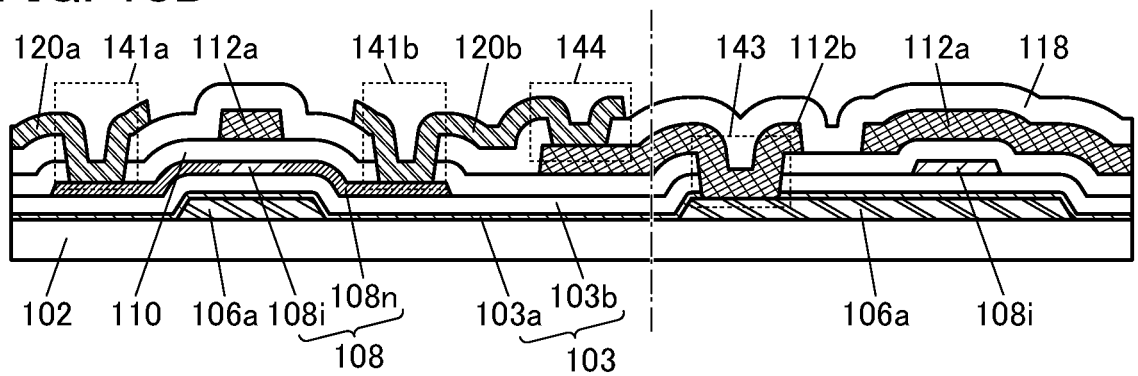

Next, a conductive film is formed over the insulating layer 118 to cover the opening portion 141*a*, the opening portion 141*b*, and the opening portion 144, and the conductive film is processed into a desired shape, so that the conductive layer 120*a* and the conductive layer 120*b* are formed (FIG. 18D).

Through the above process, the transistor 100 can be fabricated. In the case where the transistor 100 is used in a pixel or a driver circuit of a display device, for example, this process may be followed by a step of forming one or more of a protective insulating layer, a planarization layer, a pixel electrode, and a wiring.

The above is the description of the fabrication method example.

To fabricate the transistor 100A exemplified in Structure example 2, the patterns of the conductive layer 112*a* and the conductive layer 106*a* are changed.

To fabricate the structure illustrated in FIG. 15A and the like, the conductive layer 106*b* and the conductive layer 106*c* are formed by processing the same conductive film as the conductive layer 106*a*, the semiconductor layer 108*a* is formed by processing the same metal oxide film as the semiconductor layer 108, the conductive layer 112*c* is formed by processing the same conductive film as the conductive layer 112*a* and the conductive layer 112*b*, and the conductive layer 120*c* is formed by processing the same conductive film as the conductive layer 120*a* and the conductive layer 120*b*. The opening portion 142 and the opening portion 145 are formed in a manner similar to that of the opening portion 143, and the opening portion 141*c*, the opening portion 141*d*, and the opening portion 141*e* are formed in a manner similar to that of the opening portion 141*a*. Thus, the transistor 100, the transistor 150, and the capacitor 160 can be formed over the same substrate by the same steps without increasing the number of steps.

Modification Example of Fabrication Method Example

Modification Example 1

Figure 19A:
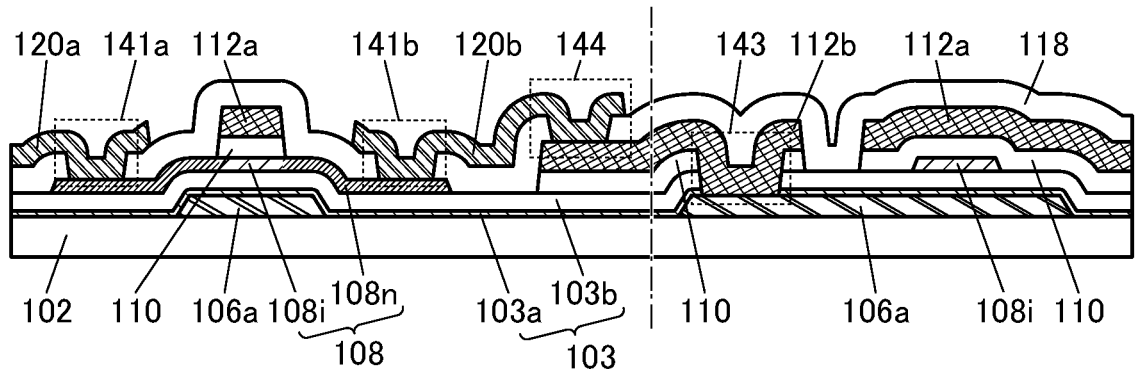
FIG. 19A to FIG. 19C are diagrams illustrating a structure example of a transistor.

In the above fabrication method example, the insulating layer 110 in the region that does not overlap with the conductive layer 112*a* or the conductive layer 112*b* can be removed by etching at the time of the processing into the conductive layer 112*a* and the conductive layer 112*b*. FIG. 19A shows a schematic cross-sectional view of a transistor fabricated in this manner.

The transistor illustrated in FIG. 19A has a structure in which the low-resistance region 108*n* of the semiconductor layer 108 is in contact with the insulating layer 118. Here, when an insulating film that can release hydrogen by heating is used as the insulating layer 118, hydrogen can be suitably supplied to the low-resistance region 108*n* during the formation step of the insulating layer 118. Alternatively, heat treatment performed after the formation of the insulating layer 118 or heat applied in a later step can supply hydrogen from the insulating layer 118 to the low-resistance region 108*n*. In this case, an insulating film containing nitrogen such as a silicon nitride film or a silicon nitride oxide film can be suitably used as the insulating layer 118. Accordingly, the insulating layer 118 can have both a function of releasing hydrogen and a function of a barrier film against water, hydrogen, or the like.

Note that such an insulating film that can release hydrogen by heating is not necessarily used as the insulating layer 118 in the case where the insulating layer 118 that is formed in contact with the part of the semiconductor layer 108 to be the low-resistance region 108*n* can sufficiently reduce the resistance of the part of the semiconductor layer 108. In this case, as the insulating layer 118, an insulating film containing oxygen such as a silicon oxide film or a silicon oxynitride film can be used, for example.

Alternatively, the above treatment for supplying the impurity element may be performed after the formation of the insulating layer 118 to supply the impurity element to the low-resistance region 108*n* through the insulating layer 118. In this case, the insulating layer 118 is not necessarily an insulating film that can release hydrogen by heating.

Modification Example 2

Figure 19B:
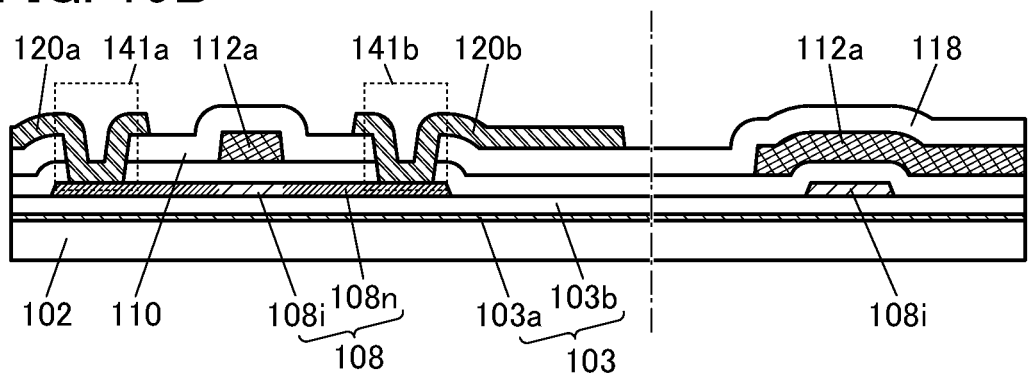

Transistors each including only one gate can be fabricated concurrently using the above fabrication method example. FIG. 19B illustrates a schematic cross-sectional view of the transistor fabricated in this manner.

The transistor illustrated in FIG. 19B differs from the transistor 100 mainly in that the conductive layer 106*a* functioning as the bottom gate is not included, the opening portion 143, the opening portion 144, and the like are not included, and the conductive layer 112*b* is not included.

Figure 19C:
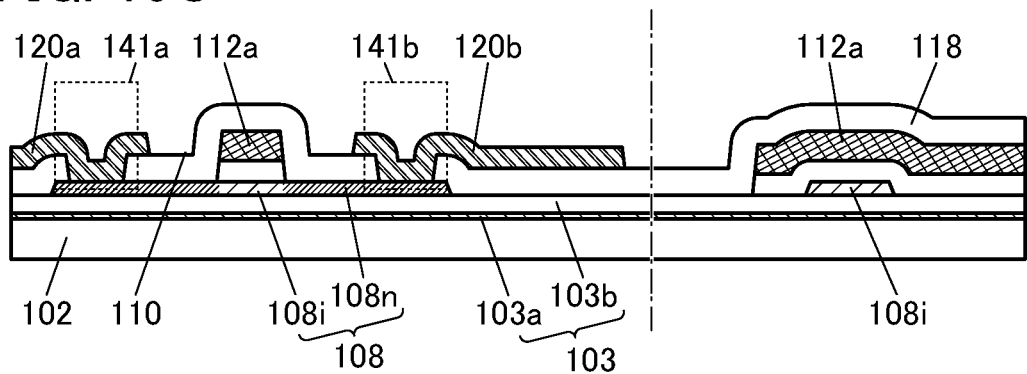

FIG. 19C shows a schematic cross-sectional view of a transistor processed such that the top surface shapes of the insulating layer 110 and the conductive layer 112*a* are substantially the same, as in Modification example 1 above.

The above is the description of the modification example.

The transistor exemplified above can be used not only in a sequential circuit but also as a transistor provided in a pixel of a display device. In that case, a transistor provided in a sequential circuit and a transistor provided in a pixel of a display device can be formed over the same substrate through the same process. This enables a highly reliable display device to be fabricated at low costs.

[Components of Semiconductor Device]

Components included in the semiconductor device of this embodiment are described below.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate containing silicon, silicon carbide, or the like as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102, and the semiconductor device may be formed directly on the flexible substrate. A separation layer may be provided between the substrate 102 and the semiconductor device. The separation layer can be used when part or the whole of the semiconductor device completed thereover is separated from the substrate 102 and transferred onto another substrate. In that case, the semiconductor device can be transferred to even a substrate having low heat resistance or a flexible substrate.

[Conductive Film]

Examples of materials that can be used for conductive layers of a variety of wirings and electrodes and the like included in the semiconductor device in addition to a gate, a source, and a drain of a transistor include metals such as aluminum, titanium, chromium, nickel, copper, yttrium, zirconium, molybdenum, gold, silver, zinc, tantalum, manganese, iron, niobium, cobalt, and tungsten and an alloy containing such a metal as its main component. A single-layer structure or a stacked-layer structure including a film containing any of these materials can be used.

For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used to increase controllability of a shape by etching.

For the conductive layers that constitute the semiconductor device, an oxide conductor or a metal oxide such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be used.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

In addition, the conductive layers that constitute the semiconductor device may each have a stacked-layer structure of a conductive film containing the oxide conductor (the metal oxide) and a conductive film containing a metal or an alloy. The use of the conductive film containing a metal or an alloy can reduce the wiring resistance. At this time, a conductive film containing an oxide conductor is preferably used as a conductive film on the side in contact with an insulating layer functioning as a gate insulating film.

[Semiconductor Layer]

In the case where the semiconductor layer 108 is an In-M-Zn oxide, examples of the atomic ratio of metal elements of a sputtering target used for forming a film of an In-M-Zn oxide include In:M:Zn=1:1:1, In:M:Zn=1:1:1.2, In:M:Zn=1:3:2, In:M:Zn=1:3:4, In:M:Zn=1:3:6, In:M:Zn=2:2:1, In:M:Zn=2:1:3, In:M:Zn=3:1:2, In:M:Zn=4:2:3, In:M:Zn=4:2:4.1, In:M:Zn=5:1:3, In:M:Zn=10:1:3, In:M:Zn=5:1:6, In:M:Zn=5:1:7, In:M:Zn=5:1:8, In:M:Zn=6:1:6, and In:M:Zn=5:2:5. In the case where two or more kinds of elements are contained as the element M, the proportion of M in the atomic ratio corresponds to the sum of the number of atoms of the two or more metal elements.

A target containing a polycrystalline oxide is preferably used as the sputtering target, in which case the semiconductor layer 108 having crystallinity is easily formed. Note that the atomic ratio in the semiconductor layer 108 to be formed varies in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be formed is sometimes in the neighborhood of In:Ga:Zn=4:2:3 [atomic ratio].

Note that when the atomic ratio is described as In:Ga:Zn=4:2:3 or as being in the neighborhood thereof, the case is included where Ga is greater than or equal to 1 and less than or equal to 3 and Zn is greater than or equal to 2 and less than or equal to 4 with In being 4. In addition, when the atomic ratio is described as In:Ga:Zn=5:1:6 or as being in the neighborhood thereof, the case is included where Ga is greater than 0.1 and less than or equal to 2 and Zn is greater than or equal to 5 and less than or equal to 7 with In being 5. Furthermore, when the atomic ratio is described as In:Ga:Zn=1:1:1 or as being in the neighborhood thereof, the case is included where Ga is greater than 0.1 and less than or equal to 2 and Zn is greater than 0.1 and less than or equal to 2 with In being 1.

The energy gap of the semiconductor layer 108 is greater than or equal to 2 eV, preferably greater than or equal to 2.5 eV. With use of such a metal oxide having a wider energy gap than silicon, the off-state current of the transistor can be reduced.

The semiconductor layer 108 preferably has a non-single-crystal structure. Examples of the non-single-crystal structure include a CAAC structure to be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in a film thickness direction, a normal direction of a surface where the thin film is formed, or a normal direction of a surface of the thin film.

A CAAC-OS (Oxide Semiconductor) is an oxide semiconductor with high crystallinity. On the other hand, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has few impurities and defects (e.g., oxygen vacancies). Thus, an oxide semiconductor including a CAAC-OS is physically stable. Therefore, the oxide semiconductor including the CAAC-OS is resistant to heat and has high reliability.

Here, in crystallography, in a unit cell formed with three axes (crystal axes) of the a-axis, the b-axis, and the c-axis, a specific axis is generally taken as the c-axis. In particular, in the case of a crystal having a layered structure, two axes parallel to the plane direction of a layer are regarded as the a-axis and the b-axis and an axis intersecting with the layer is regarded as the c-axis in general. Typical examples of such a crystal having a layered structure include graphite, which is classified as a hexagonal system. In a unit cell of graphite, the a-axis and the b-axis are parallel to a cleavage plane and the c-axis is orthogonal to the cleavage plane. For example, an $InGaZnO_4$ crystal having a $YbFe_2O_4$ type crystal structure, which is a layered structure, can be classified as a hexagonal system, and in a unit cell thereof, the a-axis and the b-axis are parallel to the plane direction of a layer and the c-axis is orthogonal to the layer (i.e., the a-axis and the b-axis).

In an image observed with a transmission electron microscope (TEM), crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image observed with a TEM, for example, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS film. Thus, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an X-ray diffraction (XRD) apparatus using an X-ray having a diameter larger than the size of a crystal part, a peak that shows a crystal plane does not appear. Furthermore, a diffraction pattern like a halo pattern is observed when the nc-OS film is subjected to electron diffraction (also referred to as selected-area electron diffraction) using an electron beam with a probe diameter (e.g., 50 nm or larger) that is larger than the diameter of a crystal part. Meanwhile, in some cases, a ring-like region with high luminance is observed in a circular pattern by electron diffraction (also referred to as nanobeam electron diffraction pattern) of the nc-OS film, which uses an electron beam with a probe diameter close to or smaller than the diameter of a crystal part (e.g., greater than or equal to 1 nm and less than or equal to 30 nm), and spots are observed in the ring-like region.

The nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film. Thus, the nc-OS film has a higher carrier density and higher electron mobility than the CAAC-OS film in some cases. Therefore, a transistor using the nc-OS film may have high field-effect mobility.

The nc-OS film can be formed at a lower oxygen flow rate ratio in formation than the CAAC-OS film. The nc-OS film can also be formed at a lower substrate temperature in formation than the CAAC-OS film. For example, the nc-OS film can be formed at a relatively low substrate temperature (e.g., a temperature of 130° C. or lower) or without heating of the substrate and thus is suitable for the case of using a large glass substrate, a resin substrate, or the like, and productivity can be increased.

An example of a crystal structure of a metal oxide is described. A metal oxide that is formed by a sputtering method using an In—Ga—Zn oxide target (In:Ga:Zn=4:2:4.1 [atomic ratio]) at a substrate temperature higher than or equal to 100° C. and lower than or equal to 130° C. is likely to have either the nc (nano crystal) structure or the CAAC structure, or a structure in which both structures are mixed. By contrast, a metal oxide formed at a substrate temperature set at room temperature (R.T.) is likely to have the nc crystal structure. Note that room temperature (R.T.) here also includes a temperature in the case where a substrate is not heated intentionally.

[Composition of Metal Oxide]

The composition of a CAC (Cloud-Aligned Composite)-OS that can be used in a transistor disclosed in one embodiment of the present invention will be described below.

Note that a CAAC (c-axis aligned crystal) refers to an example of a crystal structure, and a CAC (Cloud-Aligned Composite) refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide includes components having different band gaps. For example, the CAC-OS or the CAC-metal oxide is composed of a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current drive capability, that is, a high on-state current and high field-effect mobility.

In other words, the CAC-OS or the CAC-metal oxide can also be referred to as a matrix composite or a metal matrix composite.

The above is the description of the metal oxide structure.

At least part of the structure examples, the drawings corresponding thereto, and the like exemplified in this embodiment can be combined with the other structure examples, the other drawings, and the like as appropriate.

At least part of this embodiment can be implemented in combination with the other embodiments described in this specification as appropriate.

Embodiment 2

In this embodiment, a display device that includes the semiconductor device of one embodiment of the present invention is described with reference to FIG. 20A to FIG. 20C.

Figure 20A:
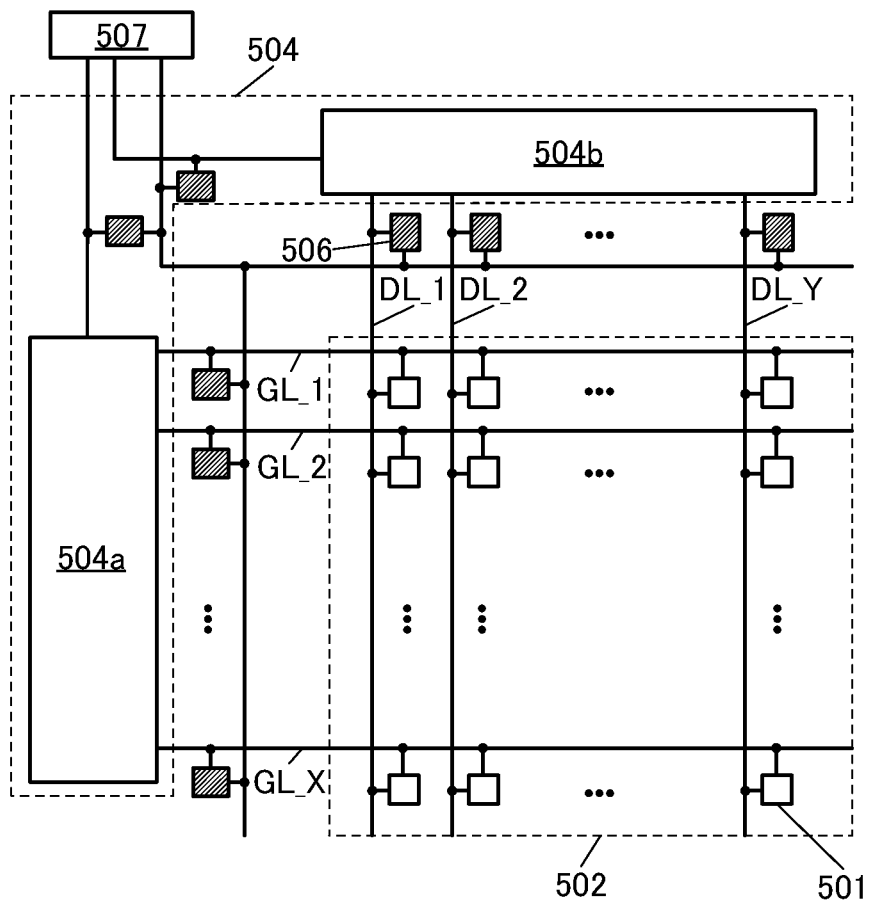
FIG. 20A is a block diagram of a display device.

A display device illustrated in FIG. 20A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502, the driver circuit portion 504, or the like. The transistor of one embodiment of the present invention may also be used in the protection circuits 506.

The pixel portion 502 includes pixel circuits 501 arranged in X rows and Y columns (X and Y each independently represent a natural number greater than or equal to 2). Each of the pixel circuits 501 includes a circuit for driving a display element.

The driver circuit portion 504 includes driver circuits such as a gate driver 504a that outputs a scan signal to a gate line GL_1 to a gate line GL_X and a source driver 504b that supplies a data signal to a data line DL_1 to a data line DL_Y. The gate driver 504a includes at least a shift register. The source driver 504b is formed using a plurality of analog switches, for example. Alternatively, the source driver 504b may be formed using a shift register or the like.

The gate driver 504a can include the sequential circuit of one embodiment of the present invention. The source driver 504b may also include the sequential circuit of one embodiment of the present invention.

The terminal portion 507 refers to a portion provided with terminals for inputting power, control signals, image signals, and the like to the display device from external circuits.

The protection circuit 506 is a circuit that, when a potential out of a certain range is supplied to a wiring to which the protection circuit 506 is connected, establishes continuity between the wiring and another wiring. The protection circuit 506 illustrated in FIG. 20A is connected to a variety of wirings such as the gate lines GL that are wirings between the gate driver 504a and the pixel circuits 501 and the data lines DL that are wirings between the source driver 504b and the pixel circuits 501, for example. Note that the protection circuits 506 are hatched in FIG. 20A to distinguish the protection circuits 506 from the pixel circuits 501.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor or a polycrystalline semiconductor) may be mounted on the substrate over which the pixel portion 502 is provided by COG, TAB (Tape Automated Bonding), or the like.

Figure 20B:
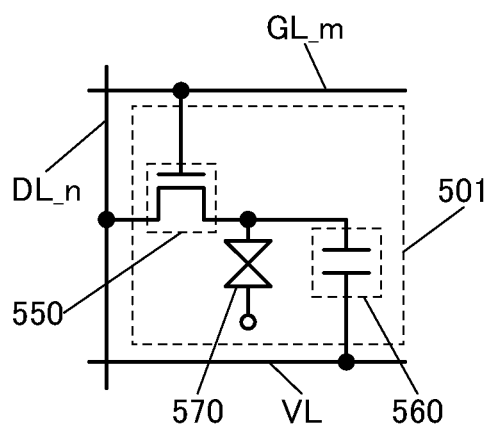
FIG. 20B and FIG. 20C are circuit diagrams of pixel circuits.
Figure 20C:
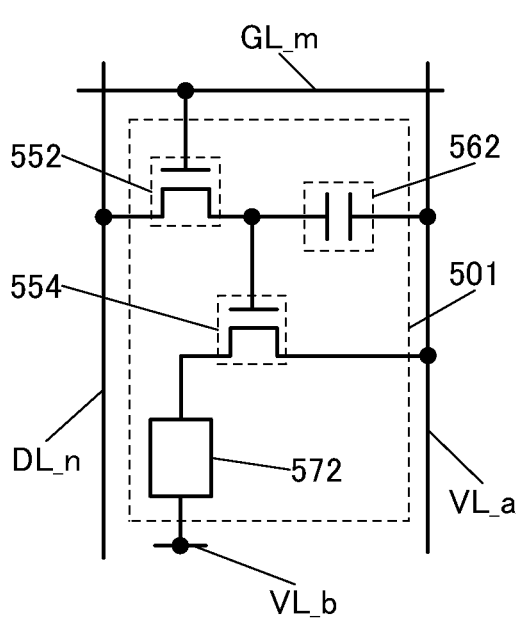

FIG. 20B and FIG. 20C each illustrate a structure example of a pixel circuit that can be used as the pixel circuit 501. FIG. 20B and FIG. 20C each illustrate the pixel circuit in the m-th row and the n-th column (m is a natural number greater than or equal to 1 and less than or equal to X, and n is a natural number greater than or equal to 1 and less than or equal to Y).

The pixel circuit 501 illustrated in FIG. 20B includes a liquid crystal element 570, a transistor 550, and a capacitor 560. The data line DL_n, the gate line GL_m, a potential supply line VL, and the like are connected to the pixel circuit 501.

The potential of one of a pair of electrodes of the liquid crystal element 570 is set as appropriate in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Moreover, a potential supplied to one of the pair of electrodes of the liquid crystal element 570 of the pixel circuit 501 may differ between rows.

The pixel circuit 501 illustrated in FIG. 20C includes a transistor 552, a transistor 554, a capacitor 562, and a light-emitting element 572. The data line DL_n, the gate line GL_m, a potential supply line VL_a, a potential supply line VL_b, and the like are connected to the pixel circuit 501.

Note that the potential VDD that is a high power supply potential is supplied to one of the potential supply line VL_a and the potential supply line VL_b, and the potential VSS that is a low power supply potential is supplied to the other. Current flowing through the light-emitting element 572 is controlled in accordance with a potential supplied to a gate of the transistor 554, whereby the luminance of light emitted from the light-emitting element 572 is controlled.

It is preferable that the transistor 550 illustrated in FIG. 20B or the transistor 552 and the transistor 554 illustrated in FIG. 20C be provided over the same substrate as the transistors included in the gate driver 504a.

At least part of the structure examples, the drawings corresponding thereto, and the like described in this embodiment as examples can be implemented in combination with the other structure examples, the other drawings, and the like as appropriate.

At least part of this embodiment can be implemented in combination with the other embodiments described in this specification as appropriate.

Embodiment 3

A pixel circuit including a memory for correcting gray levels displayed by pixels and a display device including the pixel circuit are described below. The transistor described in Embodiment 1 can be used as a transistor used in the pixel circuit described below.

[Circuit Structure]

Figure 21A:
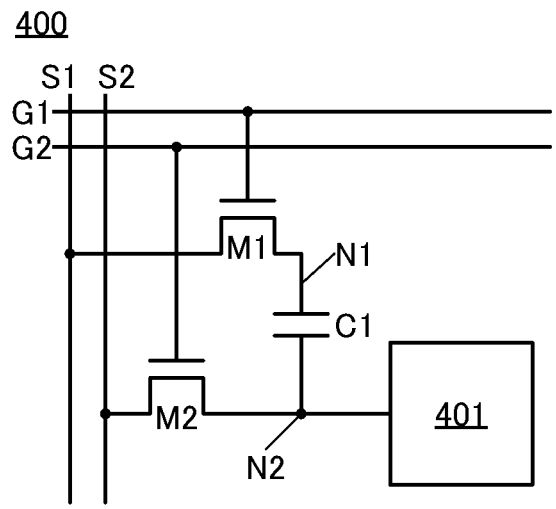
FIG. 21A, FIG. 21C, and FIG. 21D are circuit diagrams of pixel circuits.

FIG. 21A is a circuit diagram of a pixel circuit 400. The pixel circuit 400 includes a transistor M1, a transistor M2, the capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is brought into an off state. The potential of the node N2 can be retained when the transistor M2 is brought into an off state. When a predetermined potential is written to the node N1 through the transistor M1 with the transistor M2 being in an off state, the potential of the node N2 can be changed in accordance with the amount of change in the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potential of the node N1 or the node N2 can be retained for a long time. Note that in the case where the period in which the potential of each node is retained is short (specifically, the case where the frame frequency is higher than or equal to 30 Hz, for example), a transistor using a semiconductor such as silicon may be used.

[Driving Method Example]

Figure 21B:
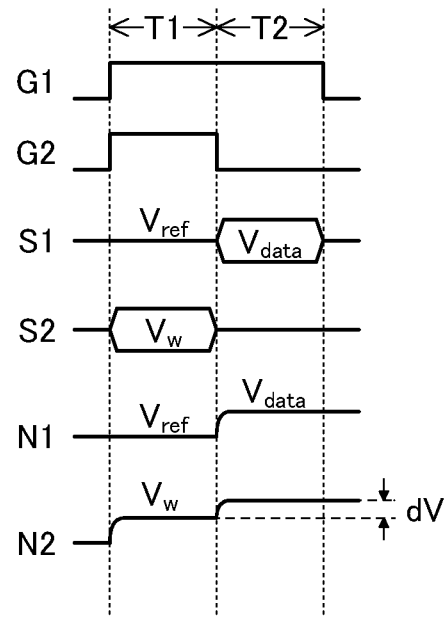
FIG. 21B is a timing chart.

Next, an example of a method for operating the pixel circuit 400 is described with reference to FIG. 21B. FIG. 21B is a timing chart for the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 21B, one frame period is divided into Period T1 and Period T2. Period T1 is a period in which a potential is written to the node N2, and Period T2 is a period in which a potential is written to the node N1.

[Period T1]

In Period T1, a potential for bringing the transistor into an on state is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied from the wiring S2 to the node N2 through the transistor M2. Accordingly, a potential difference $V_w$-$V_{ref}$ is retained in the capacitor C1.

[Period T2]

Next, in Period T2, a potential for bringing the transistor M1 into an on state is supplied to the wiring G1, and a potential for bringing the transistor M2 into an off state is supplied to the wiring G2. A second data potential $V_{data}$ is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 by a potential dV in accordance with the second data potential $V_{data}$. That is, a potential that is the sum of the first data potential $V_w$ and the potential dV is input to the circuit 401. Note that although the potential dV is shown as a positive value in FIG. 21B, the potential dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied by a source driver connected to the wiring S1 and the wiring S2. For example, in the case where a light-emitting element is used, high-dynamic range (HDR) display or the like can be performed. In the case where a liquid crystal element is used, overdriving or the like can be achieved.

Application Example

[Example Using Liquid Crystal Element]

Figure 21C:
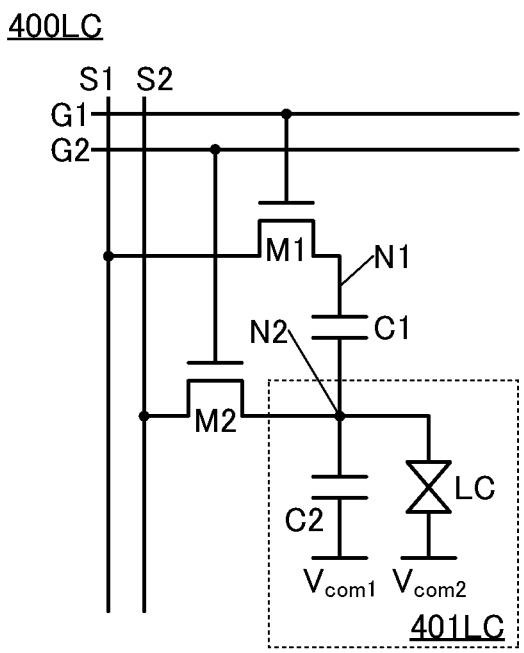

A pixel circuit 400LC illustrated in FIG. 21C includes a circuit 401LC. The circuit 401LC includes a liquid crystal element LC and the capacitor C2.

In the liquid crystal element LC, one electrode is connected to the node $N_2$ and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

[Example Using Light-Emitting Element]

Figure 21D:
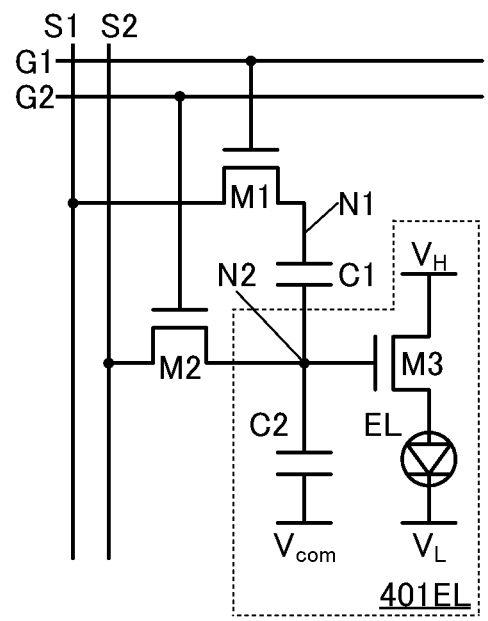

A pixel circuit 400EL illustrated in FIG. 21D includes a circuit 401EL. The circuit 401EL includes a light-emitting element EL, a transistor M3, and the capacitor C2.

In the transistor M3, a gate is connected to the node N2 and the one electrode of the capacitor C2, one of a source and a drain is connected to a wiring supplied with a potential $V_H$, and the other of the source and the drain is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be changed as appropriate.

In the pixel circuit 400EL, a large amount of current can flow through the light-emitting element EL when a high potential is applied to the gate of the transistor M3, enabling HDR display, for example. A variation in the electrical characteristics of the transistor M3, the light-emitting element EL, or the like can be corrected by supply of a correction signal to the wiring S1 or the wiring S2.

Note that the structure is not limited to the circuits illustrated in FIG. 21C and FIG. 21D, and a structure to which a transistor, a capacitor, or the like is further added may be employed.

At least part of this embodiment can be implemented in combination with the other embodiments described in this specification as appropriate.

Embodiment 4

In this embodiment, a display module that can be fabricated using one embodiment of the present invention is described.

Figure 22A:
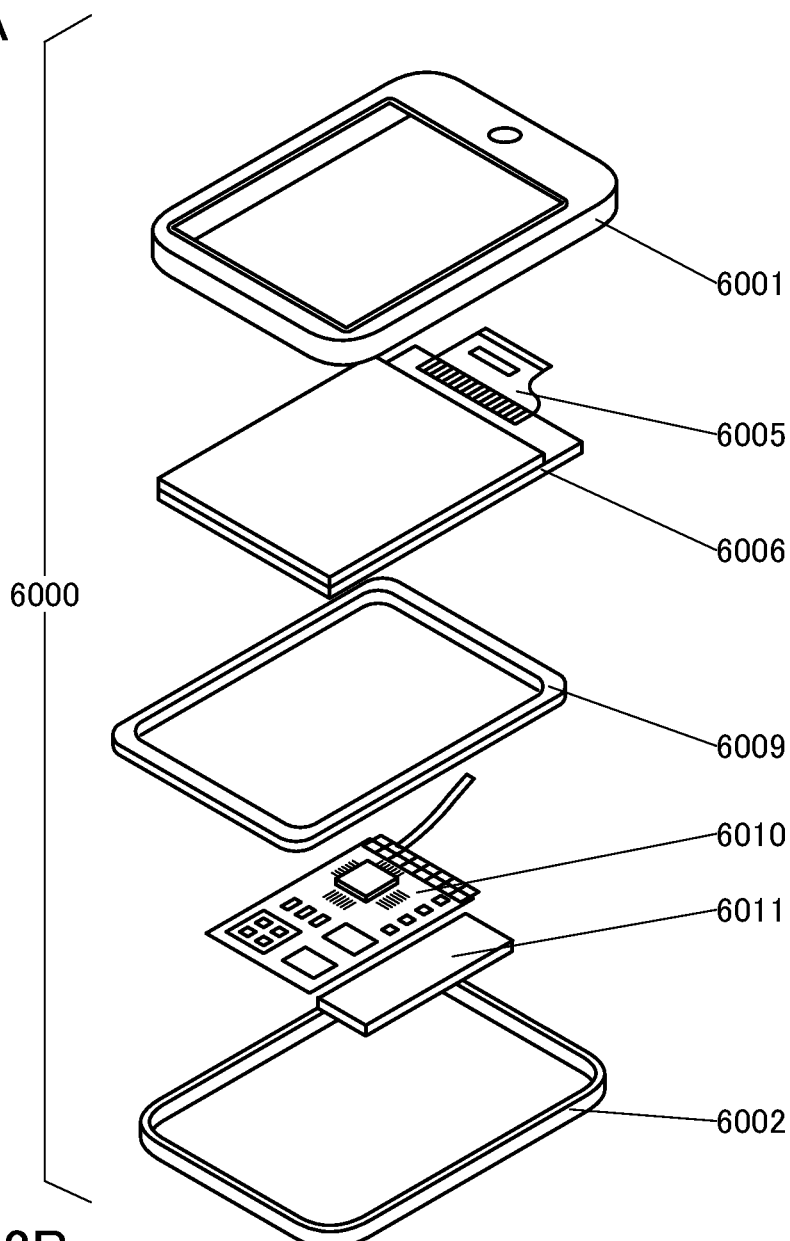
FIG. 22A and FIG. 22B are diagrams illustrating a structure example of a display module.

In a display module 6000 illustrated in FIG. 22A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape, size, or the like of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 22B:
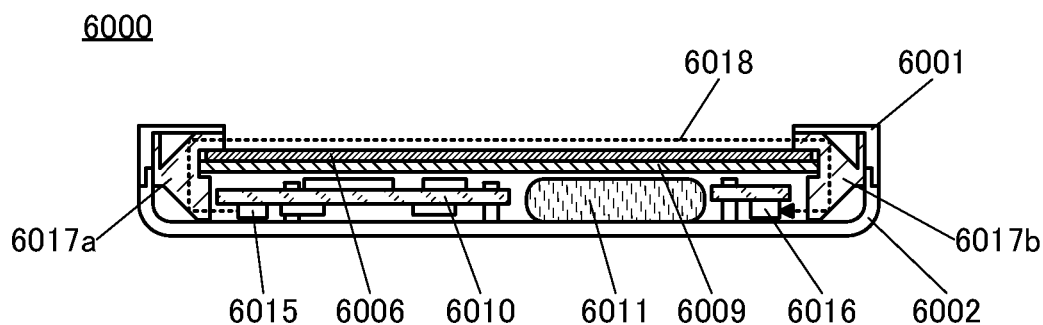

FIG. 22B is a schematic cross-sectional view of the display module 6000 in the case where an optical touch sensor is included.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display device 6006 overlaps with the printed circuit board 6010, the battery 6011, or the like with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

The light guide portion 6017a and the light guide portion 6017b which control the path of the light 6018 allow the light-emitting portion 6015 and the light-receiving portion 6016 to be placed under the display device 6006, inhibiting a malfunction of the touch sensor due to external light reaching the light-receiving portion 6016. Particularly when a resin that absorbs visible light and transmits infrared rays is used, a malfunction of the touch sensor can be inhibited more effectively.

At least part of this embodiment can be implemented in combination with the other embodiments described in this specification as appropriate.

Embodiment 5

In this embodiment, examples of an electronic device for which the display device of one embodiment of the present invention can be used are described.

Figure 23A:
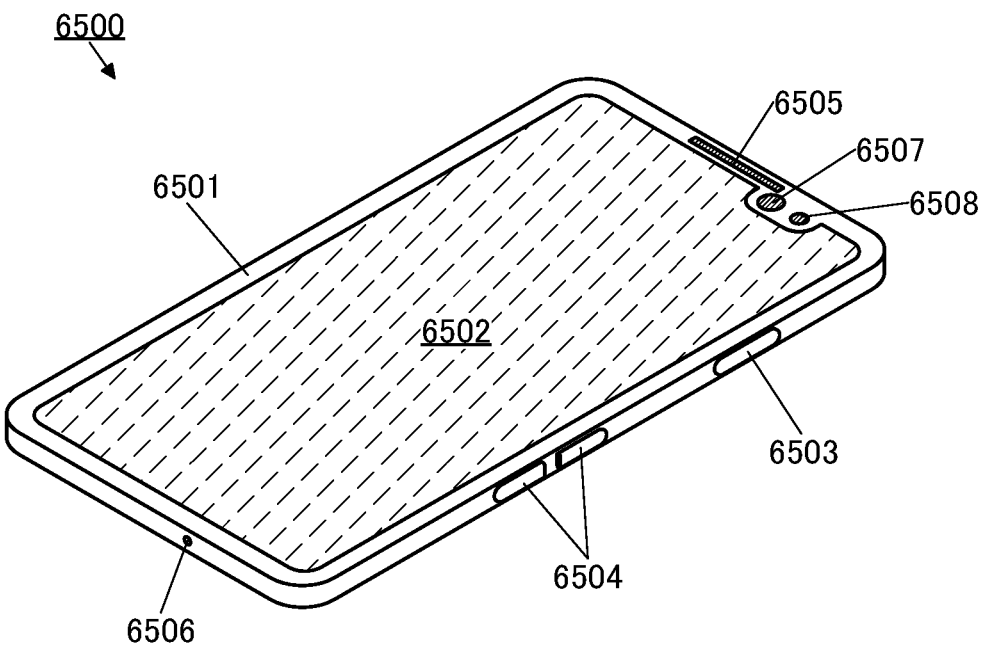
FIG. 23A and FIG. 23B are diagrams illustrating a structure example of an electronic device.

An electronic device 6500 illustrated in FIG. 23A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 23B:
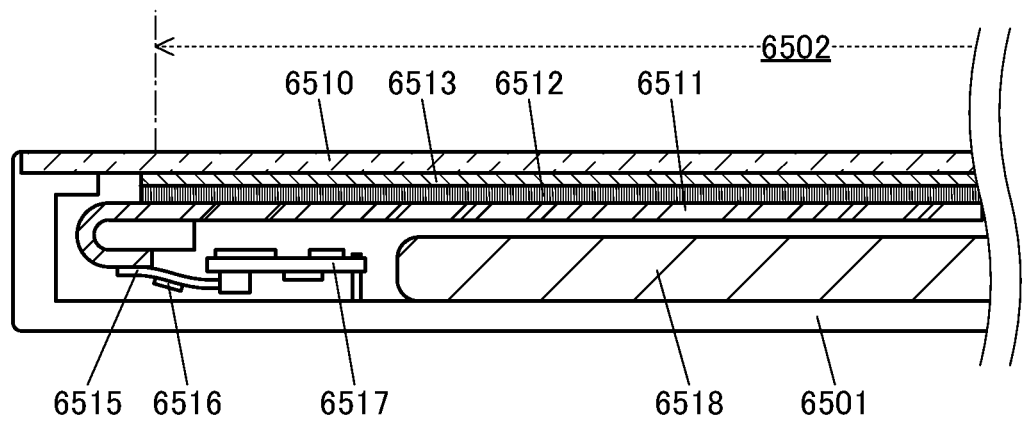

FIG. 23B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be obtained. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with the other embodiments described in this specification as appropriate.

Embodiment 6

In this embodiment, electronic devices each including a display device fabricated using one embodiment of the present invention are described.

Electronic devices described below as examples each include a display device of one embodiment of the present invention in a display portion. Thus, the electronic devices achieve high resolution. In addition, the electronic devices can each achieve both high resolution and a large screen.

A display portion in an electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a notebook personal computer, a monitor device, digital signage, a pachinko machine, and a game machine.

An electronic device using one embodiment of the present invention can be incorporated along a flat surface or a curved surface of an inside wall or an outside wall of a house or a building, an interior or an exterior of a car, or the like.

Figure 24A:
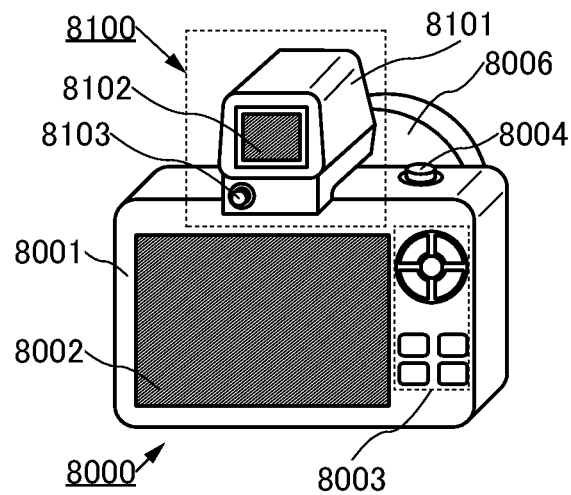
FIG. 24A to FIG. 24E are diagrams illustrating structure examples of electronic devices.

FIG. 24A is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

Figure 24B:
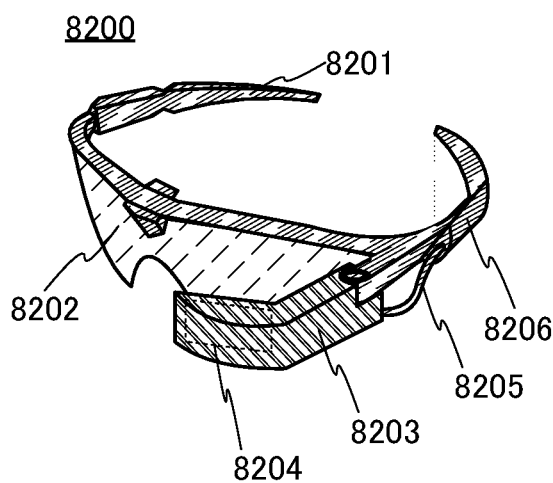

FIG. 24B is a diagram illustrating appearance of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display device of one embodiment of the present invention can be used for the display portion 8204.

Figure 24C:
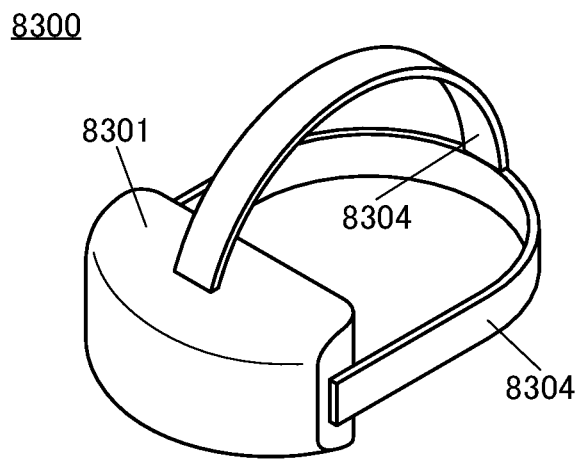
Figure 24D:
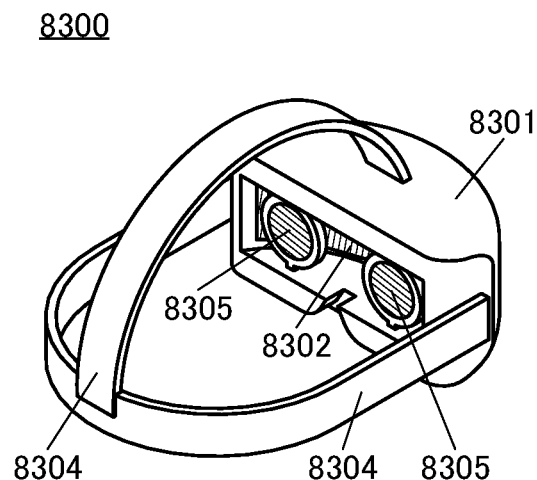
Figure 24E:
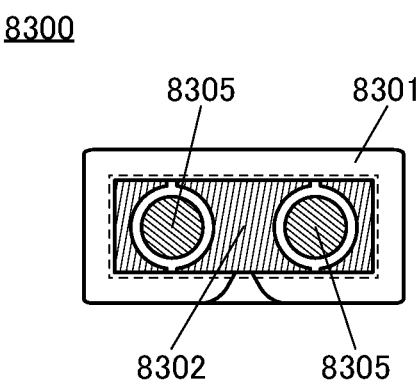

FIG. 24C, FIG. 24D, and FIG. 24E are diagrams illustrating appearance of a head-mounted display 8300. The head-mounted display 8300 includes a housing 8301, a display portion 8302, band-shaped fixing units 8304, and a pair of lenses 8305.

A user can see display on the display portion 8302 through the lenses 8305. Note that the display portion 8302 is preferably curved and placed because the user can feel a high realistic sensation. In addition, when another image displayed on a different region of the display portion 8302 is viewed through the lenses 8305, three-dimensional display using parallax or the like can also be performed. Note that the number of display portions 8302 provided is not limited to one; two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when a video is magnified by the lenses 8305 as in FIG. 24E, the user does not perceive pixels, and a more realistic video can be displayed.

Electronic devices illustrated in FIG. 25A to FIG. 25G include a housing 9000, a display portion 9001, a speaker 9003, an operation key 9005 (including a power switch or an operation switch), a connection terminal 9006, a sensor 9007 (a sensor having a function of measuring force, displacement, a position, speed, acceleration, angular velocity, rotational frequency, distance, light, liquid, magnetism, temperature, a chemical substance, sound, time, hardness, an electric field, current, voltage, power, radiation, flow rate, humidity, a gradient, oscillation, an odor, or infrared rays), a microphone 9008, and the like.

The electronic devices illustrated in FIG. 25A to FIG. 25G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of reading out and processing a program or data stored in a recording medium, and the like. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 25A to FIG. 25G are described below.

Figure 25A:
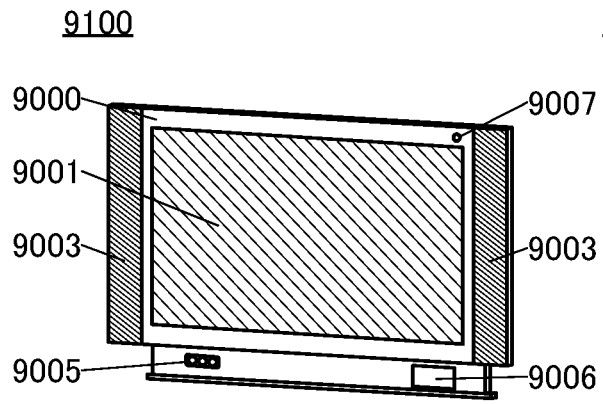
FIG. 25A to FIG. 25G are diagrams illustrating structure examples of electronic devices.

FIG. 25A is a perspective view illustrating a television device 9100. The display portion 9001 having a large screen size of, for example, 50 inches or more, or 100 inches or more can be incorporated in the television device 9100.

Figure 25D:
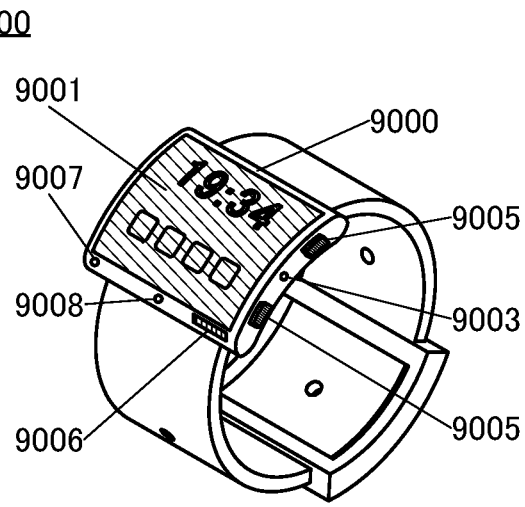
Figure 25B:
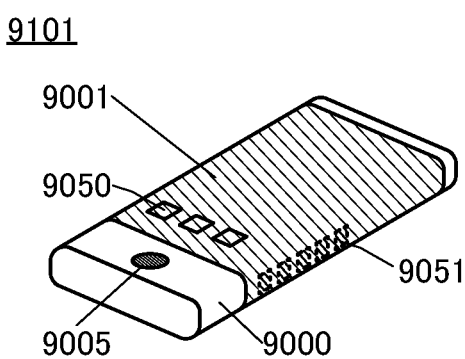

FIG. 25B is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display text, image information, or the like on its plurality of surfaces. FIG. 25B illustrates an example in which three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in a position where the information 9051 is displayed.

Figure 25E:
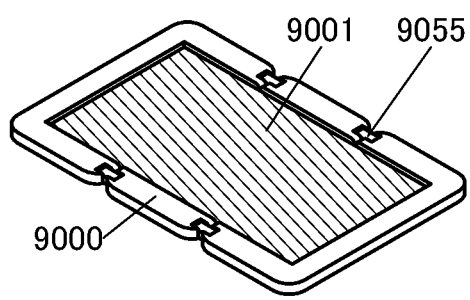
Figure 25C:
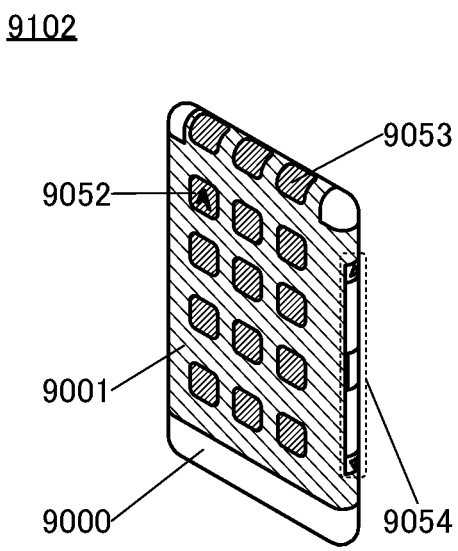

FIG. 25C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

FIG. 25D is a perspective view illustrating a watch-type portable information terminal 9200. In addition, a display surface of the display portion 9001 is curved and provided, and display can be performed along the curved display surface. Furthermore, intercommunication between the portable information terminal 9200 and, for example, a headset capable of wireless communication enables hands-free calling. Moreover, with the connection terminal 9006, the portable information terminal 9200 can also perform mutual data transmission with another information terminal or charging. Note that charging operation may be performed by wireless power feeding.

Figure 25F:
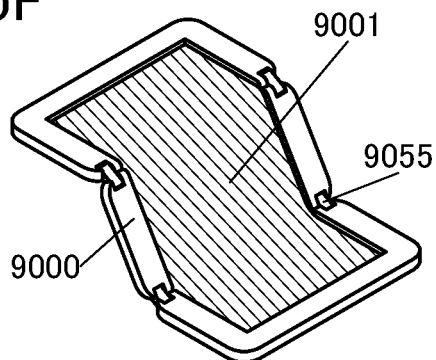
Figure 25G:
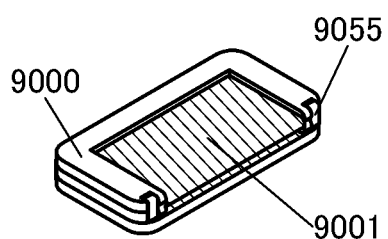

FIG. 25E, FIG. 25F, and FIG. 25G are perspective views illustrating a foldable portable information terminal 9201. In addition, FIG. 25E is a perspective view of an unfolded state of the portable information terminal 9201, FIG. 25G is a perspective view of a folded state thereof, and FIG. 25F is a perspective view of a state in the middle of change from one of FIG. 25E and FIG. 25G to the other. The portable information terminal 9201 is highly portable in the folded state and is highly browsable in the unfolded state because of a seamless large display region. The display portion 9001 of the portable information terminal 9201 is supported by three housings 9000 joined with hinges 9055. For example, the display portion 9001 can be bent with a radius of curvature greater than or equal to 1 mm and less than or equal to 150 mm.

Figure 26A:
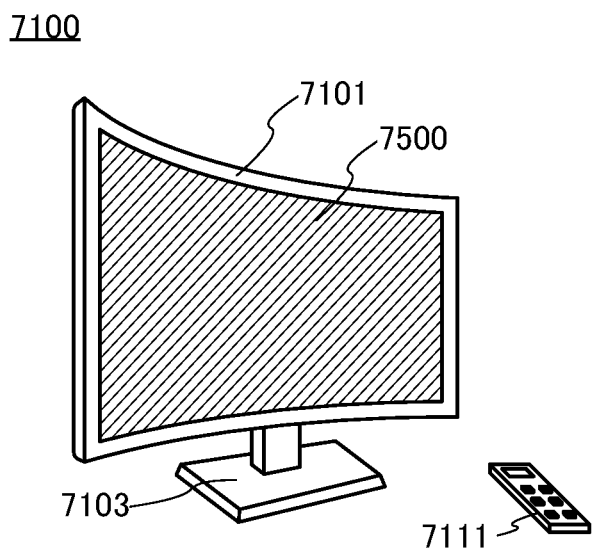
FIG. 26A to FIG. 26D are diagrams illustrating structure examples of electronic devices.

FIG. 26A illustrates an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 26A can be performed with an operation switch provided in the housing 7101 or a separate remote controller 7111. Alternatively, a touch panel may be used for the display portion 7500, and the television device 7100 may be operated by touch on the touch panel. The remote controller 7111 may include a display portion in addition to operation buttons.

Note that the television device 7100 may include a television receiver or a communication device for network connection.

Figure 26B:
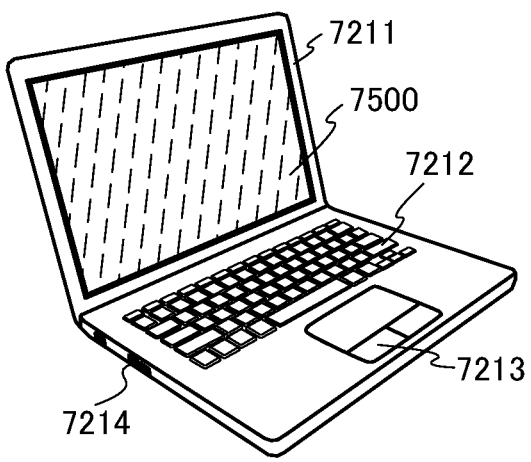

FIG. 26B illustrates a notebook personal computer 7200. The notebook personal computer 7200 includes a housing 7211, a keyboard 7212, a pointing device 7213, an external connection port 7214, and the like. The display portion 7500 is incorporated in the housing 7211.

Figure 26C:
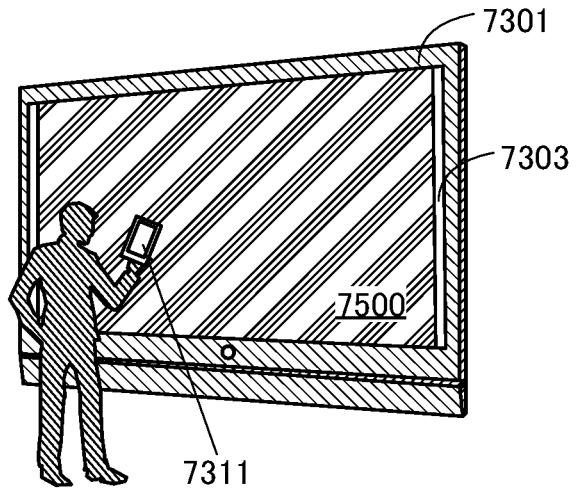
Figure 26D:
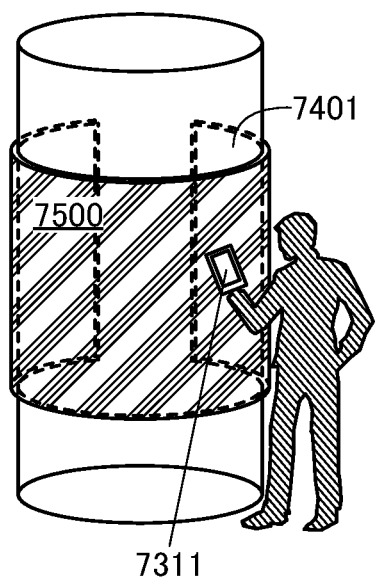

FIG. 26C and FIG. 26D illustrate examples of digital signage.

Digital signage 7300 illustrated in FIG. 26C includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 26D is digital signage 7400 attached to a cylindrical pillar 7401. The digital signage 7400 includes the display portion 7500 provided along a curved surface of the pillar 7401.

The larger display portion 7500 can increase the amount of information that can be provided at a time and attracts more attention, so that the effectiveness of the advertisement can be increased, for example.

A touch panel is preferably used for the display portion 7500 so that the user can operate the digital signage. Thus, the digital signage can be used not only for advertising but also for providing information that the user needs, such as route information, traffic information, or guidance information on a commercial facility.

As illustrated in FIG. 26C and FIG. 26D, it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or display on the display portion 7500 can be switched by operation of the information terminal 7311.

It is possible to make the digital signage 7300 or the digital signage 7400 execute a game with use of the information terminal 7311 as an operation means (controller). Thus, an unspecified number of users can join in and enjoy the game concurrently.

The display device of one embodiment of the present invention can be used for the display portion 7500 in FIG. 26A to FIG. 26D.

The electronic devices of this embodiment each include a display portion; however, one embodiment of the present invention can also be used in an electronic device without a display portion.

At least part of this embodiment can be implemented in combination with the other embodiments described in this specification as appropriate.

REFERENCE NUMERALS

LIN: signal: RIN: signal: BDG: signal: CLK: signal: OUT: output terminal: GOUT: output terminal: SROUT: output terminal: PWC: signal: RES: signal: SP: signal: C1 to C4: capacitor: CK1 to CK4: signal: CLK1 to CLK3: signal: N, N1, N2: node: OUT to OUT6: wiring: PWC1 to PWC4: signal: RIN1, RIN2: signal: 10, 10*a*, 10*b*, 10*c*: sequential circuit: 11, 11*a*, 12, 13: circuit: 14*a*, 14*b*: signal generation circuit: 15*a*, 15*b*: wiring: 20: sequential circuit: 21 to 26: transistor: 30, 30*a*, 30*a*_n: sequential circuit: 30*b*: sequential circuit: 31 to 34: transistor: 40*a*, 40*b*: driver circuit: 41 to 47, 51, 52, 60 to 69, 71, 72: transistor

The invention claimed is:

1. A semiconductor device comprising:
a control circuit, first to third transistors, a first capacitor, and first to fifth wirings,
wherein one of a source and a drain of the first transistor is electrically connected to the first wiring,
wherein the other of the source and the drain of the first transistor is electrically connected to a gate of the second transistor and one electrode of the first capacitor,
wherein a gate of the first transistor is electrically connected to the third wiring,
wherein one of a source and a drain of the second transistor is electrically connected to the fourth wiring,
wherein the other of the source and the drain of the second transistor is electrically connected to the other electrode of the first capacitor and one of a source and a drain of the third transistor,
wherein the other of the source and the drain of the third transistor is electrically connected to the fifth wiring,
wherein a gate of the third transistor is electrically connected to the second wiring,
wherein the control circuit outputs a first signal to the first wiring and outputs a second signal that is an inverted signal of the first signal to the second wiring,
wherein a first pulse signal is configured to be supplied to the fourth wiring,
wherein a first potential is configured to be supplied to the fifth wiring,
wherein a second pulse signal is configured to be supplied to the third wiring,
wherein the first pulse signal is a clock signal, and
wherein the second pulse signal has a duty ratio of 10% or lower.

2. The semiconductor device according to claim 1, further comprising a signal generation circuit outputting the second pulse signal,
wherein a third pulse signal is configured to be supplied to the signal generation circuit and the control circuit, and
wherein the third pulse signal has a duty ratio of 1% or lower.

3. The semiconductor device according to claim 2, wherein the second pulse signal has the duty ratio of 1% or lower.

4. The semiconductor device according to claim 2,
wherein the signal generation circuit comprises a fourth transistor, a fifth transistor and a second capacitor,
wherein one of a source and a drain of the fourth transistor is configured to be supplied with a second potential higher than the first potential,
wherein the other of the source and the drain of the fourth transistor is electrically connected to the third wiring, one of a source and a drain of the fifth transistor, and one electrode of the second capacitor,
wherein the first potential is configured to be supplied to the other of the source and the drain of the fifth transistor,
wherein the first potential is configured to be supplied to the other electrode of the second capacitor,
wherein the third pulse signal is configured to be supplied to a gate of the fourth transistor,
wherein a fourth pulse signal is configured to be supplied to a gate of the fifth transistor, and
wherein the fourth pulse signal has a duty ratio of 1% or lower.

5. The semiconductor device according to claim 1, wherein the second pulse signal is configured to be supplied to the third wiring and the control circuit.

6. The semiconductor device according to claim 1,
wherein the first transistor comprises a first semiconductor layer, a first gate and a second gate,
wherein the first semiconductor layer, the first gate and the second gate overlap each other, and
wherein the first gate is electrically connected to the second gate.

7. The semiconductor device according to claim 1,
wherein the third transistor comprises a second semiconductor layer, a third gate and a fourth gate,
wherein the second semiconductor layer, the third gate and the fourth gate overlap each other,
wherein one of the third gate and the fourth gate is electrically connected to the second wiring, and
wherein the other of the third gate and the fourth gate is electrically connected to the fifth wiring.

8. The semiconductor device according to claim 7,
wherein the fourth gate is positioned below the second semiconductor layer,
wherein the third gate is electrically connected to the second wiring, and
wherein the fourth gate is electrically connected to the fifth wiring.

9. A display device comprising:
the semiconductor device according to claim 1; and
a pixel comprising a display element and a sixth transistor,
wherein the sixth transistor is electrically connected to the second transistor, and wherein the sixth transistor, the first transistor, the second transistor, and the third transistor are provided over one plane.

10. The display device according to claim 9, wherein the display element is a liquid crystal element or a light-emitting element.

11. An electronic device comprising:
the display device according to claim 9; and
at least one of an antenna, a battery, a housing, a camera, a speaker, a microphone, a touch sensor and an operation button.

12. The semiconductor device according to claim 1, wherein the second pulse signal has the duty ratio of 1% or lower.

13. A semiconductor device comprising:
first to third transistors, a first capacitor, and first to fifth wirings,
wherein one of a source and a drain of the first transistor is electrically connected to the first wiring,
wherein the other of the source and the drain of the first transistor is electrically connected to a gate of the second transistor and one electrode of the first capacitor,
wherein a gate of the first transistor is electrically connected to the third wiring,
wherein one of a source and a drain of the second transistor is electrically connected to the fourth wiring,
wherein the other of the source and the drain of the second transistor is electrically connected to the other electrode of the first capacitor and one of a source and a drain of the third transistor,
wherein the other of the source and the drain of the third transistor is electrically connected to the fifth wiring,
wherein a gate of the third transistor is electrically connected to the second wiring,
wherein a first signal is supplied to the first wiring,
wherein a second signal that is an inverted signal of the first signal is supplied to the second wiring,
wherein a first pulse signal is supplied to the fourth wiring,
wherein a first potential is supplied to the fifth wiring,
wherein a second pulse signal is supplied to the third wiring,
wherein the first pulse signal is a clock signal, and
wherein the second pulse signal has a duty ratio of 10% or lower.

14. The semiconductor device according to claim 13, further comprising a signal generation circuit,
wherein the signal generation circuit comprises a sixth transistor, a seventh transistor and a second capacitor,
wherein the gate of the first transistor is electrically connected to one of a source and a drain of the sixth transistor, one of a source and a drain of the seventh transistor, and one electrode of the second capacitor, and
wherein the second pulse signal has the duty ratio of 1% or lower.

15. The semiconductor device according to claim 13, further comprising a display element electrically connected to a pixel transistor,
wherein a gate of the pixel transistor is electrically connected to the second transistor.

16. An electronic device comprising:
the semiconductor device according to claim 15; and
at least one of an antenna, a camera, a speaker, a microphone and a touch sensor.

* * * * *